(12) United States Patent
Wakita et al.

(10) Patent No.: US 10,611,868 B2
(45) Date of Patent: Apr. 7, 2020

(54) FERROELECTRIC MEMORY ELEMENT, METHOD FOR PRODUCING SAME, MEMORY CELL USING FERROELECTRIC MEMORY ELEMENT, AND RADIO COMMUNICATION DEVICE USING FERROELECTRIC MEMORY ELEMENT

(71) Applicant: TORAY INDUSTRIES, INC., Tokyo (JP)

(72) Inventors: Junji Wakita, Tokyo (JP); Hiroji Shimizu, Otsu (JP); Shota Kawai, Otsu (JP); Seiichiro Murase, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 15/774,936

(22) PCT Filed: Nov. 21, 2016

(86) PCT No.: PCT/JP2016/084483
§ 371 (c)(1),
(2) Date: May 9, 2018

(87) PCT Pub. No.: WO2017/090559
PCT Pub. Date: Jun. 1, 2017

(65) Prior Publication Data
US 2018/0327530 A1 Nov. 15, 2018

(30) Foreign Application Priority Data

Nov. 25, 2015 (JP) .................................. 2015-229337
Apr. 20, 2016 (JP) .................................. 2016-084207

(51) Int. Cl.
*C08F 220/14* (2006.01)
*H01B 1/22* (2006.01)
(Continued)

(52) U.S. Cl.
CPC .......... *C08F 220/14* (2013.01); *C08F 212/08* (2013.01); *C08F 220/32* (2013.01);
(Continued)

(58) Field of Classification Search
CPC ........ C08F 2220/1841; C08F 2220/325; C08F 2800/20; C08F 220/14; C08F 220/32;
(Continued)

(56) References Cited

U.S. PATENT DOCUMENTS 6,649,424 B2    11/2003 Mört et al.
2005/0215006 A1*  9/2005 Horii ................. H01L 27/11502
                                                          438/240

(Continued)

FOREIGN PATENT DOCUMENTS

JP   2003-318369 A   11/2003
JP   2006-261491 A    9/2006
(Continued)

OTHER PUBLICATIONS

International Search Report for PCT/JP2016/084483 (PCT/ISA/210) dated Feb. 7, 2017.
(Continued)

*Primary Examiner* — Jasmine J Clark
(74) *Attorney, Agent, or Firm* — Birch, Stewart, Kolasch & Birch, LLP

(57) ABSTRACT

An object of the present invention is to provide a ferroelectric memory element which has a low driving voltage and which can be formed by coating. The present invention provides a ferroelectric memory element including at least: a first conductive film; a second conductive film; and a ferroelectric layer provided between the first conductive film and the second conductive film; wherein the ferroelectric layer contains ferroelectric particles and an organic compo-
(Continued)

nent, and wherein the ferroelectric particles have an average particle size of from 30 to 500 nm.

30 Claims, 15 Drawing Sheets

(51) Int. Cl.
| | |
|---|---|
| H01B 5/16 | (2006.01) |
| H01L 29/786 | (2006.01) |
| C08F 212/08 | (2006.01) |
| C08F 220/32 | (2006.01) |
| C08G 18/34 | (2006.01) |
| C08G 18/71 | (2006.01) |
| G03F 7/16 | (2006.01) |
| G03F 7/20 | (2006.01) |
| G03F 7/32 | (2006.01) |
| G03F 7/40 | (2006.01) |
| G06K 19/077 | (2006.01) |
| H01L 27/11507 | (2017.01) |
| H01L 27/28 | (2006.01) |
| H01L 51/00 | (2006.01) |
| H01L 51/05 | (2006.01) |
| H01L 21/28 | (2006.01) |
| H01L 49/02 | (2006.01) |
| G03F 7/004 | (2006.01) |
| C09D 125/08 | (2006.01) |
| G03F 7/038 | (2006.01) |
| G03F 7/033 | (2006.01) |
| C08K 3/22 | (2006.01) |
| C08F 220/18 | (2006.01) |
| H01L 27/1159 | (2017.01) |

(52) U.S. Cl.
CPC ............. *C08G 18/34* (2013.01); *C08G 18/71* (2013.01); *C09D 125/08* (2013.01); *G03F 7/0047* (2013.01); *G03F 7/033* (2013.01); *G03F 7/0388* (2013.01); *G03F 7/162* (2013.01); *G03F 7/168* (2013.01); *G03F 7/2004* (2013.01); *G03F 7/322* (2013.01); *G03F 7/40* (2013.01); *G06K 19/07773* (2013.01); *H01B 1/22* (2013.01); *H01B 5/16* (2013.01); *H01L 27/11507* (2013.01); *H01L 27/283* (2013.01); *H01L 28/40* (2013.01); *H01L 29/40111* (2019.08); *H01L 29/786* (2013.01); *H01L 51/004* (2013.01); *H01L 51/0043* (2013.01); *H01L 51/0048* (2013.01); *H01L 51/0558* (2013.01); *C08F 2220/1841* (2013.01); *C08F 2220/325* (2013.01); *C08F 2800/20* (2013.01); *C08K 2003/2206* (2013.01); *C08K 2003/2241* (2013.01); *H01L 27/1159* (2013.01); *H01L 28/55* (2013.01)

(58) Field of Classification Search
CPC ............ C08F 212/08; C08F 2220/1858; C08F 2220/1808; C08F 220/06; H01L 51/0048; H01L 51/0558; H01L 51/0043; H01L 51/004; H01L 51/05; H01L 27/105; H01L 27/28; H01L 27/11507; H01L 27/1159; H01L 27/283; H01L 21/288; H01L 29/786; H01L 28/40; H01L 21/28291; H01L 28/55; H01L 29/40111; C08G 18/34; C08G 18/71; G03F 7/162; G03F 7/168; G03F 7/2004; G03F 7/322; G03F 7/40; G03F 7/004; G03F 7/038; G03F 7/0388; G03F 7/033; G03F 7/0047; G06K 19/07773; H01B 1/22; H01B 5/16; C09D 125/08; C08K 2003/2237; C08K 3/22; C08L 25/08

See application file for complete search history.

(56) References Cited

U.S. PATENT DOCUMENTS

| | | | |
|---|---|---|---|
| 2006/0249769 A1* | 11/2006 | Eder | ................. B82Y 10/00 257/296 |
| 2007/0057300 A1* | 3/2007 | Fukada | ............ H01L 21/28291 257/295 |
| 2009/0039341 A1 | 2/2009 | Marsman et al. | |
| 2010/0252802 A1 | 10/2010 | Numata et al. | |
| 2014/0138654 A1 | 5/2014 | Ohashi et al. | |

FOREIGN PATENT DOCUMENTS

| | | |
|---|---|---|
| JP | 2007-525829 A | 9/2007 |
| JP | 2008-112147 A | 5/2008 |
| JP | 2015-111741 A | 6/2015 |
| WO | WO 2009/031336 A1 | 3/2009 |
| WO | WO 2012/153855 A1 | 11/2012 |

OTHER PUBLICATIONS

Written Opinion of the International Searching Authority for PCT/JP2016/084483 (PCT/ISA/237) dated Feb. 7, 2017.
Extended European Search Report, dated Aug. 29, 2019, for European Application No. 16868506.3.

* cited by examiner

FERROELECTRIC MEMORY ELEMENT, METHOD FOR PRODUCING SAME, MEMORY CELL USING FERROELECTRIC MEMORY ELEMENT, AND RADIO COMMUNICATION DEVICE USING FERROELECTRIC MEMORY ELEMENT

TECHNICAL FIELD

The present invention relates to a ferroelectric memory element, a method of producing the same, as well as a memory cell and a radio communication apparatus using the same.

BACKGROUND ART

In recent years, coating methods have been introduced into the production process of electronic devices such as electronic papers, flexible sensors, and RFID (Radio Frequency IDentification) tags. The use of coating methods enables to avoid vacuum processes and high temperature processes, and thus allows for a low cost production of electronic devices.

Among such electronic devices, RFID tags are expected to be used for all kinds of commodities, and the low cost production of RFID tags is highly demanded. Accordingly, techniques have been investigated to produce respective components included in an RFID tag using coating methods.

One of the components included in an RFID tag is a memory element, such as, for example, a ferroelectric memory element. In a ferroelectric memory element, the polarization generated by the application of an electric field to the element is maintained even when the electric field is reduced to 0. Further, by applying an electric field in the direction opposite to the direction of polarization, it is possible to invert the direction of polarization. This phenomenon is referred to as a polarization inversion, and the electric field intensity required for the polarization inversion to occur is referred to as a coercive electric field. A low coercive electric field allows a memory element to perform its functions, such as writing, storing, and reading of memory information, at a low voltage.

To produce a ferroelectric memory element using a coating method, a method is known in which a solution of a fluorine resin, such as a copolymer of polyvinylidene fluoride and polytrifluoroethylene (PVDF-TrFE), is coated, and the solvent therein is dried to form a ferroelectric layer (see, for example, Patent Documents 1 and 2).

Further, barium titanate, lead zirconate titanate and the like are known as inorganic ferroelectric materials. To produce a coating-type ferroelectric memory element using such materials, a technique is proposed, for example, in which a film formed by coating a varnish containing particles of these materials is used as a gate insulating film of a thin film transistor (TFT) (see, for example, Patent Document 3).

PRIOR ART DOCUMENTS

Patent Documents

Patent Document 1: JP 2008-544519 A
Patent Document 2: JP 2007-173728 A
Patent Document 3: JP 2006-216792 A

SUMMARY OF THE INVENTION

Problems to be Solved by the Invention

However, techniques using conventional coating-type ferroelectric materials are associated with a problem that they lead to a high coercive electric field, and thus cause a high driving voltage in the coating-type ferroelectric memory elements thereby produced.

In view of the above described problem, an object of the present invention is to provide a ferroelectric memory element which has a low driving voltage and which can be formed by coating.

Means for Solving the Problems

The present inventors have carried out a study on the assumption that the use of ferroelectric particles having a specific particle size allows for solving the above described problem, thereby completing the present invention.

In other words, the present invention is a ferroelectric memory element including at least:
a first conductive film;
a second conductive film; and
a ferroelectric layer provided between the first conductive film and the second conductive film;
wherein the ferroelectric layer contains ferroelectric particles and an organic component, and
wherein the ferroelectric particles have an average particle size of from 30 to 500 nm.

Further, the present invention is a method of producing a ferroelectric memory element, the method including the following steps of:
(1) forming a conductive film of the ferroelectric memory element on an insulating substrate;
(2) forming a ferroelectric layer by coating a composition containing at least ferroelectric particles having an average particle size of from 30 to 500 nm, an organic component, and a solvent, on the conductive film, followed by drying; and
(3) forming a conductive film of the ferroelectric memory element on the ferroelectric layer.

Effect of the Invention

According to the present invention, it is possible to provide a ferroelectric memory element which has a low driving voltage and which can be formed by coating.

MODE FOR CARRYING OUT THE INVENTION

The ferroelectric memory element according to the present invention is a ferroelectric memory element including at least:
a first conductive film;
a second conductive film; and
a ferroelectric layer provided between the first conductive film and the second conductive film;
wherein the ferroelectric layer contains ferroelectric particles and an organic component, and
wherein the ferroelectric particles have an average particle size of from 30 to 500 nm.

First Embodiment

Figure 1:
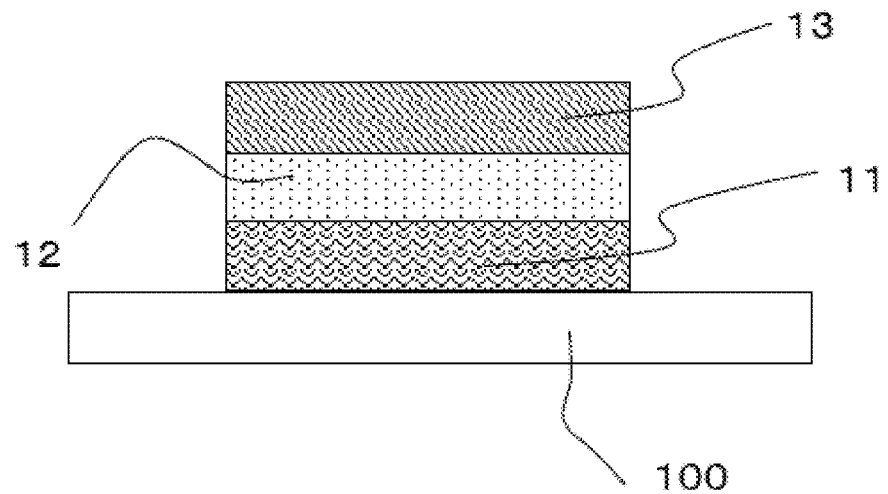
FIG. 1 is a schematic sectional view showing an example of an embodiment of a ferroelectric memory element according to the present invention.

FIG. 1 shows a capacitor-type element, which is one of the embodiments of the ferroelectric memory element according to the present invention. The capacitor-type ferroelectric memory element having this structure includes: an insulating substrate 100; and a first conductive film 11, a ferroelectric layer 12, and a second conductive film 13, which are one set of conductive films. The first conductive film 11 and the second conductive film 13 function as a lower electrode and an upper electrode, respectively. The first conductive film 11 and the second conductive film 13 are not electrically connected, and the ferroelectric layer 12 is formed between the first conductive film 11 and the second conductive film 13.

Figure 2:
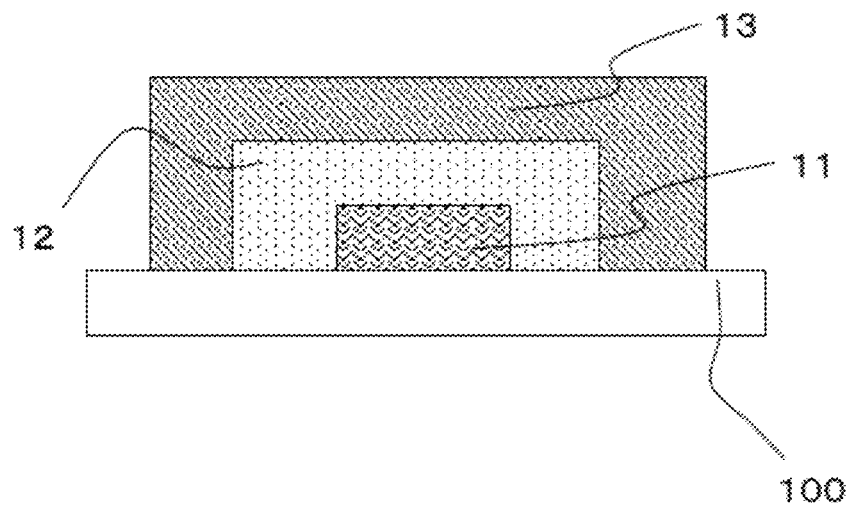
FIG. 2 is a schematic sectional view showing an example of an embodiment of the ferroelectric memory element according to the present invention.
Figure 3:
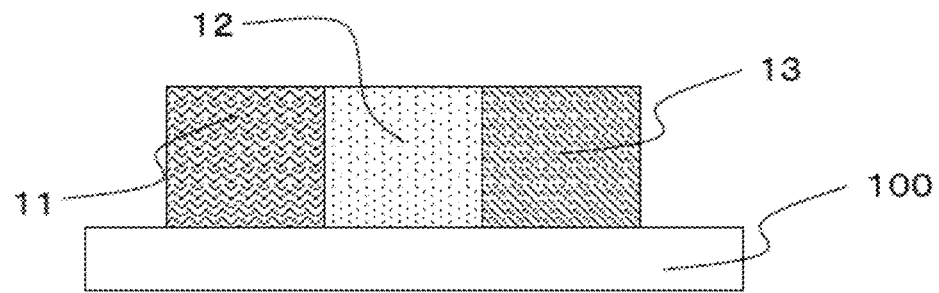
FIG. 3 is a schematic sectional view showing an example of an embodiment of the ferroelectric memory element according to the present invention.
Figure 4:
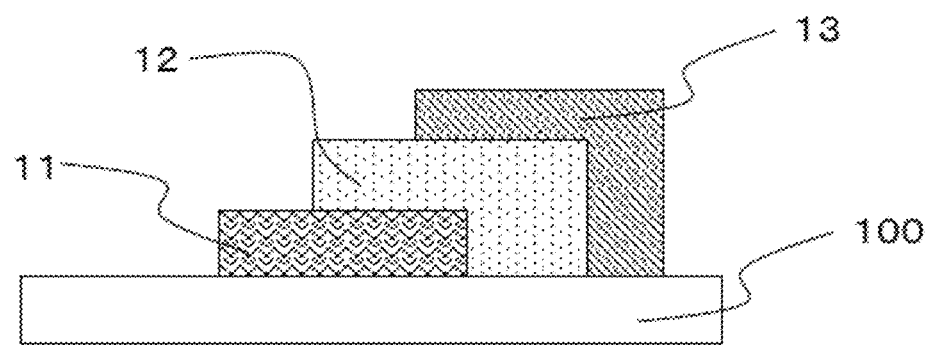
FIG. 4 is a schematic sectional view showing an example of an embodiment of the ferroelectric memory element according to the present invention.

FIGS. 2 to 4 show examples of other structures of the capacitor-type ferroelectric memory element. In the memory element shown in FIG. 2, the ferroelectric layer 12 is formed so as to cover the first conductive film 11 formed on the insulating substrate 100, and further, the second conductive film 13 is formed so as to cover the ferroelectric layer 12. In the memory element shown in FIG. 3, the first conductive film 11 and the second conductive film 13 are provided on the insulating substrate 100, and the ferroelectric layer 12 is formed therebetween. In the memory element shown in FIG. 4, the ferroelectric layer 12 is provided so as to cover a portion of the first conductive film 11 formed on the insulating substrate 100, and further, the second conductive film 13 is formed so as to cover the ferroelectric layer 12.

(Ferroelectric Layer)

The ferroelectric layer is a layer which exhibits ferroelectric properties. The ferroelectric properties refer to characteristics that the polarization generated by the application of an electric field is maintained even when the electric field is reduced to 0, and that the direction of the polarization is inverted (referred to as the polarization inversion) by the application of an electric field.

In the present invention, the ferroelectric layer contains ferroelectric particles and an organic component. Further, the ferroelectric particles have an average particle size of from 30 to 500 nm.

The ferroelectric particles are particles containing a compound exhibiting ferroelectric properties. The compound exhibiting ferroelectric properties is not particularly limited, and examples thereof include inorganic and organic ferroelectric compounds. However, an inorganic ferroelectric compound is preferred, from the viewpoint of reducing the driving voltage of the ferroelectric memory element.

Examples of the inorganic ferroelectric compound include barium titanate, lead zirconate titanate, lead lanthanum zirconate titanate, strontium bismuth niobate, strontium bismuth titanate niobate and strontium bismuth tantalate; Bi layered ferroelectric materials; and pyroniobates such as $KNbO_3.NaNbO_3.LiNbO_3.(Na_{0.5}K_{0.5})NbO_3$, but not particularly limited thereto. These inorganic ferroelectric compounds can be used alone, or in combination of two or more kinds.

Among these, it is preferred that the ferroelectric particles contain, as a main component, at least one selected from barium titanate, lead zirconate titanate, lead lanthanum zirconate titanate, strontium bismuth niobate, strontium bismuth titanate niobate and strontium bismuth tantalate. The main component as used herein means that the ratio of the particles of the component with respect to the total amount of the ferroelectric particles is higher than other ferroelectric particles therein. Among these, barium titanate is preferred, because of the availability of its highly crystalline particles which can be used for forming a coating film.

The ferroelectric particles have an average particle size of from 30 to 500 nm, and it is more preferred that the lower limit thereof be 100 nm or more, and the upper limit thereof be 300 nm. When the ferroelectric particles have an average particle size of 30 nm or more, the crystallinity of the ferroelectric particle is increased to enhance the ferroelectric properties, resulting in a decrease in the coercive electric field. Further, when the ferroelectric particles have an average particle size of 100 nm or more, the above described effect is further improved.

On the other hand, when the ferroelectric particles have an average particle size of 500 nm or less, it is possible to obtain a uniform film and to prevent the occurrence of a short circuit fault in the element, thereby improving the yield. Further, when the ferroelectric particles have an average particle size of 300 nm or less, it is possible to obtain a more uniform film, thereby further improving the yield; and in addition, the bending resistance of the resulting ferroelectric memory element can also be improved.

The average particle size of the ferroelectric particles in the ferroelectric layer can be calculated by observing the cutting cross-sectional surface of the ferroelectric layer by an electron microscope, and by determining the number average value of the particle sizes of randomly selected 100 particles. In cases where the particles have a spherical shape, the diameter of each particle is taken as the particle size of the particle. In cases where the particles have a shape other than a spherical shape, the mean value of the maximum width and the minimum width of one particle observed by an electron microscope is taken as the particle size of the particle.

The ratio of the ferroelectric particles in the ferroelectric layer is not particularly limited, as long as the particles exhibit ferroelectric properties; however, it is preferably 20 vol % or more, and more preferably 40 vol % or more, in order to achieve a low driving voltage. Further, the ratio of the ferroelectric particles is preferably 90 vol % or less, in order to improve the yield of the element. The volume fraction of the ferroelectric particles in the ferroelectric layer can be calculated from a 3D-scanning electron microscope (SEM) image or a 3D-transmission electron microscope (TEM) image.

Further, the weight fraction of the ferroelectric particles in the ferroelectric layer is preferably from 50 to 99 wt %, more preferably from 60 to 99 wt %, and still more preferably 70 to 99 wt %, in order to achieve a low driving voltage.

The weight fraction of the ferroelectric particles in the ferroelectric layer can be obtained, by determining the weight of residues remaining after the thermal decomposition of the organic component, using a thermogravimetric apparatus (TGA). In cases where the densities of the organic component and the ferroelectric particles are known, the weight fraction of the ferroelectric particles can be obtained from the volume fraction of the particles determined as described above.

The ferroelectric layer of the ferroelectric memory element according to the present invention contains an organic component. When the gaps of the ferroelectric particles are filled with the organic component, the occurrence of a short circuit fault in the element can be prevented, thereby improving the yield.

The organic component is not particularly limited, and may be, for example, a monomer, an oligomer or polymer, a photopolymerization initiator, a plasticizer, a leveling agent, a surfactant, a silane coupling agent, an antifoaming agent, a pigment, or a dispersant. An oligomer or polymer is preferred, from the viewpoint of improving the bending resistance of the element.

The oligomer or polymer is not particularly limited, and any of thermoplastic resins and thermosetting resins can be selected. Specifically, it is possible to use an acrylic resin, an epoxy resin, a novolac resin, a phenol resin, a polyimide precursor resin, a polyimide resin, a polysiloxane resin, a fluorine resin, a polyvinyl acetal resin, or the like.

The acrylic resin is a resin which contains at least a structure derived from an acrylic monomer, as a repeating unit. Specifically, as the acrylic monomer, any compound containing a carbon-carbon double bond can be used. Preferred examples thereof include: acrylic monomers such as methyl acrylate, acrylic acid, 2-ethylhexyl acrylate, ethyl methacrylate, n-butyl acrylate, i-butyl acrylate, i-propyl acrylate, glycidyl acrylate, N-methoxymethyl acrylamide, N-ethoxymethyl acrylamide, N-n-butoxymethyl acrylamide, N-isobutoxymethyl acrylamide, butoxy triethylene glycol acrylate, dicyclopentanyl acrylate, dicyclopentenyl acrylate, 2-hydroxyethyl acrylate, isobornyl acrylate, 2-hydroxypropylacrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylamide, aminoethyl acrylate, phenyl acrylate, phenoxyethyl acrylate, 1-naphthyl acrylate, 2-naphthyl acrylate, thiophenol acrylate, and benzylmercaptan acrylate; and those obtained by replacing the acrylate in these monomers with methacrylate. These acrylic monomers may be used alone, or in combination of two or more kinds.

The epoxy resin is a resin having a structure containing a prepolymer having two or more epoxy groups within the molecular structure. The prepolymer may be, for example, a compound having a biphenyl skeleton or a dicyclopentadiene skeleton. Further, a curing agent may also be contained, and it is possible to use a phenol novolac resin, a bisphenol A-type novolac resin, an aminotriazine compound, a naphthol compound, or a diamine compound, as the curing agent. It is also possible to add a curing accelerator such as triphenylphosphine, a benzimidazole compound, or a metal chelate compound such as tris(2,4-pentanedionato)cobalt.

The polyimide precursor resin is a resin which is converted into a polyimide resin by heat and/or a chemical cyclization reaction, and examples thereof include polyamic acids, polyamic acid esters and polyamic acid silyl esters.

The polyimide precursor resin can be synthesized by allowing a diamine compound to react with an acid dianhydride or a derivative thereof. Examples of the derivative of an acid dianhydride include tetracarboxylic acids, acid chlorides, and mono-, di-, tri- or tetraesters of the tetracarboxylic acids, of the acid dianhydride. Examples of ester groups include methyl ester group, ethyl ester group, n-propyl ester group, isopropyl ester group, n-butyl ester group, sec-butyl ester group, and tert-butyl ester group. The method of carrying out a polymerization reaction is not particularly limited as long as a polyimide precursor resin of interest can be produced, and a known reaction method can be used.

The polysiloxane resin is a compound obtained by polycondensation of a silane compound. The silane compound is not particularly limited, and examples thereof which can be used include diethoxydimethylsilane, diethoxydiphenylsilane, tetramethoxysilane, tetraethoxysilane, vinyltrimethoxysilane, methyltrimethoxysilane, ethyltrimethoxysilane, propyltrimethoxysilane, hexyltrimethoxysilane, octadecyltrimethoxysilane, phenyltrimethoxysilane, p-tolyltrimethoxysilane, benzyltrimethoxysilane, α-naphthyltrimethoxysilane, β-naphthyltrimethoxysilane, trifluoroethyltrimethoxysilane, trimethoxysilane and γ-methacryloxypropyltrimethoxysilane. The silane compound is not limited to those described above, and may be used alone, or in combination of two or more kinds.

Examples of the fluorine resin and the like which can be used include polyvinylidene fluoride (PVDF), poly(vinylidene fluoride-trifluoroethylene) (PVDF-TrFE), poly(vinylidene fluoride-tetrafluoroethylene) (PVDF-TeFE), poly(vinylidene fluoride-chlorotrifluoroethylene) (PVDF-CTFE), poly(vinylidene fluoride-chlorofluoroethylene) (PVDF-CFE), poly(vinylidene fluoride-trifluoroethylene-chlorofluoroethylene) (PVDF-TrFE-CFE), poly(vinylidene fluoride-trifluoroethylene-chlorotrifluoroethylene) (PVDF-TrFE-CTFE), tetrafluoroethylene, poly(vinylidene fluoride-hexafluoropropylene), polytrichlorofluoroethylene, polychlorotrifluoroethylene, ethylene-chlorotrifluoroethylene copolymers, polyvinyl fluoride, tetrafluoroethylene-perfluorodioxole copolymers, ethylene-tetrafluoroethylene copolymers, perfluoroethylenepropene copolymers, and perfluoroalkoxy alkanes. The fluorine resin is not limited to those described above, and may be used alone, or in combination of two or more kinds.

The polyvinyl acetal resin is a resin which can be obtained by acetalization of polyvinyl alcohol, and polyvinyl butyral or the like can be used, for example.

Examples of other resins include resins containing structures derived from vinyl monomers such as: styrene; styrene derivatives, for example, p-methylstyrene, o-methylstyrene, m-methylstyrene, p-hydroxystyrene, o-hydroxystyrene, m-hydroxystyrene, α-methylstyrene, chloromethylstyrene, and hydroxymethylstyrene; 1-vinyl-2-pyrrolidone; and N-vinylimidazole. The vinyl monomers are not limited to those described above, and may be used alone, or in combination of two or more kinds.

Among these resins, it is preferred that the ferroelectric layer contain a resin containing a hydrophilic group, from the viewpoint of improving the dispersibility of the ferroelectric particles. This is thought to be because the incorporation of such a resin allows for the formation of attractive interactions, such as hydrogen bonds, between oxygen atoms or hydroxyl groups present on the surfaces of the ferroelectric particles and the hydrophilic groups in the resin. When the ferroelectric particles have a high dispersibility, the resulting ferroelectric layer has an improved surface smoothness even in the case of using ferroelectric particles having a large particle size, and the occurrence of a short circuit fault in the ferroelectric memory element can be prevented. As a result, it is possible to obtain a ferroelectric element with a low driving voltage, as well as to improve the yield of the ferroelectric memory element. Further, by enhancing the dispersibility the ferroelectric particles, an effect of improving the bending resistance of the ferroelectric memory element can also be obtained.

Examples of the hydrophilic group in the hydrophilic group-containing resin include hydroxyl group, amino group, mercapto group, carboxyl group, sulfo group, phosphate group, and amide group, but not limited thereto. One kind alone, or two or more kinds of these groups may be contained. Among these hydrophilic groups, the hydrophilic group-containing resin preferably contains a hydroxyl group or a carboxyl group, which allows for a favorable dispersion of the ferroelectric particles. A resin containing both a hydroxyl group and a carboxyl group is particularly preferred.

Examples of the hydrophilic group-containing resin include acrylic resins, styrene acrylic resins, styrene maleic acid resins, rosin-modified maleic acid resins, rosin-modified acrylic resins, epoxy resins, polyester resins, polyurethane resins, and phenol resins, but not particularly limited thereto. Among the resins described above, acrylic resins, styrene acrylic resins, and styrene maleic acid resins are preferably used, from the viewpoint of the ease of availability of monomers, low cost, the ease of synthesis, the dispersibility of the ferroelectric particles, and the like.

Of the above described resins, acrylic resins, styrene acrylic resins, and styrene maleic acid resins can be produced by the following method. Specifically, such a resin can be produced by polymerization or copolymerization of a compound(s) selected from the following compounds, using a radical polymerization initiator: carboxyl group-containing monomers such as acrylic acid, methacrylic acid, itaconic acid, crotonic acid, maleic acid, fumaric acid, vinyl acetate, and acid anhydrides thereof; hydroxyl group-containing monomers such as 2-hydroxyethyl acrylate; amino group-containing monomers such as dimethylaminoethyl methacrylate; mercapto group-containing monomers such as 2-(mercaptoacetoxy)ethyl acrylate; sulfo group-containing monomers such as acrylamide t-butylsulfonic acid; phosphate group-containing monomers such as 2-methacryloyloxyethyl acid phosphate; amide group-containing monomers such as methacrylamide; methacrylic acid esters; acrylic acid esters; styrene; acrylonitrile; and vinyl acetate.

Specific examples of the resin containing a carboxyl group include (meth)acrylic acid copolymers, (meth)acrylic acid-(meth)acrylic acid ester copolymers, styrene-(meth)acrylic acid copolymers, styrene-(meth)acrylic acid-(meth)acrylic acid ester copolymers, styrene-maleic acid copolymers, styrene-maleic acid-(meth)acrylic acid copolymers, and styrene-maleic acid-(meth)acrylic acid ester copolymers. Specific examples of the resin containing both a hydroxyl group and a carboxyl group include a resin containing at least: a unit structure represented by Formula (1); a unit structure represented by Formula (2); and a unit structure represented by Formula (3):

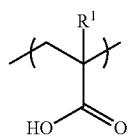

(1)

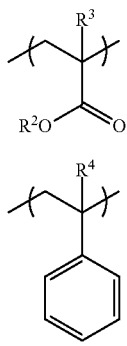

(2)

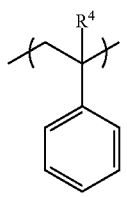

(3)

(wherein in Formulae (1) and (2), $R^1$ represents a hydrogen atom, or a monovalent organic group having from 1 to 20 carbon atoms; wherein in Formula (2), $R^2$ represents a monovalent organic group having from 1 to 20 carbon atoms and containing at least one hydroxyl group; and wherein in Formula (3), $R^3$ and $R^4$ each represents a hydrogen atom, or a monovalent organic group having from 1 to 20 carbon atoms).

A resin containing the unit structure represented by Formula (1) and the unit structure represented by Formula (2) can be produced by an addition reaction of a compound containing a glycidyl group to the carboxyl group in a resin containing the unit structure represented by Formula (1). However, the method of producing such a resin is not limited to this method.

The unit structure represented by Formula (3) exhibits hydrophobicity. Therefore, it is thought that this unit structure serves to inhibit excessive interactions between polymer chains and to accelerate the formation of attractive interactions between the ferroelectric particles and the polymer chains, thereby allowing for good dispersion of the ferroelectric particles.

Further, from the viewpoint of improving the dispersibility of the ferroelectric particles, it is preferred that the organic component contained in the ferroelectric layer contain a compound having a 5-membered heterocyclic structure containing a carbon atom and a nitrogen atom. Specific examples of the 5-membered heterocyclic structure containing a carbon atom and a nitrogen atom include imidazole, pyrazole, oxazole, thiazole, imidazoline, triazole, 1,2,3-tetrazole, 1,2,4-tetrazole, benzimidazole, benzoxazole, benzothiazole, purine, and the like; and substitution products thereof; as well as polymers having any of these structures in the main chain skeleton or a side chain; but not limited thereto. Examples of the polymer include polyvinylimidazole, polybenzimidazole, polybenzoxazole, and polybenzothiazole. The reason that these compounds serve to improve the dispersibility of the ferroelectric particles, is thought to be because the unshared electron pairs of the nitrogen atoms strongly coordinate to the ferroelectric particles. When the ferroelectric particles have a high dispersibility, the surface smoothness of the ferroelectric layer can be improved even in the case of using ferroelectric particles having a large particle size, and the occurrence of a short circuit fault in the ferroelectric memory element can be prevented. As a result, a ferroelectric element with a low driving voltage can be obtained, and at the same time, the yield of the ferroelectric memory element is improved. Further, by enhancing the dispersibility the ferroelectric particles, an effect of improving the bending resistance of the ferroelectric memory element can also be obtained.

From the viewpoint of the permittivity of the ferroelectric layer, on the other hand, the organic component to be contained in the ferroelectric layer is preferably a resin having a high permittivity. This is because, an increase in the permittivity of the ferroelectric layer leads to an increase in the polarization generated due to the application of a voltage, and thus results in a decrease in the coercive electric field. Among the above described resins, a resin having a unit structure represented by Formula (4) is preferred, from the viewpoint of improving the solubility of the resin in a solvent and the dispersibility of the ferroelectric particles.

(4)

Specific examples of the resin represented by Formula (4) include polyvinylidene fluoride (PVDF), poly(vinylidene fluoride-trifluoroethylene) (PVDF-TrFE), poly(vinylidene fluoride-tetrafluoroethylene) (PVDF-TeFE), poly(vinylidene fluoride-chlorotrifluoroethylene) (PVDF-CTFE), poly(vinylidene fluoride-chlorofluoroethylene) (PVDF-CFE), poly(vinylidene fluoride-trifluoroethylene-chlorofluoroethylene) (PVDF-TrFE-CFE), poly(vinylidene fluoride-trifluoroethylene-chlorotrifluoroethylene) (PVDF-TrFE-CTFE), and poly(vinylidene fluoride-hexafluoropropylene). The fluorine resin is not limited to those described above, and may be used alone, or in combination of two or more kinds. For example, PVDF-TrFE has a relative permittivity of 14, which is about 4 times higher than a common resin.

The ferroelectric layer preferably has a film thickness of from 0.2 to 2 μm. A film thickness within the above range facilitates the formation of a uniform film. Further, from the viewpoint of reducing the driving voltage of the ferroelectric memory element, the ferroelectric layer preferably has a thickness of from 0.2 to 1 μm, and particularly preferably from 0.2 to 0.5 μm. The film thickness of the ferroelectric layer in the ferroelectric memory element can be measured by observing the cutting cross-sectional surface of the ferroelectric memory element by an electron microscope.

It is possible to determine whether a film between the electrodes in a capacitor-type memory element has ferroelectric properties or not, by measuring the properties of polarization hysteresis using a system for evaluating ferroelectric properties.

Further, whether the particles contained in a film containing particles and an organic component are ferroelectric particles or not, can be determined as follows. In cases where the organic component is not a ferroelectric compound, if the film has ferroelectric properties, it means that the inorganic particles in the film have ferroelectric properties. In cases where the organic component is a ferroelectric compound, on the other hand, if the coercive electric field of the film is different from that of the organic component alone, it means that the inorganic particles in the film have ferroelectric properties.

(Conductive Films)

An electrical conductor to be used in the conductive films of the ferroelectric memory element according to the present invention may be any electrically conductive material which can be generally used for electrodes. Examples thereof include: electrically conductive metal oxides such as tin oxide, indium oxide and indium tin oxide (ITO); metals such as platinum, gold, silver, copper, iron, tin, zinc, aluminum, indium, chromium, lithium, sodium, potassium, cesium, calcium, magnesium, palladium, molybdenum, amorphous silicon and polysilicon, and alloys thereof; inorganic electrically conductive substances such as copper iodide and copper sulfide; electrically conductive polymers such as polythiophene, polypyrrole, polyaniline, and a complex of polyethylenedioxythiophene and polystyrene sulfonic acid, whose electrical conductivities are enhanced by doping with iodine or the like; and carbon materials; but not limited thereto. These electrode materials may be used alone, or a plurality of these materials may be used as a laminate or a mixture.

Further, it is preferred that metal particles be used as the electrical conductor. The use of metal particles provides an effect of improving the bending resistance of the ferroelectric memory element, and an effect of preventing an increase in the coercive electric field even upon repeated application of a voltage. The reason for this is thought to be because the metal particles serve to form irregularities on the surfaces of the conductive films, and the ferroelectric layer infiltrate into the irregularities to produce an anchoring effect, thereby improving the adhesion between the conductive films and the ferroelectric layer.

Specific preferred examples of the metal particles include metal particles containing at least one of: gold, silver, copper, platinum, lead, tin, nickel, aluminum, tungsten, molybdenum, ruthenium oxide, chromium, titanium, carbon or indium. These metal particles can be used as single metal particles, or as alloy particles or mixed particles. Among these, particles of gold, silver, copper or platinum are preferred, from the viewpoint of electrical conductivity. In particular, particles of silver are more preferred, from the viewpoint of cost and stability. It is still more preferred that the metal particles contain carbon black, from the viewpoint of reducing the electric resistivity of the conductive films.

As an index of the irregularities of the surface of each conductive film, the arithmetic average roughness (Ra) of the surface of the conductive film may be used, for example. The surface of the conductive film preferably has Ra of, for example, from 5 to 200 nm. Ra of 5 nm or more allows for providing an effective anchoring effect, thereby improving the adhesion to the ferroelectric layer. As a result, the bending resistance of the ferroelectric memory element is improved. Further, Ra of 200 nm or less enables to produce a ferroelectric film without pinhole defects. By preventing the occurrence of pinhole defects, the occurrence of a short circuit fault in the ferroelectric memory element can be prevented.

The surface roughness can be measured by a surface profilometer or an atomic force microscope (AFM). In the case of using a surface profilometer, the measurement is carried out at arbitrary selected five points on the conductive film, and the mean value of the measured values is taken as the Ra of the conductive film. Likewise, in the case of using an AFM, the measurement is carried out at arbitrary five points on the conductive film, and the mean value of the measured values is taken as the Ra of the conductive film. These measurement methods are used as appropriate depending on the size of the conductive film to be measured. In cases where the Ra can be measured by either method, the value measured by the surface profilometer is used.

The metal particles in each conductive film preferably have an average particle size of from 0.01 to 5 μm, and more preferably from 0.01 to 2 μm. An average particle size of 0.01 μm or more facilitates the formation of irregularities on the surface of the conductive film, and thus the adhesion between the conductive film and the ferroelectric film is further improved. An average particle size of 5 μm or less, on the other hand, enables to produce a conductive film having a high bending resistance. Further, an average particle size of 2 μm or less allows for improving the bending resistance, as well as further reducing the occurrence of a short circuit fault in the memory element during the production process, thereby improving the yield.

In the present invention, the average particle size of the metal particles in each conductive film can be determined, for example, as follows. The cutting cross-sectional surface of each electrode of the ferroelectric memory element is observed by an electron microscope, to confirm the presence or absence of particles. In cases where particles are observed, an energy dispersive X-ray spectroscopy (EDX) measurement is carried out to confirm whether the particles are metal particles or not. Subsequently, the particle sizes of 100 metal particles randomly selected from these particles are measured by observation using an electron microscope, and the number average value of the measured values is calculated, to be taken as the average particle size.

In cases where the particles have a spherical shape, the diameter of each particle is taken as the particle size of the particle. In cases where the particles have a shape other than a spherical shape, the mean value of the maximum width and the minimum width of one particle observed by an electron microscope is calculated as the particle size of the particle.

In the ferroelectric memory element according to the present invention, it is preferred that at least one of the first conductive film and the second conductive film contain an organic component. It has been found out that incorporation of an organic component produces an effect of preventing an increase in the coercive electric field even upon repeated application of a voltage. The reason for this is not clear; however, it is assumed to be because the incorporation of an organic component improves the adhesion between the conductive film and the ferroelectric layer, as result of which the occurrence of delamination at micro-regions of the interface between the ferroelectric layer and the conductive film is prevented even upon repeated application of a voltage. To further improve the above described effect, it is preferred that each of the first conductive film and second conductive film contains an electrical conductor and an organic component.

The organic component is not particularly limited, and may be, for example, a monomer, or an oligomer or polymer. The oligomer or polymer is not particularly limited, and an acrylic resin, an epoxy resin, a novolac resin, a phenol resin, a polyimide precursor, a polyimide, or the like can be used. However, an acrylic resin is preferred, from the viewpoint of improving crack resistance upon bending. This is assumed to be because, an acrylic resin has a glass transition temperature of 100° C. or lower, and thus softens during the thermal curing of the conductive film to increase the bond between electrical conductor particles.

The acrylic resin is a resin which contains at least a structure derived from an acrylic monomer, as a repeating unit. Specifically, as the acrylic monomer, any compound containing a carbon-carbon double bond can be used. Preferred examples thereof include: acrylic monomers such as methyl acrylate, acrylic acid, 2-ethylhexyl acrylate, ethyl methacrylate, n-butyl acrylate, i-butyl acrylate, i-propane acrylate, glycidyl acrylate, N-methoxymethyl acrylamide, N-ethoxymethyl acrylamide, N-n-butoxymethyl acrylamide, N-isobutoxymethyl acrylamide, butoxy triethylene glycol acrylate, dicyclopentanyl acrylate, dicyclopentenyl acrylate, 2-hydroxyethyl acrylate, isobornyl acrylate, 2-hydroxypropylacrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylamide, aminoethyl acrylate, phenyl acrylate, phenoxyethyl acrylate, 1-naphthyl acrylate, 2-naphthyl acrylate, thiophenol acrylate, and benzylmercaptan acrylate; those obtained by replacing the acrylate in these monomers with methacrylate; styrenes such as styrene, p-methylstyrene, o-methylstyrene, m-methylstyrene, α-methylstyrene, chloromethylstyrene, and hydroxymethylstyrene; γ-methacryloxypropyltrimethoxysilane; and 1-vinyl-2-pyrrolidone. These acrylic monomers may be used alone, or in combination of two or more kinds.

The amount of electrical conductor in the conductive film is preferably within the range of from 70 to 95 wt % with respect to the total amount of the conductive film, and it is more preferred that the lower limit thereof be 80% by mass or more, and the upper limit thereof be 90 wt % or less. When the amount of the electrical conductor is within the above described range, the specific resistance of the conductive film and the probability of disconnection can be reduced.

(Method of Producing Capacitor-Type Ferroelectric Memory Element)

The method of producing a capacitor-type ferroelectric memory element is not particularly limited, but the method includes the following steps:

(1) a step of forming a conductive film of the ferroelectric memory element on an insulating substrate;

(2) a step of forming a ferroelectric layer by coating a ferroelectric paste containing at least ferroelectric particles having an average particle size of from 30 to 500 nm, an organic component, and a solvent, on the conductive film, followed by drying; and (3) a step of forming a conductive film of the ferroelectric memory element on the ferroelectric layer.

The lower electrode of the ferroelectric memory element is formed in the step (1), and the upper electrode is formed in the step (3).

(1. Step of Forming Conductive Film of Ferroelectric Memory Element on Insulating Substrate)

[Insulating Substrate]

The insulating substrate may be of any material as long as at least the surface of the substrate on which the conductive film is to be disposed has insulating properties. Preferred examples thereof include smooth substrates made of: inorganic materials such as silicon wafers, glass, sapphire, and alumina sintered products; and organic materials such as polyethylene terephthalate, polyethylene naphthalate, polyimides, polyesters, polycarbonates, polysulfones, polyethersulfones, polyethylene, polyphenylene sulfide, polyphenylene sulfone, cycloolefin polymers, polyamides, and polyparaxylene. Among these, from the viewpoint of the flexibility of the insulating substrate, one made of a material having a glass transition temperature of 200° C. or lower, and one made of polyethylene terephthalate is particularly preferred.

To improve the adhesion to a metal film, the insulating substrate may be surface treated by forming an easy-adhesive layer thereon. The easy-adhesive layer is not particularly limited, and it can be formed using a known resin, such as a polyester resin, an acrylic resin, a polyurethane resin, an acrylic-grafted polyester resin, or a polysiloxane resin. Among these, a polysiloxane resin is preferred, from the Viewpoint of Improving the Adhesion to the Conductive Film and Heat Resistance.

[Method of Forming Conductive Film]

The method of forming a conductive film is not particularly limited, as long as it allows for electrical conduction through the resulting conductive film. The conductive film can be formed, for example, by a method such as resistive heating vapor deposition, electron beaming, sputtering, plating, CVD, ion plating coating, ink-jet, or printing.

To form an electrode pattern of the ferroelectric memory element, a method can be used, for example, in which the conductive film formed by the above described method is patterned by a known photolithography method or the like; a method in which a pattern is formed via a mask having a desired shape, when performing the vapor deposition or sputtering of a conductive film; a method in which the conductive film formed by the above described method is subjected to laser processing to form a pattern; or a method in which a pattern is formed by photolithography processing using a photosensitive conductive paste.

Among these, photolithography processing using a photosensitive conductive paste is preferred, from the viewpoint of microfabrication properties, processing position control, production cost, and the like. For example, if the microfabrication of the electrode pattern can be performed, it is possible to increase the storage capacity per unit area of the resulting memory element. Specifically, it is preferred that at least one of the steps of forming a conductive film of the ferroelectric memory element according to (1) and (3) include the following steps:

(A) a step of forming a coating film by coating a conductive paste containing an electrical conductor and a photosensitive organic component on the insulating substrate; and (B) a step of patterning the coating film by photolithography into a pattern corresponding to the conductive film of the ferroelectric memory element.

The width and the thickness of each electrode are selected arbitrarily. The electrode preferably has a width of from 10 μm to 10 mm, and a thickness of from 0.01 to 100 μm, but not limited thereto.

The photosensitive conductive paste to be used in the present invention is mainly composed of an electrical conductor and a photosensitive organic component. The electrical conductor and the photosensitive organic component in the conductive paste remain in the above described conductive films as the electrical conductor and the organic component, as they are, or in a physically or chemically altered state. Accordingly, the photosensitive conductive paste is not particularly limited, as long as it is a material which provides the electrical conductor and the organic component to be contained in the conductive film.

The electrical conductor is preferably an electrically conductive powder containing at least one of Ag, Au, Cu, Pt, Pb, Sn, Ni, Al, W, Mo, ruthenium oxide, Cr, Ti, carbon or indium, and it is possible to use a powder of a single component, or an alloy powder or a mixed powder, of these electrically conductive components. Among these, Ag, Cu and Au are preferred from the viewpoint of electrical conductivity, and Ag is more preferred from the viewpoint of cost and stability. In addition, from the viewpoint of reducing the electric resistance during the low temperature curing of the coating film, it is preferred to use Ag and carbon black in combination.

The electrically conductive powder in the conductive paste preferably has a volume average particle size of from 0.01 to 5 µm, and more preferably from 0.01 to 2 µm. When the volume average particle size is 0.01 µm or more, the probability of contact between particles of electrically conductive powder is improved, and it is possible to reduce the specific resistance of the conductive pattern to be formed, and the probability of disconnection. Further, actinic radiation during the exposure is allowed to smoothly transmit through the film, thereby facilitating micropatterning. When the volume average particle size is 5 µm or less, the pattern accuracy, the dimensional accuracy, and the like of the printed electrode pattern will be improved. To reduce the film thickness of the resulting pattern, a decrease in the particle size is required. The volume average particle size can be measured by the Coulter Counter method, the photon correlation method, the laser diffraction method, and the like.

The content of the electrically conductive powder is preferably within the range of from 70 to 95 wt %, and more preferably from 80 to 90 wt %, with respect to the total solid content in the conductive paste. When the content of the electrically conductive powder is 70 wt % or more, the probability of contact between the particles of electrically conductive powder is increased, particularly when the coating film shrinks during the curing. As a result, it is possible to reduce the specific resistance of the conductive pattern to be formed, and the probability of disconnection. Further, when the content is 95 wt % or less, actinic radiation during the exposure is allowed to smoothly transmit through the film, in particular, thereby facilitating micropatterning. Note that the solid content refers to the amount of the conductive paste excluding the solvent contained therein.

The photosensitive organic component is a component which contains a monomer, or an oligomer or polymer, containing a polymerizable unsaturated group within the molecule.

As the monomer containing a polymerizable unsaturated group within the molecule, a compound containing an active carbon-carbon unsaturated double bond can be used. It is possible to use, as such a compound, monofunctional and multifunctional compounds containing, as a functional group(s), a vinyl group, an allyl group, an acrylate group, a methacrylate group, and/or an acrylamide group. Specific examples thereof include: allylated cyclohexyl diacrylate, polyethylene glycol diacrylate, dipentaerythritol hexaacrylate, dipentaerythritol monohydroxy pentaacrylate, ditrimethylolpropane tetraacrylate, glycerol diacrylate, methoxylated cyclohexyl diacrylate, neopentyl glycol diacrylate, propylene glycol diacrylate, polypropylene glycol diacrylate, triglycerol diacrylate, trimethylolpropane triacrylate, bisphenol A diacrylate, diacrylate of a bisphenol A-ethylene oxide adduct, diacrylate of a bisphenol A-propylene oxide adduct, 1,6-hexanediol diacrylate, tripropylene glycol diacrylate, 2-(2-ethoxyethoxy)ethyl acrylate, tetrahydrofurfuryl acrylate, lauryl acrylate, 2-phenoxyethyl acrylate, isodecyl acrylate, isooctyl acrylate, tridecyl acrylate, 1,3-butanediol diacrylate, 1,4-butanediol diacrylate, diethylene glycol diacrylate, tetraethylene glycol diacrylate, and triethylene glycol diacrylate; and compounds obtained by replacing some or all of the acrylic groups in the above described compounds with a methacryl group.

In the present invention, one kind, or two or more kinds of these monomers can be used. The above described monomer is added in an amount within the range of from 1 to 15 wt %, and more preferably within the range of from 2 to 10 wt %, with respect to the total solid content in the conductive paste. A content of the monomer of less than 1 wt % leads to a reduced sensitivity, and makes it difficult to form a favorable pattern. On the other hand, a content of the monomer exceeding 15 wt % makes the resulting dried film tacky, and a photomask may come into contact with the film during the exposure, to causes a problem such as fouling of the photomask or a disturbance on the surface of the coated film.

The oligomer or polymer containing a polymerizable unsaturated group within the molecule can be obtained by polymerization or copolymerization of a component(s) selected from the compounds containing a carbon-carbon double bond. By adding a photoreactive group to a side chain or to the molecular end of such an oligomer or polymer, it is possible to obtain the oligomer or polymer containing a polymerizable unsaturated group within the molecule.

A preferred polymerizable unsaturated group is one having an ethylenically unsaturated group. Examples of the ethylenically unsaturated group include vinyl group, allyl group, acrylic group, and methacryl group. The addition of such a side chain to an oligomer or polymer can be achieved, for example, by an addition reaction of an ethylenically unsaturated compound containing a glycidyl group or an isocyanate group, acrylic acid chloride, methacrylic acid chloride or allyl chloride, to a mercapto group, an amino group, a hydroxyl group or a carboxyl group in the oligomer or polymer.

Examples of the ethylenically unsaturated compound containing a glycidyl group include glycidyl acrylate, glycidyl methacrylate, allyl glycidyl ether, glycidyl ethyl acrylate, crotonyl glycidyl ether, crotonic acid glycidyl ether, and isocrotonic acid glycidyl ether. Examples of the ethylenically unsaturated compound containing an isocyanate group include (meth)acryloyl isocyanate, and (meth)acryloyl ethyl isocyanate. Further, it is preferred that the ethylenically unsaturated compound containing a glycidyl group or an isocyanate group, acrylic acid chloride, methacrylic acid chloride or allyl chloride be added to a mercapto group, an amino group, a hydroxyl group or a carboxyl group in the oligomer or polymer, in an amount of from 0.05 to 1 molar equivalent, or the like.

The photosensitive organic component preferably contains a compound containing a urethane group, from the viewpoint of enhancing the effect of preventing the peeling of the pattern upon bending of the ferroelectric memory element. For example, the above described oligomer or polymer preferably includes a urethane-modified compound obtained by allowing an oligomer or polymer having a hydroxyl group in its side chain to react with a compound containing an isocyanate group.

Such an oligomer or polymer containing a polymerizable unsaturated group within the molecule preferably has a weight average molecular weight (Mw) within the range of from 2,000 to 200,000, a number average molecular weight (Mn) within the range of from 1,000 to 50,000; and more preferably has an Mw within the range of from 5,000 to 100,000, and an Mn within the range of from 1,000 to 30,000. When the Mw and Mn are within the above described ranges, it is possible to obtain a good handleability, and a uniform curability during the photocuring.

Since none of the monomer, oligomer and polymer containing a polymerizable unsaturated group within the molecule has a capacity to absorb actinic radiation energy, it is necessary to use a photopolymerization initiator for allowing photocuring to take place. The photopolymerization initiator is selected depending on a light source to be used for the photocuring, and it is possible to use a photo-radical polymerization initiator, a photo-cationic polymerization initiator, or the like. Further, one kind, or two or more kinds of the photopolymerization initiators can be used.

The photopolymerization initiator is added in amount within the range of from 0.05 to 10 wt %, and more preferably from 0.1 to 10 wt %, with respect to the total amount of the conductive paste. Too low an amount of the photopolymerization initiator may result in an insufficient photocuring, whereas too high an amount of the photopolymerization initiator may result in poor compatibility.

Further, the use of a sensitizer along with the photopolymerization initiator allows for improving the sensitivity, and extending the range of wavelength effective for the reaction. One kind or two or more kinds of sensitizers can be used. In the case of adding a sensitizer(s) to the conductive paste according to present invention, the amount thereof to be added is usually from 0.05 to 10 wt %, and more preferably from 0.1 to 10 wt % with respect to the amount of the photosensitive organic component. Too low an amount of the sensitizer may result in a failure to exhibit an effect of improving the photocuring, whereas too high an amount of the sensitizer may result in a poor compatibility.

The conductive paste to be used in the present invention preferably contains an organic solvent. The use of an organic solvent allows for adjusting the viscosity of the conductive paste, thereby improving the coating properties. The conductive paste preferably has a viscosity of from 10 to 100 Pa·s (a value measured at 3 rpm using a Brookfield type viscometer). The conductive paste more preferably has a viscosity of from 10 to 50 Pa·s. When the viscosity of the conductive paste is within the range of from 10 to 100 Pa·s, a good coatability can be obtained even when coated on a substrate with a level difference(s). When the viscosity of the conductive paste is less than 10 Pa·s, on the other hand, coating defects may occur due to the precipitation of the conductive powder, or liquid dripping may occur during the coating, resulting in a problem of uneven coating surface. Further, a viscosity of the conductive paste exceeding 100 Pa·s results in poor coatability when coated on a substrate with a level difference(s).

The organic solvent is not particularly limited, and examples thereof include methyl ethyl ketone, dioxane, acetone, cyclohexanone, cyclopentanone, isobutyl alcohol, isopropyl alcohol, tetrahydrofuran, γ-butyrolactone, bromobenzene, chlorobenzene, dibromobenzene, dichlorobenzene, bromobenzoic acid, chlorobenzoic acid, diethylene glycol monoethyl ether acetate, diethylene glycol monobutyl ether, diethylene glycol monobutyl ether acetate, 2-methyl-2,4-pentanediol, 3-methyl-1,5-pentanediol, 2-ethyl-1,3-hexanediol, terpineol, 3-methyl-3-methoxybutanol, Texanol, benzyl alcohol, dipropylene glycol monoethyl ether, tripropylene glycol monomethyl ether, and propylene glycol monomethyl ether acetate. These solvents may be used as a mixture of two or more kinds.

The conductive paste to be used in the present invention may contain an additive(s) such as a non-photosensitive polymer which does not contain an unsaturated double bond within the molecule, a plasticizer, a leveling agent, a surfactant, a silane coupling agent, an antifoaming agent, and/or a pigment, to the extent that the desired properties thereof are not impaired. Specific examples of the non-photosensitive polymer include epoxy resins, novolac resins, phenol resins, polyimide precursors, and polyimides.

The conductive paste to be used in the present invention is prepared using a disperser, a kneader, or the like. Specific examples thereof include a three rolls mill, a ball mill, and a planetary ball mill, but not limited thereto.

The method of forming a conductive pattern using the photosensitive conductive paste will be described below. The conductive paste is coated entirely or partially on the insulating substrate by a method such as spin coating using a spinner, spray coating, roll coating, screen printing, coating using a blade coater, coating using a die coater, coating using a calender coater, coating using a meniscus coater, or coating using a bar coater. Further, since the thickness of the coating film varies depending on the coating method, the solid concentration and the viscosity of the composition, and the like, it is adjusted such that the film thickness after drying achieves a predetermined value.

Next, the solvent is removed from the coating film coated on the insulating substrate. The solvent can be removed, for example, by a method such as heat drying using an oven, a hot plate, an infrared radiation etc., or vacuum drying. The heat drying is preferably carried out at a temperature of from 50° C. to 180° C., for a period of time of from one minute to several hours.

The coating film after the solvent removal is subjected to patterning by photolithography. As a light source to be used for exposure, the i-ray (365 nm), b-ray (405 nm), or g-ray (436 nm) of a mercury lamp is preferably used.

After the exposure, a developer is used to remove unexposed portions of the coating film, to obtain a desired pattern. The developer to be used in the case of carrying out an alkaline development is preferably an aqueous solution of a compound such as: tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, or hexamethylenediamine.

Further, depending on the case, it is possible to use as the developer, one obtained by adding to the aqueous solution as described above, one or a plurality of kinds of: polar solvents such as N-methyl-2-pyrrolidone, N,N-dimethylformamide, N,N-dimethylacetamide, dimethylsulfoxide, and γ-butyrolactone; alcohols such as methanol, ethanol, and isopropanol; esters such as ethyl lactate and propylene glycol monomethyl ether acetate; ketones such as cyclopentanone, cyclohexanone, isobutyl ketone, and methyl isobutyl ketone; and the like. It is also possible to use one obtained by adding a surfactant to the alkaline aqueous solution as described above, as the developer. As the developer to be used in the case of carrying out an organic development, it is possible to use a polar solvent such as N-methyl-2-pyrrolidone, N-acetyl-2-pyrrolidone, N,N-dimethylacetamide, N,N-dimethylformamide, dimethylsulfoxide, or hexamethylphosphortriamide, singly; or a mixed solution obtained by mixing any of the polar solvents described above with methanol, ethanol, isopropyl alcohol, xylene, water, methyl carbitol, ethyl carbitol etc.

The development can be carried out, for example, by: a method of spraying the above described developer on the surface of the coating film while allowing the substrate to stand still or to rotate; a method of dipping the substrate in the developer; or a method of applying ultrasonic waves while dipping the substrate in the developer.

After the development, the developed substrate may be subjected to a rinsing treatment with water. At this time, too, an alcohol such as ethanol or isopropyl alcohol, an ester such as ethyl lactate or propylene glycol monomethyl ether acetate, or the like may be added to water, to carry out the rinsing treatment.

Next, the coating film is cured in order to obtain an electrical conductivity. The coating film can be cured, for example, by a method such as: heat curing using an oven, an inert oven, a hot plate, an infrared radiation, or the like; vacuum curing; curing by a xenon flash lamp; or photocuring by UV light. In the case of carrying out the heat curing, the curing is preferably carried out at a curing temperature within the range of from 100 to 300° C., more preferably from 100 to 200° C., and still more preferably from 120° C. to 180° C. When the heat curing is carried out at a heating temperature of 120° C. or higher, it is possible to increase the amount of shrinkage in volume of the photosensitive organic component in the resin, thereby leading to a reduced specific resistivity. Further, since the conductive paste to be used in the present invention allows for obtaining a high electrical conductivity by curing at a relatively low temperature of 180° C. or lower, the conductive paste can be used on a substrate having a low thermal resistance, or in combination with material(s) having a low heat resistance.

(2. Step of Forming Ferroelectric Layer by Coating Ferroelectric Paste on Conductive Film, Followed by Drying)

[Ferroelectric Paste]

The ferroelectric paste to be used in the present invention is mainly composed of ferroelectric particles having an average particle size of from 30 to 500 nm, an organic component, and a solvent. The ferroelectric particles and the organic component in the ferroelectric paste remain in the above described ferroelectric layer as the ferroelectric particles and the organic component, as they are, or in a physically or chemically altered state. Accordingly, the ferroelectric paste is not particularly limited, as long as it is a material which provides the ferroelectric particles and the organic component to be contained in the ferroelectric film.

As an index of the average particle size of the ferroelectric particles in the ferroelectric paste, the volume average particle size thereof can be used, for example. The ferroelectric particles preferably have a volume average particle size of from 30 to 500 nm, and more preferably from 100 to 300 nm. When the volume average particle size of the ferroelectric particles is 30 nm or more, the dispersion stability of the ferroelectric particles is improved. Further, from the viewpoint of the ferroelectric properties of the resulting film, a volume average particle size of 100 nm or more is particularly preferred. To reduce the film thickness of the ferroelectric film, a decrease in the particle size is required. For example, in order to form a ferroelectric film having a film thickness of 2 µm or less, the ferroelectric particles preferably have a volume average particle size of 500 nm or less. Further, from the viewpoint of improving the dispersion stability of the ferroelectric particles, a volume average particle size of 300 nm or less is more preferred. The volume average particle size can be measured, for example, by: the dynamic light scattering method in which the fluctuation of scattered light due to the Brownian motion of the ferroelectric particles is measured; the electrophoretic light scattering method in which the Doppler effect of scattered light when the ferroelectric particles are subjected to electrophoresis is measured; or the like.

The ratio of the ferroelectric particles with respect to the total solid content in the ferroelectric paste is not particularly limited. However, it is preferred that the volume fraction of the ferroelectric particles in the finally resulting ferroelectric film be from 20 to 90 vol %. For example, the weight fraction of the ferroelectric particles with respect to the total solid content in the ferroelectric paste is preferably from 50 to 99 wt %. Note that the solid content refers to the amount of the conductive paste excluding the solvent contained therein.

The solvent is not particularly limited, and it is possible to select as appropriate a solvent in which the ferroelectric particles can be dispersed, and the organic component can be dissolved. Examples of the solvent include various types of organic solvents, for example: ketone solvents such as methyl ethyl ketone, acetone, diethyl ketone, methyl isobutyl ketone, methyl isopropyl ketone, cyclopentanone, and cyclohexanone; alcohol solvents such as methanol, ethanol, isopropanol, isobutyl alcohol, benzyl alcohol, methoxymethylbutanol, ethylene glycol, diethylene glycol, and glycerin; ether solvents such as diethyl ether, diisopropyl ether, 1,2-dimethoxyethane, 1,4-dioxane, tetrahydrofuran, tetrahydropyran, anisole, diethylene glycol dimethyl ether (diglyme), and diethylene glycol ethyl ether (carbitol); cellosolve solvents such as methyl cellosolve, ethyl cellosolve, and phenyl cellosolve; aliphatic hydrocarbon solvents such as hexane, pentane, heptane, and cyclohexane; aromatic hydrocarbon solvents such as toluene, xylene, and benzene; aromatic heterocyclic compound-based solvents such as pyridine, pyrazine, furan, pyrrole, thiophene, and N-methylpyrrolidone; amide solvents such as N,N-dimethylformamide and N,N-dimethylacetamide; halogen compound-based solvents such as trichloroethylene, dichloromethane, chloroform, 1,2-dichloroethane, and chlorobenzene; ester solvents such as ethyl acetate, methyl acetate, ethyl formate, ethyl lactate, dimethyl carbonate, diethyl carbonate, propylene carbonate, and γ-butyrolactone; sulfur compound-based solvents such as dimethyl sulfoxide and sulfolane; nitrile solvents such as acetonitrile, propionitrile, and acrylonitrile; and organic acid solvents such as formic acid, acetic acid, trichloroacetic acid, and trifluoroacetic acid; as well as mixed solvents including the above mentioned solvents.

The ferroelectric paste can be obtained by dispersing the ferroelectric particles in the organic component. For example, the ferroelectric paste can be prepared by: a method in which the ferroelectric particles are added to a resin solution, followed by mixing and dispersing; the let-down method in which the ferroelectric particles are dispersed in an appropriate solvent to prepare a dispersion liquid in advance, and the dispersion liquid is then mixed with a resin solution; or the like. The method of dispersing the ferroelectric particles in a resin or a solvent is not particularly limited, and it is possible to use, for example, a method using ultrasonic dispersion, a ball mill, a roll mill, a Crea Mix, a homogenizer, or a media disperser. From the viewpoint of the dispersibility, in particular, it is preferred to use a ball mill or a homogenizer.

The resin to be used in the resin solution is not particularly limited, and it is possible to select any of thermoplastic resins and thermosetting resins. Specific examples of the resin which can be used include acrylic resins, epoxy resins, novolac resins, phenol resins, polyimide precursor resins, polyimide resins, polysiloxane resins, fluorine resins, polyvinyl acetal resins, polystyrene resins and derivatives thereof, polyvinylpyrrolidone resins, and polyvinylimidazole resins. These resins may be used alone, or in combination of two or more kinds.

Among these resins, it is preferred that the ferroelectric paste contain a hydrophilic group-containing resin, from the viewpoint of the dispersibility of the ferroelectric particles in the paste. This is thought to be because the incorporation of such a resin results in the presence of attractive interactions, such as hydrogen bonds, between oxygen atoms or hydroxyl groups present on the surfaces of the ferroelectric particles and the hydrophilic groups in the resin, thereby inhibiting the aggregation of the ferroelectric particles. When the ferroelectric particles have a high dispersibility, it is possible to achieve an improvement in the coating properties of the coating film, for example, an improvement in the surface smoothness.

Examples of the hydrophilic group in the hydrophilic group-containing resin include hydroxyl group, amino group, mercapto group, carboxyl group, sulfo group, phosphate group, and amide group, but not limited thereto. One kind alone, or two or more kinds of these groups may be contained. Among these hydrophilic groups, the hydrophilic group-containing resin preferably contains a hydroxyl group or a carboxyl group, which allows for a good dispersion of the ferroelectric particles. A resin containing both a hydroxyl group and a carboxyl group is particularly preferred.

When the hydrophilic group-containing resin has an acid value of 30 mg KOH/g or more, a good dispersibility of the ferroelectric particles can be obtained. The acid value is more preferably 60 mg KOH/g or more. From the viewpoint of the pot life of the ferroelectric paste, the acid value is preferably 250 mg KOH/g or less, and more preferably 200 mg KOH/g or less. The acid value of the above described resin can be determined in accordance with the neutralization titration method described in the section 3.1 on the test method, of JIS K 0070: 1992.

The hydrophilic group-containing resin preferably has a weight average molecular weight of 5,000 or more, from the viewpoint of the bending resistance of the resulting ferroelectric memory element. The weight average molecular weight is more preferably 15,000 or more, and still more preferably 20,000 or more. Further, the hydrophilic group-containing resin preferably has a weight average molecular weight of 100,000 or less, because it allows for maintaining the fluidity of the ferroelectric paste. The weight average molecular weight is more preferably 75,000 or less, and still more preferably 50,000 or less. The weight average molecular weight of the above described resin can be determined by measuring the molecular weight in terms of polystyrene, using gel permeation chromatography (GPC).

Examples of the hydrophilic group-containing resin include acrylic resins, styrene acrylic resins, styrene maleic acid resins, rosin-modified maleic acid resins, rosin-modified acrylic resins, epoxy resins, polyester resins, polyurethane resins, and phenol resins, but not particularly limited thereto. Among the resins described above, acrylic resins, styrene acrylic resins, and styrene maleic acid resins are preferably used, from the viewpoint of the ease of availability of monomers, low cost, the ease of synthesis, the dispersibility of the ferroelectric particles, and the like.

Of the above described resins, acrylic resins, styrene acrylic resins, and styrene maleic acid resins can be produced by the following method. Specifically, such a resin can be produced by polymerization or copolymerization of compound(s) selected from the following compounds, using a radical polymerization initiator: carboxyl group-containing monomers such as acrylic acid, methacrylic acid, itaconic acid, crotonic acid, maleic acid, fumaric acid, vinyl acetate, and acid anhydrides thereof; hydroxyl group-containing monomers such as 2-hydroxyethyl acrylate; amino group-containing monomers such as dimethylaminoethyl methacrylate; mercapto group-containing monomers such as 2-(mercaptoacetoxy)ethyl acrylate; sulfo group-containing monomers such as acrylamide t-butylsulfonic acid; phosphate group-containing monomers such as 2-methacryloyloxyethyl acid phosphate; amide group-containing monomers such as methacrylamide; methacrylic acid esters; acrylic acid esters; styrene; acrylonitrile; and vinyl acetate.

Specific examples of the resin containing a carboxyl group include (meth)acrylic acid copolymers, (meth)acrylic acid-(meth)acrylic acid ester copolymers, styrene-(meth)acrylic acid copolymers, styrene-(meth)acrylic acid-(meth)acrylic acid ester copolymers, styrene-maleic acid copolymers, styrene-maleic acid-(meth)acrylic acid copolymers, and styrene-maleic acid-(meth)acrylic acid ester copolymers.

In addition, it is preferred that the hydrophilic group-containing resin further contain an ethylenically unsaturated group, in order to obtain active energy ray-curability. When the hydrophilic group-containing resin is curable by an active energy ray, it becomes possible to carry out patterning by photolithography. The ethylenically unsaturated groups in the hydrophilic group-containing resin preferably have an iodine value of 0.5 mol/kg or more and 3.0 mol/kg or less. An iodine value within the above described range is preferred, because it allows for increasing the sensitivity of the active energy ray-curable ferroelectric paste to an active energy ray, and for obtaining good storage stability. The iodine value of the ethylenically unsaturated groups can be determined in accordance with the method described in the section 6.0 on the test method, of JIS K 0070: 1992. When the hydrophilic group-containing resin contains an ethylenically unsaturated group, the irradiation of an active energy ray causes the formation of cross-linked structures between polymer chains, as a result which the bending resistance of the resulting ferroelectric memory element will be improved.

The above described resin containing a hydrophilic group and an ethylenically unsaturated group can be produced by the following method. Specifically, the resin containing a hydrophilic group and an ethylenically unsaturated group can be obtained by an addition reaction of an ethylenically unsaturated compound containing a glycidyl group or an isocyanate group, acrylic acid chloride, methacrylic acid chloride or allyl chloride, to a mercapto group, an amino group, a hydroxyl group, or a carboxyl group, which is an active hydrogen-containing group in the hydrophilic group-containing resin. Note, however, that the production method of the above described resin is not limited to such a method.

Specific examples of the ethylenically unsaturated compound containing a glycidyl group include glycidyl acrylate, glycidyl methacrylate, allyl glycidyl ether, glycidyl crotonate, and glycidyl isocrotonate. Specific examples of the ethylenically unsaturated compound containing an isocyanate group include acryloyl isocyanate, methacryloyl isocyanate, acryloylethyl isocyanate, and methacryloylethyl isocyanate.

The ferroelectric paste according to the present invention may contain a multifunctional (meth)acrylate, from the viewpoint of improving the active energy ray-curability. The multifunctional (meth)acrylate is not particularly limited, as long as it is a compound containing a (meth)acrylate group. The multifunctional (meth)acrylate preferably contains a hydroxyl group. A polar group such as the hydroxyl group is capable of improving the dispersibility of the ferroelectric particles.

Specific examples of the multifunctional (meth)acrylate include: bifunctional (meth)acrylates such as ethylene glycol di(meth)acrylate, diethylene glycol di(meth)acrylate, triethylene glycol di(meth)acrylate, polyethylene glycol di(meth)acrylate, tripropylene glycol di(meth)acrylate, 1,3-butylene glycol di(meth)acrylate, 1,6-hexanediol di(meth)acrylate, 1,9-nonanediol di(meth)acrylate, and neopentyl glycol di(meth)acrylate; trifunctional (meth)acrylates such as trimethylolpropane tri(meth)acrylate, glycerin tri(meth)acrylate, isocyanuric acid tri(meth)acrylate, ethylene oxide adducts thereof, and propylene oxide adducts thereof; tetrafunctional (meth)acrylates such as pentaerythritol tetra(meth)acrylate, ditrimethylolpropane tetra(meth)acrylate, diglycerin tetra(meth)acrylate, ethylene oxide adducts thereof, and propylene oxide adducts thereof; and pentafunctional or higher(meth)acrylates such as dipentaerythritol hexa(meth)acrylate, ethylene oxide adducts thereof, and propylene oxide adducts thereof. Preferred specific examples of the multifunctional (meth)acrylate containing a hydroxyl group include: poly(meth)acrylates of polyols such as trimethylolpropane, glycerin, pentaerythritol, diglycerin, ditrimethylolpropane, isocyanuric acid, and dipentaerythritol; and alkylene oxide adducts thereof.

More specific examples thereof include di(meth)acrylate of trimethylolpropane, di(meth)acrylate of glycerin, di- or tri-(meth)acrylate of pentaerythritol, di- or tri-(meth)acrylate of diglycerin, di- or tri-(meth)acrylate of ditrimethylolpropane, and di-, tri-, tetra- or penta-(meth)acrylate of dipentaerythritol; ethylene oxide adducts thereof; propylene oxide adducts thereof; and tetraethylene oxide adducts thereof.

It is preferred that the ferroelectric paste contains a photopolymerization initiator, and be curable by UV light. Further, the ferroelectric paste preferably contains a sensitizer, in addition to the photopolymerization initiator.

The photopolymerization initiator is preferably one which generates an active radical species. Specific examples thereof include benzophenone, methyl o-benzoylbenzoate, 4,4-bis(dimethylamino)benzophenone (another name: Michler's ketone), 4,4-bis(diethylamino)benzophenone, 4,4'-dichlorobenzophenone, 4-benzoyl-4-methyl diphenyl ketone, 1-hydroxycyclohexyl-phenyl ketone, 4-phenylbenzophenone, hydroxybenzophenone, dibenzyl ketone, fluorenone, 2,2-diethoxyacetophenone, 2,2-dimethoxy-2-phenyl-2-phenylacetophenone, 2-hydroxy-2-methyl-1-phenylpropan-1-one, 1-[4-(2-hydroxyethoxy)-phenyl]-2-hydroxy-2-methyl-1-propan-1-one, p-t-butyldichloroacetophenone, thioxanthone, 2-methylthioxanthone, 2-chlorothioxanthone, 2-isopropylthioxanthone, 2,4-diethylthioxanthone, 2,4-dichlorothioxanthone, benzyl dimethyl ketal, benzyl methoxyethyl acetal, benzoin, benzoin methyl ether, benzoin ethyl ether, benzoin isopropyl ether, benzoin butyl ether, anthraquinone, 2-t-butyl anthraquinone, 2-amylanthraquinone, β-chloroanthraquinone, anthrone, benzanthrone, dibenzosuberone, methyleneanthrone, 4-azidobenzalacetophenone, 2,6-bis(p-azidobenzylidene)cyclohexanone, 2,6-bis(p-azidobenzylidene)-4-methylcyclohexanone, 2-phenyl-1,2-butadione-2-(o-methoxycarbonyl)oxime, 1-phenyl-1,2-propanedione-2-(o-ethoxycarbonyl)oxime, 1,3-diphenylpropanetrione-2-(o-ethoxycarbonyl)oxime, 1-phenyl-3-ethoxy-propanetrione-2-(o-benzoyl)oxime, 2-methyl-[4-(methylthio)phenyl]-2-morpholino-1-propan-1-one, 2-benzyl-2-dimethylamino-1-(4-morpholinophenyl)-butanone, naphthalenesulfonyl chloride, quinolinesulfonyl chloride, N-phenylthioacridone, 4,4-azobisisobutyronitrile, diphenyl disulfide, benzthiazole disulfide, triphenylphosphine, 2,4,6-trimethylbenzoyl-diphenyl-phosphine oxide, and bis(2,4,6-trimethylbenzoyl)-phenyl-phosphine oxide. Examples of the sensitizer include 2-methylthioxanthone, 2-chlorothioxanthone, 2-isopropylthioxanthone, 2,4-diethylthioxanthone, 2,4-dichlorothioxanthone, 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, 4,4-bis(dimethylamino)benzophenone (another name: Michler's ketone), 4,4-bis(diethylamino)-benzophenone, 4,4-bis(dimethylamino)chalcone, 4,4-bis(diethylamino)chalcone, p-dimethylaminocinnamylideneindanone, p-dimethylaminobenzylideneindanone, 2-(p-dimethylaminophenylvinylene)-isonaphthothiazole, 1,3-bis(4-dimethylaminobenzal)acetone, 1,3-carbonyl-bis(4-diethylaminobenzal)acetone, 3,3-carbonyl-bis(7-diethylaminocumarin), N-phenyl-N-ethylethanolamine, N-phenylethanolamine, N-tolyldiethanolamine, dimethylaminobenzoate methyl, dimethylaminobenzoate ethyl, dimethylaminobenzoate isoamyl, diethylaminobenzoate methyl, diethylaminobenzoate ethyl, diethylaminobenzoate isoamyl, 3-phenyl-5-benzoyl-thiotetrazole, and 1-phenyl-5-ethoxycarbonylthiotetrazole. One or more of these photopolymerization initiators, and one or more of these sensitizers can be used.

To improve the dispersibility of the ferroelectric particles in the ferroelectric paste, it is possible to carry out a surface treatment of the ferroelectric particles, the addition of a dispersant, the addition of a surfactant, the addition of a solvent, and/or the like. The surface treatment of the ferroelectric particles may be, for example, a treatment with any of various types of coupling agents such as silane-based, titanium-based, and aluminum-based coupling agents; a treatment with a fatty acid, a phosphoric acid ester or the like; a rosin treatment; an acidic treatment; or a basic treatment.

The dispersant may be, for example, a nonionic, cationic, or anionic polymeric dispersant, or a compound having a 5-membered heterocyclic structure containing a carbon atom and a nitrogen atom.

Examples of commercially available products of the polymeric dispersant include: "MALIALIM AKM-0531", "MALIALIM AWS-0851", "MALIALIM AAB-0851", and "MALIALIM AFB-1521", manufactured by NOF Corporation; Efca 4310", "Efca 4320", "Efca 4046", and "Efca 4047" manufactured by BASF Japan Ltd.; "ANTARON V-216" and "ANTARON V-220", manufactured by ISP Japan Ltd.; "Solsperse 26000", "Solsperse 28000", "Solsperse 32000", "Solsperse 33000", "Solsperse 36000", "Solsperse 39000", and "Solsperse 76500", manufactured by The Lubrizol Corporation; "AJISPER PB-711", "AJISPER PB-821", "AJISPER PB-822", "AJISPER PB-814", and "AJISPER PB-824", manufactured by Ajinomoto Fine Techno Co., Ltd.; "PVP K-15", "PVP K-30", "PVP K-60", and "PVP K-90", manufactured by ISP Japan Ltd.; and "DISPERBYK-161", "DISPERBYK-162", and "DISPERBYK-167", manufactured by BYK Japan KK.

Specific examples of the compound having a 5-membered heterocyclic structure containing a carbon atom and a nitrogen atom include imidazole, pyrazole, oxazole, thiazole, imidazoline, 1,2,3-triazole, 1,2,4-triazole, tetrazole, benzimidazole, benzoxazole, benzothiazole, purine and the like; and substitution products thereof; as well as polymers having any of these structures in the main chain skeleton or a side chain; but not limited thereto. One kind alone, or two or more kinds of these polymers may be contained. Examples of the polymer include polyvinylimidazole, polybenzimidazole, polybenzoxazole, and polybenzothiazole.

The amount of the dispersant to be added is not particularly limited, as long as the ferroelectric particles can be dispersed. However, from the viewpoint of the dispersibility, the amount of the dispersant added is preferably 1 part by weight or more with respect to 100 parts by weight of the total amount of the ferroelectric particles and the dispersant. Further, from the viewpoint of reducing the driving voltage of the resulting ferroelectric memory element, the amount added is preferably 50 parts by weight or less. In addition to the above, a wetting agent such as nonionic, cationic or anionic surfactant, or a polyvalent carboxylic acid; an amphoteric substance; a resin containing a substituent having a high steric hindrance; and/or the like may be added to the ferroelectric paste. Further, the ferroelectric paste may contain a stabilizer, an anti-settling agent, a plasticizer, an antioxidant, and/or the like, as necessary.

[Method of Producing Ferroelectric Layer]

The method of producing a ferroelectric layer is not particularly limited. However, preferred is a method in which a coating film obtained by coating and drying the above described ferroelectric paste is subjected a heat treatment, as necessary.

Examples of the coating method include known coating methods such as a spin coating method, a blade coating method, a slit die coating method, a screen printing method, a bar coater method, a mold method, a gravure printing method, a flexographic printing method, an offset printing method, a dip and pull method, an ink jet method, and a dispenser method. Among these, a screen printing method, a gravure printing method, a flexographic printing method, an offset printing method, an ink jet method, or a dispenser method is preferred, from the viewpoint of patternability and film forming properties.

The removal of the solvent from the coating film can be carried out, for example, by a method such as heat drying using an oven, a hot plate, an infrared radiation etc. or vacuum drying, preferably at a temperature of from 50° C. to 140° C., for a period of time of from one minute to several hours.

Subsequently, the coating film is cured in order to improve the ferroelectric properties. The curing temperature is not particularly limited, and an appropriate temperature can be selected depending on the type of the ferroelectric compound and the type of the solvent and the substrate to be used. In cases where the organic component contained in the ferroelectric paste is an acrylic resin, for example, the curing temperature is preferably within the range of 50 to 300° C., from the viewpoint of heat resistance. Further, in cases where the insulating substrate is made of polyethylene terephthalate, the curing temperature is preferably within the range of from 50 to 150° C., from the viewpoint of preventing a decrease in the processing accuracy due to the thermal expansion of the substrate. The coating film can be cured, for example, by a method such as: heat curing using an oven, an inert oven, a hot plate, an infrared radiation, or the like; vacuum curing; curing by a xenon flash lamp; or photocuring by UV light.

To improve the flatness of the ferroelectric layer, a planarization layer may be provided on the coating film obtained by coating and drying the ferroelectric paste. The material for forming the planarization layer is not particularly limited, and it is possible to use a known resin such as a polyimide resin, a polysiloxane resin, an acrylic resin, or an epoxy resin. The film thickness of the planarization layer is not particularly limited, but the planarization layer preferably has a thickness lower than that of the ferroelectric layer, from the viewpoint of the ferroelectric properties.

The ferroelectric layer may or may not be patterned, but it is preferably patterned, in order to prevent misreading by reducing the crosstalk between ferroelectric elements. The method of patterning the ferroelectric layer is not particularly limited. However, from the viewpoint of microfabrication, the ferroelectric layer is preferably patterned by the above described photolithography processing, wherein the organic component contain a photosensitive organic component, and the above described step (2) includes the following steps (4) to (6). The use of photolithography processing allows for a higher integration of the ferroelectric element as compared to the patterning using other printing methods.

(4) A step of forming a coating film by coating a composition containing the ferroelectric particles, the photosensitive organic component, and the solvent on the conductive film, followed by drying.

(5) A step of patterning the coating film by photolithography into a pattern corresponding to the ferroelectric layer of the ferroelectric memory element.

(6) A step of curing the patterned coating film to form the ferroelectric layer of the ferroelectric memory element.

As a light source to be used for exposure, the i-ray (365 nm), h-ray (405 nm), or g-ray (436 nm) of a mercury lamp is preferably used.

After the exposure, a developer is used to remove unexposed portions of the coating film, to obtain a desired pattern. The developer to be used in the case of carrying out an alkaline development is preferably an aqueous solution of a compound such as: tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, or hexamethylenediamine.

Further, depending on the case, it is possible to use as the developer, one obtained by adding to the aqueous solution as described above, one or a plurality of kinds of: polar solvents such as N-methyl-2-pyrrolidone, N,N-dimethylformamide, N,N-dimethylacetamide, dimethylsulfoxide, and γ-butyrolactone; alcohols such as methanol, ethanol, and isopropanol; esters such as ethyl lactate and propylene glycol monomethyl ether acetate; ketones such as cyclopentanone, cyclohexanone, isobutyl ketone, and methyl isobutyl ketone; and the like. It is also possible to use one obtained by adding a surfactant to the alkaline aqueous solution as described above, as the developer. As the developer to be used in the case of carrying out an organic development, it is possible to use a polar solvent such as N-methyl-2-pyrrolidone, N-acetyl-2-pyrrolidone, N,N-dimethylacetamide, N,N-dimethylformamide, dimethylsulfoxide, or hexamethylphosphortriamide, singly; or a mixed solution obtained by mixing any of the polar solvents described above with methanol, ethanol, isopropyl alcohol, xylene, water, methyl carbitol, ethyl carbitol etc.

The development can be carried out, for example, by: a method of spraying the above described developer on the surface of the coating film while allowing the substrate to stand still or to rotate; a method of dipping the substrate in the developer; or a method of applying ultrasonic waves while dipping the substrate in the developer.

After the development, the developed substrate may be subjected to a rinsing treatment with water. At this time, too, an alcohol such as ethanol or isopropyl alcohol, an ester such as ethyl lactate or propylene glycol monomethyl ether acetate, or the like may be added to water, to carry out the rinsing treatment.

(3. Step of Forming Conductive Film of Ferroelectric Memory Element on Ferroelectric Layer)

On the upper portion of the ferroelectric layer, a conductive film is formed, as the upper electrode of the ferroelectric memory element. The conductive film can be formed in the same manner as the above described step (1), by a method such as resistive heating vapor deposition, electron beaming, sputtering, plating, CVD, ion plating coating, or photolithography processing using the photosensitive conductive paste. Among these, the photolithography processing using the photosensitive conductive paste is preferred, from the viewpoint of microfabrication properties, processing position control, production cost, and the like.

(Memory Cell)

Figure 5:
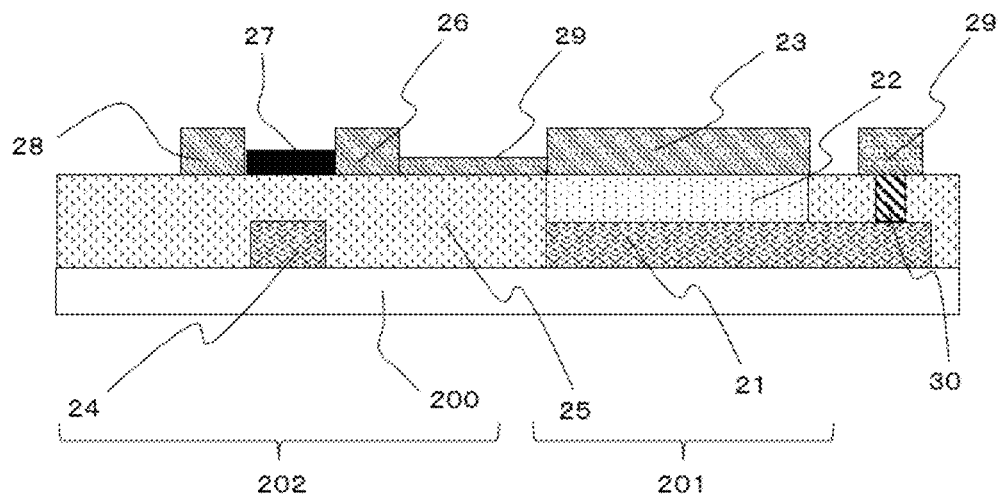
FIG. 5 is a schematic sectional view showing an example of an embodiment of the ferroelectric memory element according to the present invention.
Figure 6:
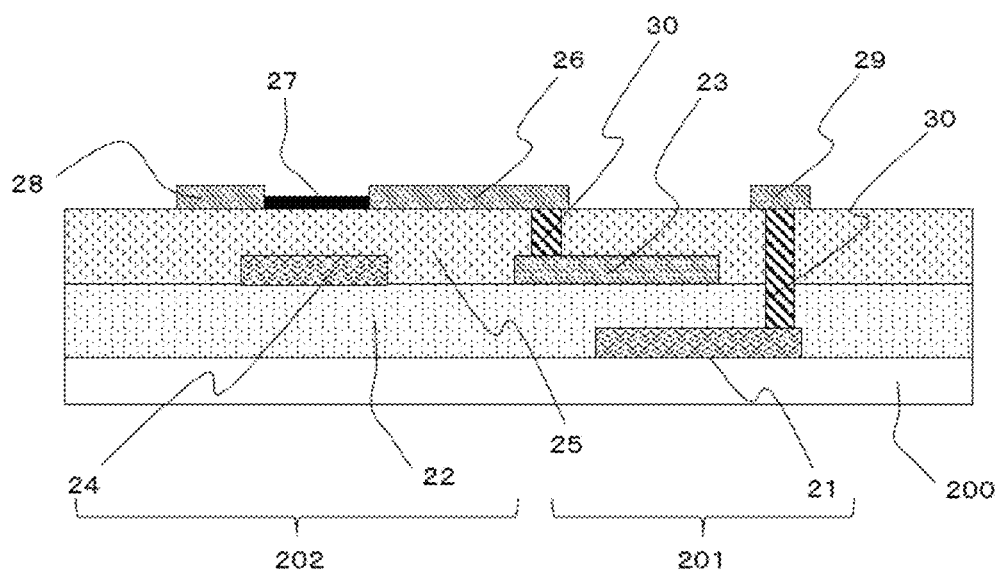
FIG. 6 is a schematic sectional view showing an example of an embodiment of the ferroelectric memory element according to the present invention.

FIGS. 5 and 6 each shows an example of a memory cell (so-called 1T1C type) including: a capacitor-type ferroelectric element 201; and a thin film transistor 202 which controls the reading and writing of the ferroelectric memory element. The thin film transistor switches ON and OFF the current to write information into, and to retrieve information from, the capacitor-type ferroelectric memory element. The capacitor-type ferroelectric element according to the present invention can be used in a 2 transistor-2 capacitor (so-called 2T2C type) memory cell in which two 1T1C type memory cells are combined. Note, however, that the structure of the 1T1C type memory cell is not limited to those described above.

In each of the structures shown in FIGS. 5 and 6, the memory cell includes, on an insulating substrate 200, the ferroelectric capacitor 201 including: a first conductive film 21 (lower electrode), a second conductive film 23 (upper electrode) and a ferroelectric layer 22; the thin film transistor including a gate electrode 24, a gate insulating layer 25, a source electrode 26, a drain electrode 28 and a semiconductor layer 27; a wiring 29; and a via 30. Although FIGS. 5 and 6 each illustrates a structure in which the source electrode 26 and the upper electrode 23 are electrically connected, the source electrode 26 and the lower electrode 21 may be electrically connected, instead. Further, although FIGS. 5 and 6 each shows a thin film transistor having a bottom-gate structure, a thin film transistor having a top-gate structure may also be used.

Figure 7:
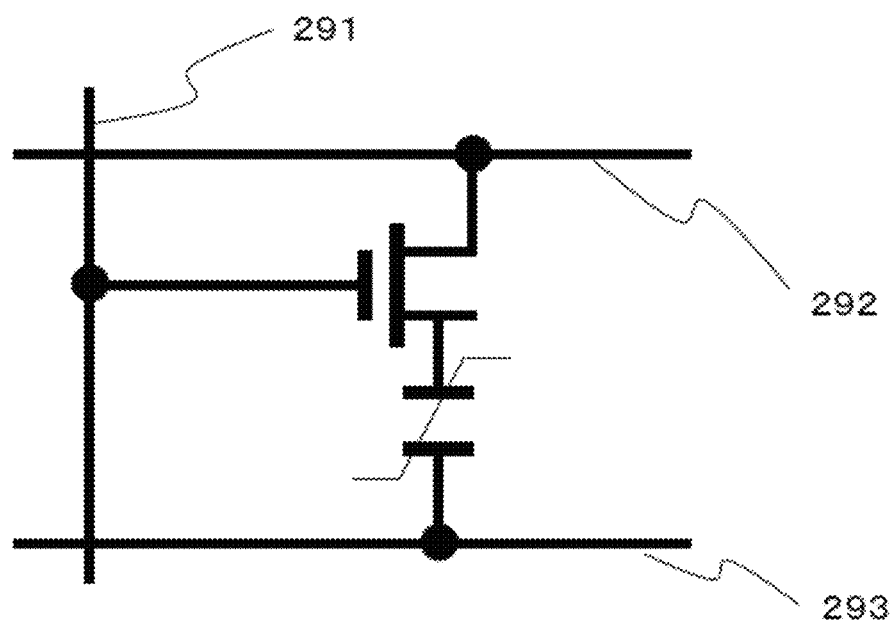
FIG. 7 is a schematic diagram showing a basic circuit configuration of a memory cell including the ferroelectric memory element according to the present invention.

FIG. 7 shows an example of a circuit diagram of the 1T1C type memory cell. The gate electrode 24 and the drain electrode 28 of the thin film transistor 202 are electrically connected to a word line 291 and a bit line 292, respectively. One of the lower electrode 21 and the upper electrode 23 of the capacitor-type ferroelectric memory element 201 which is not electrically connected to the source electrode 26 of the thin film transistor, is electrically connected to a plate line 293. When performing a writing operation, a voltage is applied to the word line to turn on the thin film transistor, thereby applying a voltage between the bit line and the plate line. When performing a reading operation, after precharging the bit line to 0 V, a voltage is applied to the word line to turn on the thin film transistor, and subsequently, a predetermined voltage is applied to the plate line. A sense amplifier is connected to the bit line, and by detecting changes in voltage in the bit line due to the application of a voltage to the plate line, it becomes possible to discriminate information of "1" and "0" written in the memory cell.

In the structure shown in FIG. 5, the gate insulating layer functions as a partitioning member of the ferroelectric capacitor element. Therefore, when memory cells are highly integrated as in the case of a memory cell array to be described later, the crosstalk between adjacent memory cells can be reduced, thereby enabling to prevent misreading. Further, the number of layers in the structures shown in FIGS. 5 and 6 are three and four, respectively. In cases where each of these layers is formed by coating, a structure with a smaller number of layers is preferred, from the viewpoint of the processing accuracy and the processing cost. Preferred is a structure in which the thin film transistor and the capacitor-type ferroelectric element are arranged side by side, as the structure shown in FIG. 5.

(Gate Electrode, Source Electrode, Drain Electrode, Wiring, and Via)

As the materials to be used for these components, the same materials as those used for forming the conductive films can be used.

(Gate Insulating Layer)

The material to be used for the gate insulating layer is not particularly limited, and examples thereof include: inorganic materials such as silicon oxide and alumina; organic polymer materials such as polyimides, polyvinyl alcohol, polyvinyl chloride, polyethylene terephthalate, polyvinylidene fluoride, polysiloxanes, and polyvinyl phenol; and mixtures of inorganic material powders and organic materials. Among these, the gate insulating layer preferably contains an organic compound containing a bond between a silicon atom and a carbon atom. In addition to the above, the gate insulating layer more preferably contains a metal compound containing a bond between a metal atom and an oxygen atom.

The organic compound containing a bond between a silicon atom and a carbon atom may be, for example, a polysiloxane, or the like. In particular, examples thereof include a silane compound represented by General Formula (5), an epoxy group-containing silane compound represented by General Formula (6), a condensation product thereof, and a polysiloxane containing any of these as a copolymerization component. Among these, the polysiloxane is more preferred, since it has high insulation properties and is capable of being cured at a low temperature.

$$R^5{}_m Si(OR^6)_{4-m} \qquad (5)$$

In General Formula (5), $R^5$ represents a hydrogen atom, an alkyl group, a heterocyclic group, an aryl group or an alkenyl group; and in cases where a plurality of $R^5$s are present, the respective $R^5$s may be the same as or different from each other. $R^6$ represents a hydrogen atom, an alkyl group, an acyl group or an aryl group; and in cases where a plurality of $R^6$s are present, the respective $R^6$s may be the same as or different from each other. m represents an integer of from 1 to 3.

$$R^7{}_n R^8{}_l Si(OR^9)_{4-n-l} \qquad (6)$$

In General Formula (6), $R^7$ represents an alkyl group containing one or more epoxy groups as a part of the chain; and in cases where a plurality of $R^7$s are present, the respective $R^7$s may be the same as or different from each other. $R^8$ represents a hydrogen atom, an alkyl group, a heterocyclic group, an aryl group or an alkenyl group; and in cases where a plurality of $R^8$s are present, the respective $R^8$s may be the same as or different from each other. $R^9$ represents a hydrogen atom, an alkyl group, an acyl group or an aryl group; and in cases where a plurality of $R^9$s are present, the respective $R^9$s may be the same as or different from each other. l represents an integer of from 0 to 2, and n represents 1 or 2, with the proviso that l+n≤3.

The alkyl group in each of $R^5$ to $R^9$ represents, for example, a saturated aliphatic hydrocarbon group, such as a methyl group, an ethyl group, an n-propyl group, an isopropyl group, an n-butyl group, a sec-butyl group, a tert-butyl group, a cyclopropyl group, a cyclohexyl group, a norbornyl group, or an adamantyl group, which may or may not contain a substituent. In cases where the alkyl group contains a substituent, the additional substituent is not particularly limited. Examples thereof include an alkoxy group and an aryl group, which may further contain a substituent. The number of carbon atoms in the alkyl group is not particularly limited, but it is preferably one or more and 20 or less, and more preferably one or more and 8 or less, from the viewpoint of ease of availability and cost.

The acyl group in each of $R^5$ to $R^9$ represents an acetyl group, a hexanoyl group, a benzoyl group or the like, which is a functional group in which one end of the carbonyl bond is substituted by an aliphatic hydrocarbon group or an aromatic group. The aliphatic hydrocarbon group or the aromatic group may or may not contain a substituent. The number of carbon atoms in the acyl group is not particularly limited, but it is preferably within the range of from 2 to 40.

The aryl group in each of $R^5$ to $R^9$ represents, for example, an aromatic hydrocarbon group such as a phenyl group, a naphthyl group, a biphenyl group, an anthracenyl group, a phenanthryl group, a terphenyl group, or a pyrenyl group; or an aromatic heterocyclic group such as a furanyl group, a thiophenyl group, a benzofuranyl group, a dibenzofuranyl group, a pyridyl group, or a quinolinyl group; which may or may not contain a substituent. The number of carbon atoms in the aryl group is not particularly limited, but it is preferably within the range of from 3 to 40.

The alkoxy group described above as a substituent represents, for example, a methoxy group, an ethoxy group, a propoxy group or the like, which is a functional group in which one end of the ether bond is substituted by an aliphatic hydrocarbon group. The aliphatic hydrocarbon group may or may not contain a substituent. The number of carbon atoms in the alkoxy group is not particularly limited, but it is preferably within the range of from one to 20.

The heterocyclic group in each of $R^5$ and $R^8$ represents a group derived from an aliphatic ring which contains an atom other than a carbon atom within the ring, such as a pyran ring, a piperidine ring, or an amide ring, which group may or may not contain a substituent. The number of carbon atoms in the heterocyclic group is not particularly limited, but it is preferably within the range of from two to 20.

The alkenyl group in each of $R^5$ and $R^8$ represents, for example, a vinyl group, an allyl group, a butadienyl group or the like, which is an unsaturated aliphatic hydrocarbon group containing a double bond, and which group may or may not contain a substituent. The number of carbon atoms in the alkenyl group is not particularly limited, but it is preferably within the range of from two to 20.

The alkyl group having an epoxy group(s) as a part of the chain, in $R^7$, represents an alkyl group having a 3-membered ring ether structure formed by two adjacent carbon atoms being linked by one oxygen atom, as a part of the chain. This includes both the case where two adjacent carbon atoms contained in the main chain, which is the portion where carbon atoms extend continuously for the longest length, of the alkyl group are used; and the case where two adjacent carbon atoms contained in a portion other than the main chain, a so-called side chain, of the alkyl group are used.

By incorporating the silane compound represented by General Formula (5) as a copolymerization component of a polysiloxane, it is possible to improve the insulation properties and chemical resistance of the resulting film while maintaining a high transparency in the visible light region, and to form an insulating film with fewer traps.

Further, it is preferred that at least one of the $R^5$s in General Formula (5), which are present in a number of m, be an aryl group, because it allows for improving the flexibility of the resulting insulating film, and to prevent the occurrence of cracks.

Specific examples of the silane compound represented by General Formula (5) include vinyltrimethoxysilane, vinyltriethoxysilane, 3-methacryloxypropyltrimethoxysilane, 3-methacryloxypropyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, phenyltriethoxysilane, p-tolyltrimethoxysilane, benzyltrimethoxysilane, α-naphthyltrimethoxysilane, β-naphthyltrimethoxysilane, 3-aminopropyltriethoxysilane, N-(2-aminoethyl)-3-aminopropyltrimethoxysilane, 3-chloropropyltrimethoxysilane, dimethyldimethoxysilane, dimethyldiethoxysilane, diphenyldimethoxysilane, diphenyldiethoxysilane, methylphenyldimethoxysilane, methylvinyldimethoxysilane, methylvinyldiethoxysilane, 3-aminopropylmethyldimethoxysilane, N-(2-aminoethyl)-3-aminopropylmethyldimethoxysilane, 3-chloropropylmethyldimethoxysilane, 3-chloropropylmethyldiethoxysilane, cyclohexylmethyldimethoxysilane, 3-methacryloxypropyldimethoxysilane, octadecylmethyldimethoxysilane, trimethoxysilane, trifluoroethyltrimethoxysilane, trifluoroethyltriethoxysilane, trifluoroethyltriisopropoxysilane, trifluoropropyltrimethoxysilane, trifluoropropyltriethoxysilane, trifluoropropyltriisopropoxysilane, heptadecafluorodecyltrimethoxysilane, heptadecafluorodecyltriethoxysilane, heptadecafluorodecyltriisopropoxysilane, tridecafluorooctyltriethoxysilane, tridecafluorooctyltrimethoxysilane, tridecafluorooctyltriisopropoxysilane, trifluoroethylmethyldimethoxysilane, trifluoroethylmethyldiethoxysilane, trifluoroethylmethyldiisopropoxysilane, trifluoropropylmethyldimethoxysilane, trifluoropropylmethyldiethoxysilane, trifluoropropylmethyldiisopropoxysilane, heptadecafluorodecylmethyldimethoxysilane, heptadecafluorodecylmethyldiethoxysilane, heptadecafluorodecylmethyldiisopropoxysilane, tridecafluorooctylmethyldimethoxysilane, tridecafluorooctylmethyldiethoxysilane, tridecafluorooctylmethyldiisopropoxysilane, trifluoroethylethyldimethoxysilane, trifluoroethylethyldiethoxysilane, trifluoroethylethyldiisopropoxysilane, trifluoropropylethyldimethoxysilane, trifluoropropylethyldiethoxysilane, trifluoropropylethyldiisopropoxysilane, heptadecafluorodecylethyldimethoxysilane, heptadecafluorodecylethyldiethoxysilane, heptadecafluorodecylethyldiisopropoxysilane, tridecafluorooctylethyldiethoxysilane, tridecafluorooctylethyldimethoxysilane, tridecafluorooctylethyldiisopropoxysilane, and p-trifluorophenyltriethoxysilane; but not limited thereto.

To increase the crosslinking density and to improve the chemical resistance and insulation properties of the gate insulating layer, it is preferable to use, among the above mentioned silane compounds, vinyltrimethoxysilane, vinyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, p-tolyltrimethoxysilane, benzyltrimethoxysilane, naphthyltrimethoxysilane, β-naphthyltrimethoxysilane, trifluoroethyltrimethoxysilane, trimethoxysilane, or p-trifluorophenyltriethoxysilane, which is a compound wherein m=1. Further, from the viewpoint of mass production, it is particularly preferable to use: vinyltrimethoxysilane, methyltrimethoxysilane, ethyltrimethoxysilane, propyltrimethoxysilane, hexyltrimethoxysilane, octadecyltrimethoxysilane, octadecyltrimethoxysilane, phenyltrimethoxysilane, p-tolyltrimethoxysilane, benzyltrimethoxysilane, α-naphthyltrimethoxysilane, β-naphthyltrimethoxysilane, trifluoroethyltrimethoxysilane, or trimethoxysilane, which is a compound wherein $R^4$ is a methyl group.

In addition, it is preferred that two or more kinds of the silane compounds represented by General Formula (5) are used in combination. In particular, the use of a silane compound containing an alkyl group and a silane compound containing an aryl group in combination is particularly preferred, because it allows for providing a high insulation properties and flexibility for preventing the occurrence of cracks in a balanced manner.

Specific examples of the epoxy group-containing silane compound represented by General Formula (6) include γ-glycidoxypropyltrimethoxysilane, β-(3,4-epoxycyclohexyl)ethyltrimethoxysilane, γ-glycidoxypropyltriethoxysilane, β-(3,4-epoxycyclohexy)ethyltriethoxysilane, γ-glycidoxypropyltriisopropoxysilane, β-(3,4-epoxycyclohexy)ethyltriisopropoxysilane, γ-glycidoxypropylmethyldimethoxysilane, β-(3,4-epoxycyclohexyl)ethylmethyldimethoxysilane, γ-glycidoxypropylmethyldiethoxysilane, β-(3,4-epoxycyclohexyl)ethylmethyldiethoxysilane, γ-glycidoxypropylmethyldiisopropoxysilane, β-(3,4-epoxycyclohexyl)ethylmethyldiisopropoxysilane, γ-glycidoxypropylmethyldimethoxysilane, β-(3,4-epoxycyclohexyDethylethyldimethoxysilane, γ-glycidoxypropylethyldiethoxysilane, β-(3,4-epoxycyclohexyl)ethylethyldiethoxysilane, γ-glycidoxypropylethyldiisopropoxysilane, β-(3,4-epoxycyclohexyDethylethyldiisopropoxysilane, β-(3,4-epoxycyclohexyl)propyltrimethoxysilane, and γ-glycidoxyethyltrimethoxysilane, but not limited thereto. These silane compounds may be used alone, or in combination of two or more kinds.

To increase the crosslinking density and to improve the chemical resistance and insulation properties of the gate insulating layer, it is preferable to use, among the above mentioned silane compounds: γ-glycidoxypropyltrimethoxysilane, β-(3,4-epoxycyclohexyl)ethyltrimethoxysilane, γ-glycidoxypropyltriethoxysilane, β-(3,4-epoxycyclohexyl)ethyltriethoxysilane, γ-glycidoxypropyltriisopropoxysilane, β-(3,4-epoxycyclohexyl)ethyltriisopropoxysilane, β-(3,4-epoxycyclohexyl)propyltrimethoxysilane, or γ-glycidoxyethyltrimethoxysilane, which is a compound represented by General Formula (6), wherein n=1, and l=0. Further, from the viewpoint of mass production, it is particularly preferable to use: γ-glycidoxypropyltrimethoxysilane, β-(3,4-epoxycyclohexy)ethyltrimethoxysilane, β-(3,4-epoxycyclohexyl)propyltrimethoxysilane, or γ-glycidoxyethyltrimethoxysilane, which is a compound represented by General Formula (6), wherein $R^9$ is a methyl group.

The metal compound containing a bond between a metal atom and an oxygen atom is not particularly limited, and examples thereof include a metal oxide containing a bond between a metal atom and an oxygen atom, and a metal hydroxide containing a bond between a metal atom and an oxygen atom. The metal atom to be contained in the metal compound is not particularly limited as long as it forms a metal chelate, and may be, for example, an atom of magnesium, aluminum, titanium, chromium, manganese, cobalt, nickel, copper, zinc, gallium, zirconium, ruthenium, palladium, indium, hafnium, or platinum. Among these, aluminum is preferred, from the viewpoint of ease of availability, cost, and the stability of the resulting metal chelate.

In the gate insulating layer, the metal atom is preferably contained in an amount of from 10 to 180 parts by weight, with respect to 100 parts by weight of the total amount of carbon atoms and silicon atoms. When the amount of the metal atom is within the above described range, the insulation properties can be improved.

The weight ratio of the amount of the metal atom with respect to 100 parts by weight of the total amount of carbon atoms and silicon atoms in the insulating layer can be determined by X-ray photoelectron spectroscopy (XPS).

The insulating layer preferably has a film thickness of from 0.05 to 5 μm, and more preferably from 0.1 to 1 μm. A film thickness within the above range facilitates the formation of a uniform thin film. The film thickness can be measured using an atomic force microscope or by ellipsometry.

(Semiconductor Layer)

The material for forming the semiconductor layer is not particularly limited, as long as it has semiconductor properties, and it is possible to use: an inorganic semiconductor such as a silicon semiconductor or an oxide semiconductor; an organic semiconductor such as pentacene or a polythiophene derivative; or a carbon semiconductor such as carbon nanotube (CNT) or graphene. Among these, CNT is preferred, because: it can be formed by coating; it can be formed at a low temperature of 200° C. or lower; it has a low OFF current, and the like, for example. To obtain high semiconductor properties, in particular, preferred is a CNT composite composed of CNT and a conjugated polymer attached to at least a part of the surface of the CNT. Having a low OFF current allows for reducing the impact brought by the TFT in the OFF state, on the polarization state of the ferroelectric layer. The value of the OFF current is preferably 100 pA or less. Further, by allowing a conjugated polymer to be attached on at least a part of the surface of CNT, it becomes possible to uniformly disperse the CNT in a solution, without compromising the high electrical properties of the CNT. In addition, by using the solution in which the CNT is uniformly dispersed, a film in which the CNT is uniformly dispersed can be formed by a coating method such as an ink jet method.

The state where a conjugated polymer is attached to at least a part of the surface of CNT, refers to a state in which a part of or the entire surface of the CNT is covered by the conjugated polymer. It is assumed that the conjugated polymer is able to cover the CNT, because it-electron clouds derived from the conjugated structures of the CNT and the polymer overlap with one another, to generate an interaction therebetween. Whether the CNT is covered by a conjugated polymer or not can be determined by its reflected color, since the reflected color of the CNT covered by a conjugated polymer becomes closer to that of the polymer, as compared to the reflected color of an uncovered CNT. The state of coverage of the CNT can be determined quantitatively, by identifying the presence of an attached substance, and the weight ratio of the attached substance with respect to the CNT, through an elemental analysis such as XPS.

Examples of the method of allowing a conjugated polymer to be attached to the surface of CNT include: (I) a method in which CNT is added to a melted conjugated polymer, followed by mixing; (II) a method in which a conjugated polymer is dissolved in a solvent, and CNT is added to the resulting solution, followed by mixing; (III) a method in which CNT is pre-dispersed in a solvent by ultrasonic waves or the like, and a conjugated polymer is added to the resulting dispersion, followed mixing: and (IV) a method in which a conjugated polymer and CNT are added to a solvent, and the resulting mixed solution is irradiated by ultrasonic waves and mixed. In the present invention, any of these methods may be used alone, or a plurality of these methods may be used in combination.

Examples of the conjugated polymer include polythiophene-based polymers, polypyrrole-based polymers, polyaniline-based polymers, polyacetylene-based polymers, poly-p-phenylene-based polymers, and poly-p-phenylene vinylene-based polymers, but not particularly limited thereto. As the above described polymer, a polymer composed of one type of monomer units is preferably used. However, a polymer obtained by block copolymerization or random copolymerization of different types of monomer units is also used. It is also possible to use a polymer obtained by graft polymerization.

(Method of Producing Memory Cell)

Figure 8A:
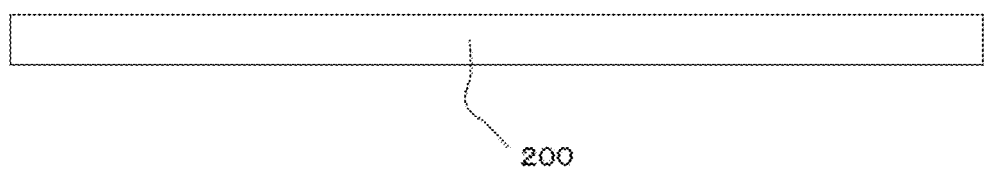
FIG. 8A is a schematic sectional view showing an example of a production process of the ferroelectric memory element according to the present invention.
Figure 8B:
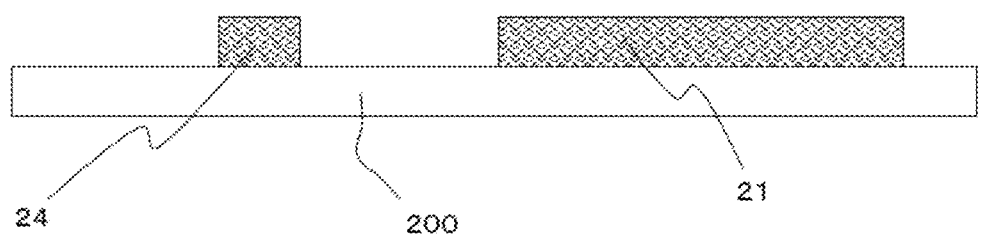
FIG. 8B is a schematic sectional view showing an example of the production process of the ferroelectric memory element according to the present invention.
Figure 8C:
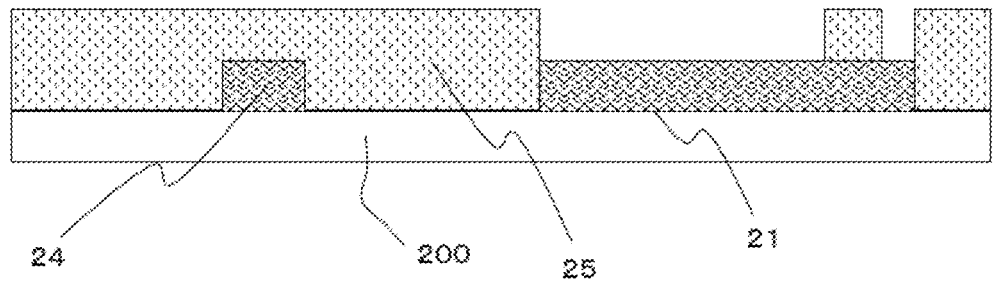
FIG. 8C is a schematic sectional view showing an example of the production process of the ferroelectric memory element according to the present invention.

FIGS. 8A to 8G show the production process of the memory cell shown in FIG. 5. On the insulating substrate 200 (FIG. 8A), the lower electrode 21 of the capacitor and the gate electrode 24 of the thin film transistor are formed (FIG. 8B). Subsequently, the insulating layer is formed at a portion excluding the region where the ferroelectric layer and the via are to be formed (FIG. 8C). A part of the insulating layer constitutes the gate insulating layer 25.

Figure 8D:
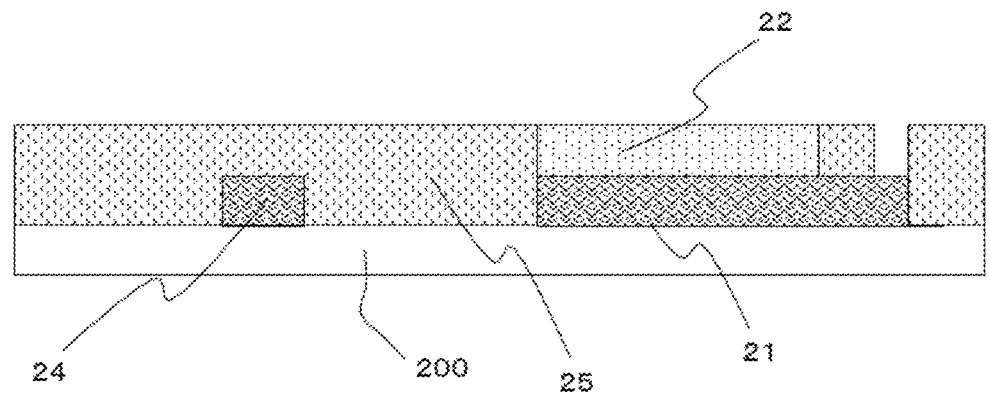
FIG. 8D is a schematic sectional view showing an example of the production process of the ferroelectric memory element according to the present invention.
Figure 8E:
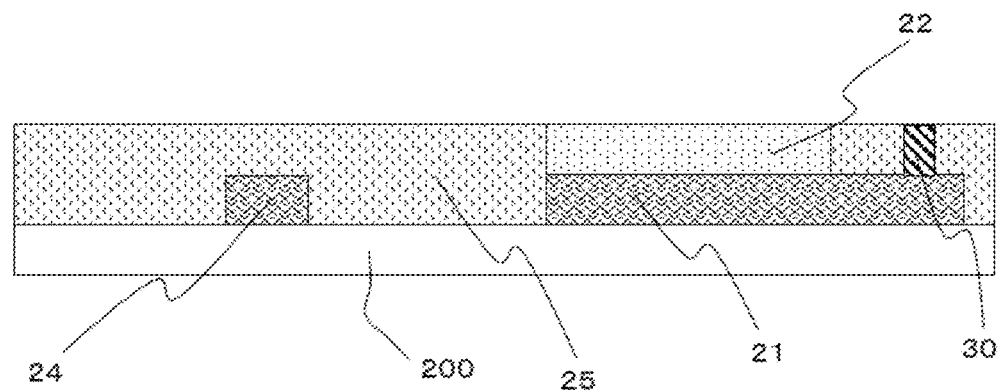
FIG. 8E is a schematic sectional view showing an example of the production process of the ferroelectric memory element according to the present invention.
Figure 8F:
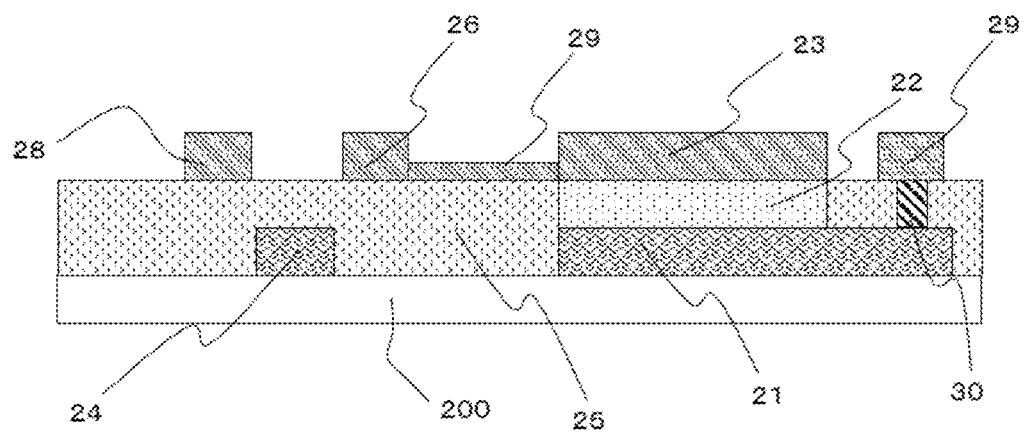
FIG. 8F is a schematic sectional view showing an example of the production process of the ferroelectric memory element according to the present invention.
Figure 8G:
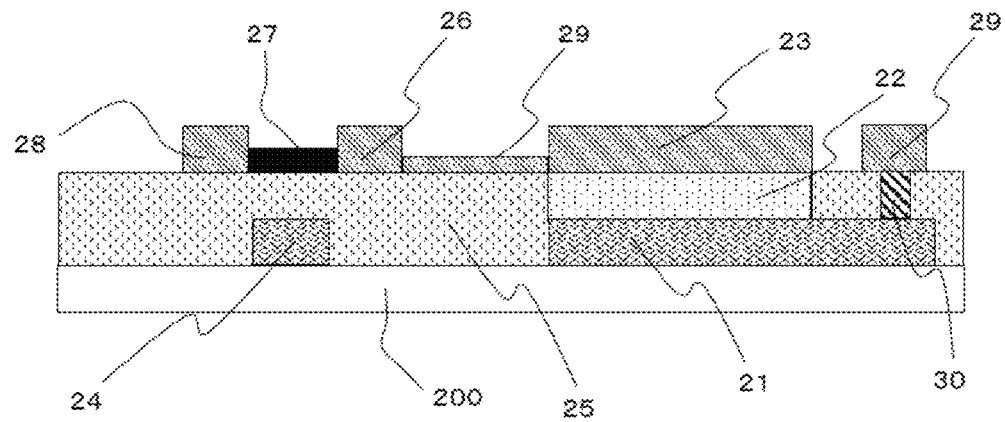
FIG. 8G is a schematic sectional view showing an example of the production process of the ferroelectric memory element according to the present invention.

Subsequently, the ferroelectric layer 22 is formed on the lower electrode 21, (FIG. 8D). Thereafter, the via 30 is formed (FIG. 8E). Further, the upper electrode 23 of the capacitor, as well as the source electrode 26, the drain electrode 28, and the wiring 29 of the thin film transistor are formed (FIG. 8F). The semiconductor layer 27 is then formed between the drain electrode and the source electrode (FIG. 8G).

The semiconductor layer can be formed by a dry method such as resistive heating vapor deposition, electron beaming, sputtering, or CVD, but it is preferable to use a coating method, from the viewpoint of production cost and adaptability to a large area. Specific examples of preferred coating methods include a spin coating method, a blade coating method, a slit die coating method, a screen printing method, a bar coater method, a mold method, a printing transfer method, a dip and pull method, an ink jet method, and a dispenser method. Among these, an ink jet method is preferred, from the viewpoint of patternability and effective use of raw materials.

The gate insulating layer 25 is the gate insulating film of the thin film transistor. At the same time, the gate insulating layer 25 serves as a partition between the thin film transistor and the capacitor element, and retains the ferroelectric paste within the partition during the coating of the paste, so that the ferroelectric layer 22 can be formed at the desired position. The method of coating the insulating layer is not particularly limited, and it can be performed by a known coating method, such as, for example, a spin coating method, a blade coating method, a slit die coating method, a screen printing method, a bar coater method, a mold method, a gravure printing method, a flexographic printing method, an offset printing method, a dip and pull method, an ink jet method, or a dispenser method. Among these, an ink jet method or a dispenser method is preferred, from the viewpoint of patternability and film forming properties. Further, the patterning of the gate insulating layer 25 may be carried out by a known photolithography processing or the like.

The ferroelectric layer can be formed in the same manner as that described for the capacitor-type ferroelectric element mentioned above. The method of patterning is not particularly limited. However, preferred is photolithography processing using a ferroelectric paste containing ferroelectric particles, a photosensitive organic component, and a solvent, from the viewpoint of microfabrication properties, processing position control, and the like.

The gate electrode, the source electrode, the drain electrode, the wiring, and the via can be formed in the same manner as that described for the conductive films in the capacitor-type ferroelectric element. However, photolithography processing using the photosensitive conductive paste is preferred, from the viewpoint of microfabrication properties, processing position control, production cost, and the like.

Second Embodiment

Each of FIGS. 9 to 13 shows an example of a thin film transistor-type ferroelectric memory element 301 (so-called 1T type), which is one of the embodiments of the ferroelectric memory element according to the present invention. Since the thin film transistor-type ferroelectric memory element itself has a transistor function, it does not require a thin film transistor for control, when used as a memory cell, as does the capacitor-type ferroelectric memory element.

The thin film transistor-type ferroelectric memory element 301 further includes: a third conductive film; and a semiconductor layer provided between the second conductive film and the third conductive film; wherein the ferroelectric layer insulates between the first conductive film and other three components: the second conductive film, the third conductive film and the semiconductor layer.

In other words, in the thin film transistor-type ferroelectric memory element, the second conductive film and the third conductive film function as the source electrode and the drain electrode, respectively; the first conductive film functions as the gate electrode; and the ferroelectric layer function as the gate insulating layer. In the thin film transistor-type ferroelectric memory element 301 as described above, a voltage is applied between a gate electrode 31, and a source electrode 33 and a drain electrode 35, to alter the polarization state of a ferroelectric layer 32, thereby writing information. Further, such a polarization state is retained even when the application of an electric field is terminated, and by detecting the current flowing between the source electrode 33 and the drain electrode 35, the reading of information can be carried out.

It is possible to determine whether the gate insulating layer in the thin film transistor-type ferroelectric memory element has ferroelectric properties or not, by measuring the change in the current value (hysteresis properties) between the source electrode and the drain electrode corresponding to the sweep direction of the voltage, using a system for evaluating semiconductor properties.

Figure 9:
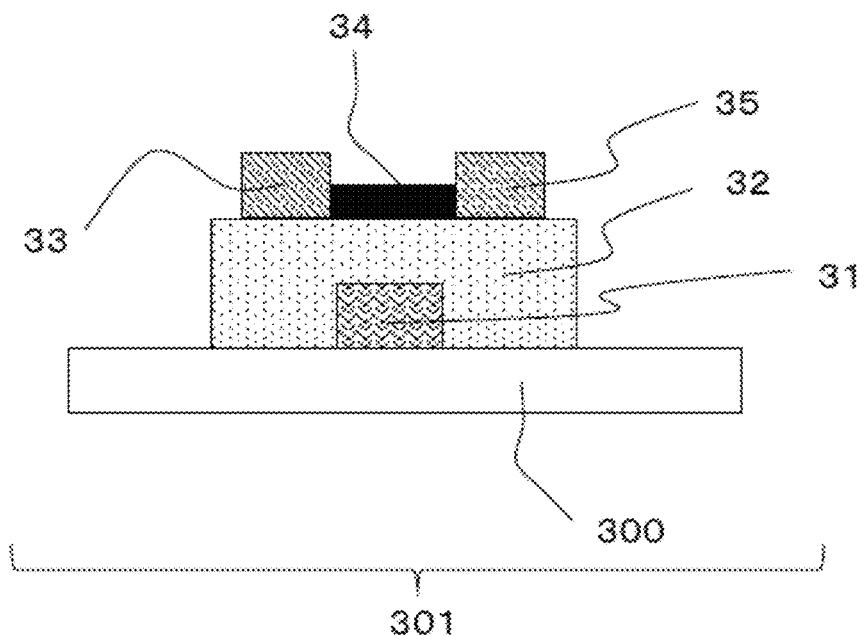
FIG. 9 is a schematic sectional view showing an example of an embodiment of the ferroelectric memory element according to the present invention.
Figure 10:
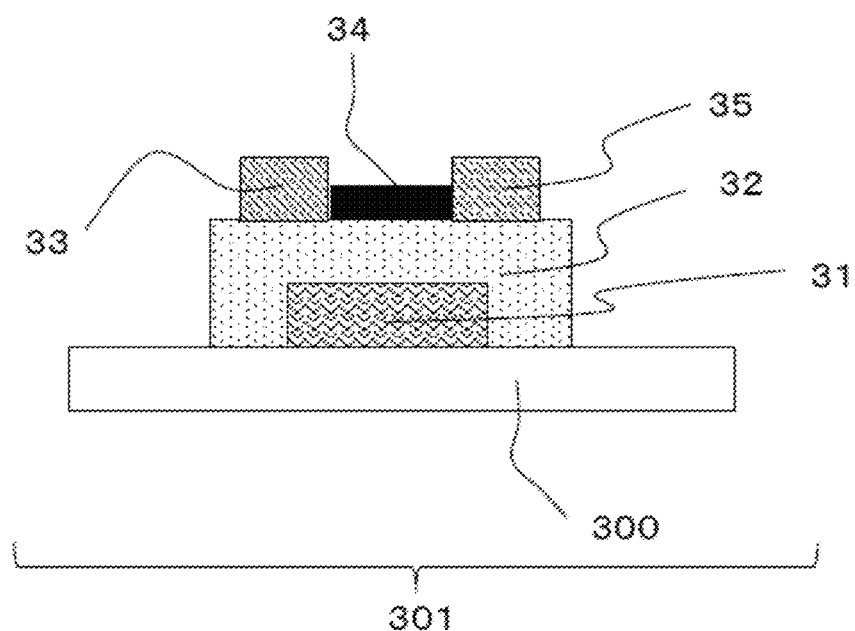
FIG. 10 is a schematic sectional view showing an example of an embodiment of the ferroelectric memory element according to the present invention.
Figure 11:
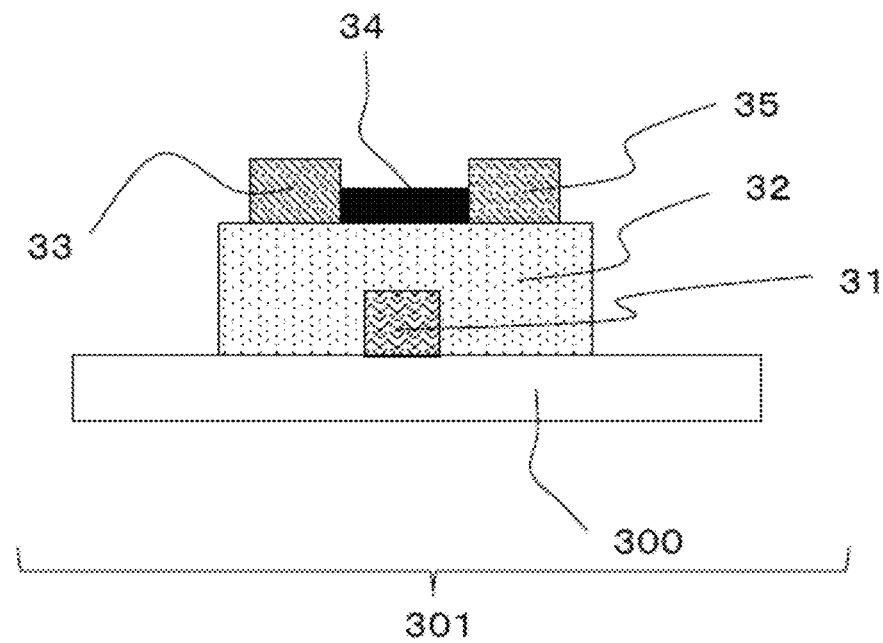
FIG. 11 is a schematic sectional view showing an example of an embodiment of the ferroelectric memory element according to the present invention.
Figure 12:
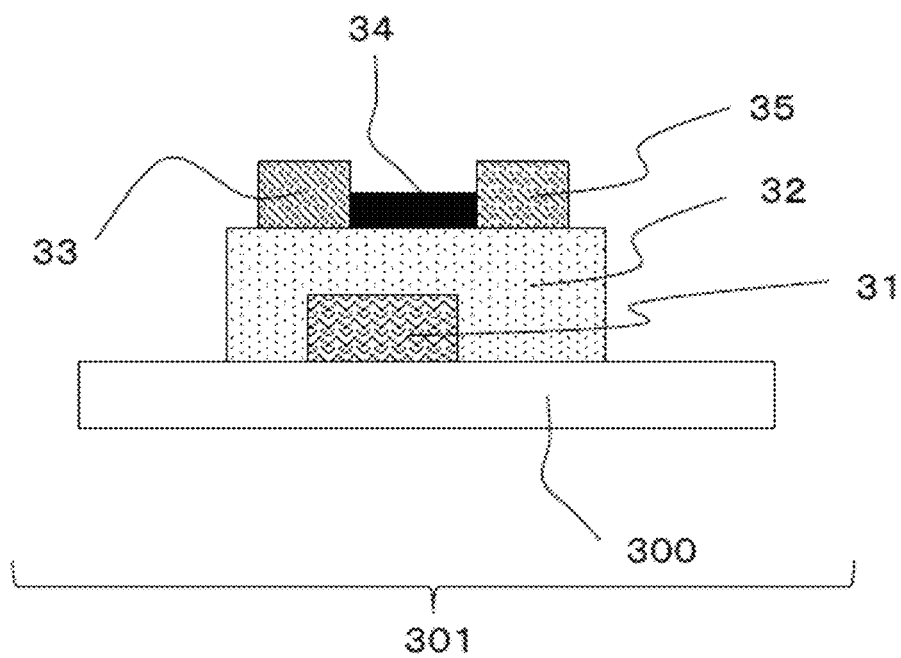
FIG. 12 is a schematic sectional view showing an example of an embodiment of the ferroelectric memory element according to the present invention.
Figure 13:
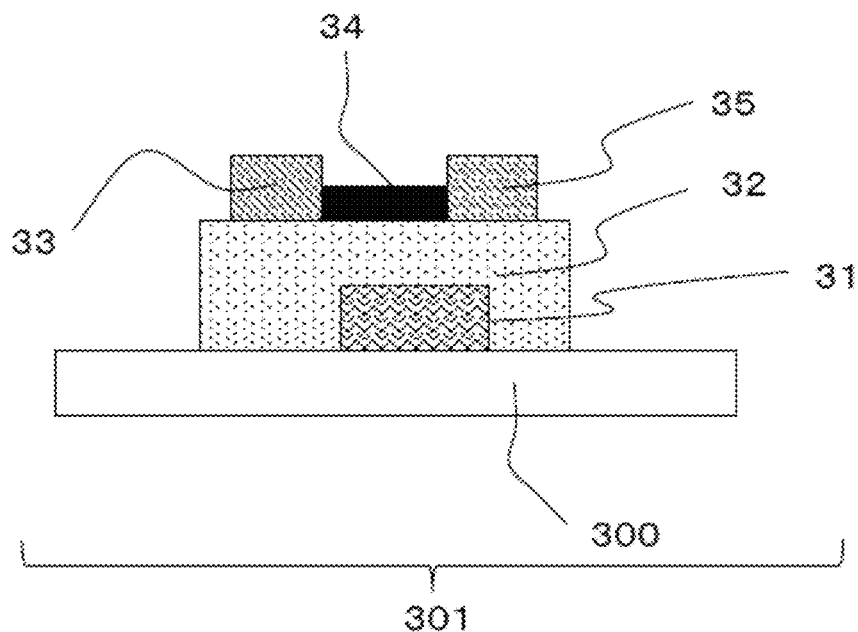
FIG. 13 is a schematic sectional view showing an example of an embodiment of the ferroelectric memory element according to the present invention.

Each of the structures shown in FIGS. 9 to 13 includes: an insulating substrate 300; the gate electrode 31; the ferroelectric layer 32; the source electrode 33; the drain electrode 35; and a semiconductor layer 34. FIG. 9 shows an example of a structure in which the gate electrode 31 does not vertically overlap with the source electrode 33 and the drain electrode 35, and the width of the semiconductor layer 34 coincides with the width of the gate electrode 31. FIG. 10 shows an example of a structure in which the gate electrode 31 partially vertically overlaps with the source electrode 33 and the drain electrode 35. FIG. 11 shows an example of a structure in which the gate electrode 31 does not vertically overlap with the source electrode 33 and the drain electrode 35, and the width of the semiconductor layer 34 is larger than the width of the gate electrode 31. FIG. 12 shows an example of a structure in which the gate electrode 31 partially vertically overlaps with the source electrode 33. FIG. 13 shows an example of a structure in which the gate electrode 31 partially vertically overlaps with the drain electrode 35.

Figure 14:
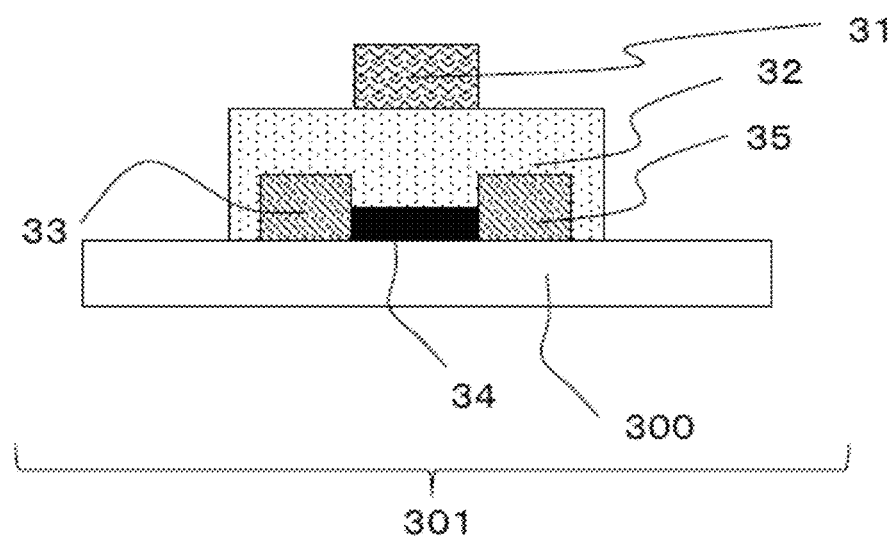
FIG. 14 is a schematic sectional view showing an example of an embodiment of the ferroelectric memory element according to the present invention.

Although FIGS. 9 to 13 show elements having a bottom-gate structure, the thin film transistor-type ferroelectric memory element may be a element having a top-gate structure as shown in FIG. 14. FIG. 14 shows an example of a structure in which the gate electrode 31 does not vertically overlap with the source electrode 33 and the drain electrode 35, and the width of the semiconductor layer 34 coincides with the width of the gate electrode. However, the top-gate structure is not limited to this structure, and the gate electrode may or may not vertically overlap with the source electrode and the drain electrode.

Figure 15:
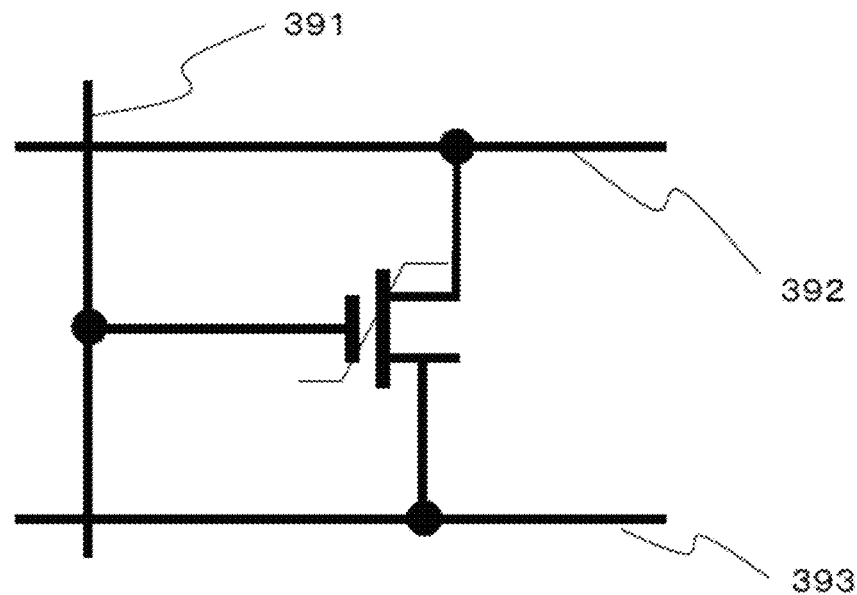
FIG. 15 is a schematic diagram showing a basic circuit configuration of a memory cell including the ferroelectric memory element according to the present invention.

FIG. 15 shows an example of a circuit diagram of a 1T type memory cell. The gate electrode 31, the drain electrode 35, and the source electrode 33 of the thin film transistor-type ferroelectric memory element 301 are electrically connected to a word line 391, a bit line 392, and a plate line 393, respectively.

As the materials for forming the insulating substrate, the ferroelectric layer, the gate electrode, the source electrode, the drain electrode, and the semiconductor layer, the same materials as those used for forming the memory cell in the first embodiment can be used. As the material for forming the semiconductor layer, in particular, CNT is preferred, because: it can be formed by coating; it can be formed at a low temperature of 200° C. or lower; it has a low OFF current, and the like, for example. Particularly, from the viewpoint of semiconductor properties, preferred is a CNT composite composed of CNT and a conjugated polymer attached to at least a part of the surface of the CNT.

(Method of Producing Thin Film Transistor-Type Ferroelectric Memory Element)

The method of producing a thin film transistor-type ferroelectric memory element is not particularly limited, but it includes the following steps:

(1) a step of forming a conductive film of the ferroelectric memory element on an insulating substrate;

(2) a step of forming a ferroelectric layer by coating a ferroelectric paste containing at least ferroelectric particles having an average particle size of from 30 to 500 nm, an organic component, and a solvent, on the conductive film, followed by drying;

(3) a step of forming a conductive film of the ferroelectric memory element on the ferroelectric layer; and (4) a step of forming a semiconductor layer.

In the case of forming a ferroelectric memory element having a bottom-gate structure, the gate electrode is formed by the step (1); the gate insulating layer is formed by the step (2); and the source electrode and the drain electrode are formed by the step (3). In the case of forming a ferroelectric memory element having a top-gate structure, on the other hand, the source electrode and the drain electrode are formed by the step (1); the gate insulating layer is formed by the step (2); and the gate electrode is formed by the step (3).

The ferroelectric layer can be formed in the same manner as that described in the first embodiment. The ferroelectric layer is preferably patterned, in order to prevent misreading by reducing the crosstalk between ferroelectric elements. The method of patterning is not particularly limited. However, preferred is photolithography processing using a ferroelectric paste containing ferroelectric particles, a photosensitive organic component, and a solvent, from the viewpoint of microfabrication properties, processing position control, and the like. Further, the gate electrode, the source electrode, and the drain electrode can be formed in the same manner as those described for the gate electrode, the source electrode and the drain electrode of the thin film transistor included in the memory cell in the first embodiment. However, photolithography processing using the photosensitive conductive paste is preferred, from the viewpoint of microfabrication properties, processing position control, production cost, and the like.

The semiconductor layer of the thin film transistor-type ferroelectric memory element can be formed in the same manner as that described for the semiconductor layer of the thin film transistor included in the memory cell in the first embodiment.

The width and the thickness of each electrode, and the interval between the source electrode and the gate electrode are selected arbitrarily. It is preferred that each electrode have a width of from 10 µm to 10 mm and a thickness of from 0.01 to 100 µm, and that the interval between the source electrode and the gate electrode be from 1 µm to 1 mm, but not limited thereto.

<Memory Cell Array>

Figure 16A:
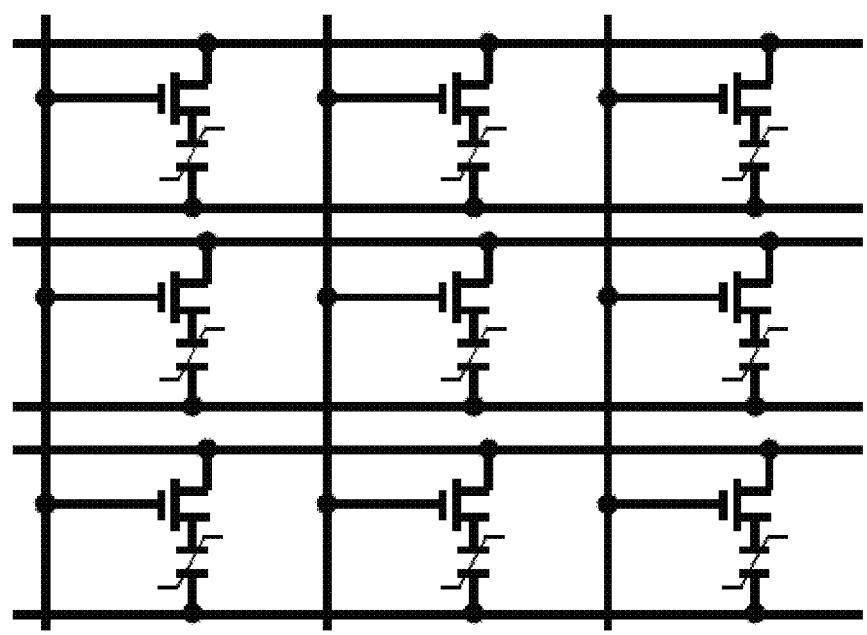
FIG. 16A is a schematic diagram showing a basic circuit configuration of a memory cell array including the ferroelectric memory elements according to the present invention.
Figure 16B:
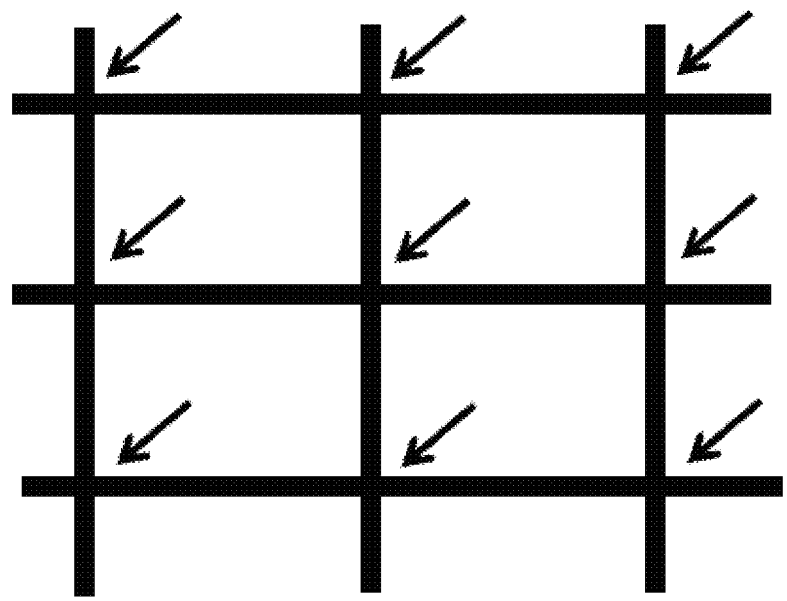
FIG. 16B is a schematic diagram showing a basic circuit configuration of a memory cell array including the ferroelectric memory elements according to the present invention.
Figure 16C:
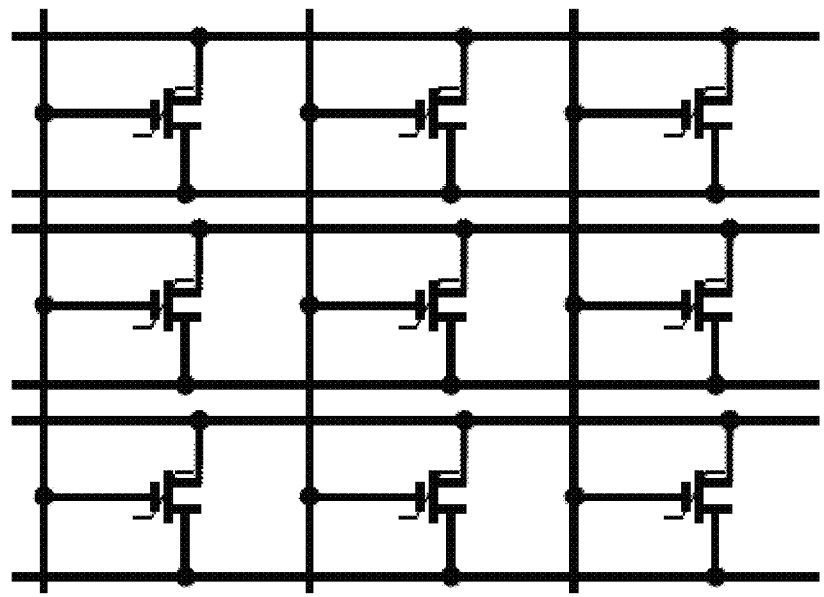
FIG. 16C is a schematic diagram showing a basic circuit configuration of a memory cell array including the ferroelectric memory elements according to the present invention.

Next, an example of a circuit diagram of a memory cell array composed of a plurality of the ferroelectric memory elements or memory cells according to the present invention, is shown in FIG. 16. FIG. 16 shows a circuit diagram of a memory cell array composed of 9 ferroelectric memory elements or 9 memory cells, as an example. FIG. 16A shows a circuit diagram of a capacitor-type memory array cell in which a plurality of the capacitor-type ferroelectric memory cells shown in FIG. 7 are combined. FIG. 16B shows a circuit diagram of a CP type memory array cell in which the respective cross points of the word lines for selecting rows and the bit lines for selecting columns, which are disposed so as to intersect at right angles, constitute the ferroelectric capacitors (indicated by the arrows shown in FIG. 16B). FIG. 16C shows a circuit diagram of a transistor type memory array cell in which a plurality of the thin film transistor-type ferroelectric memory cells shown in FIG. 15 are combined. The peripheral portion of the memory cell array is provided with various types of connection terminals, such as address terminals and data input/output terminals, for allowing access of peripheral circuits such as drivers to the respective memory cells.

<Radio Communication Apparatus>

Next, a description will be given regarding a radio communication apparatus including the ferroelectric memory element according to the present invention. This radio communication apparatus is an apparatus, such as an RFID tag, which performs telecommunications by receiving carrier waves transmitted from an antenna mounted on a leader/writer.

Specific operations to be performed are, for example, as follows. The antenna of an RFID tag receives a radio signal transmitted from the antenna mounted on a leader/writer. The RFID tag carries out an operation in response to the received command. Thereafter, a response as a result of executing the command is transmitted from the antenna of the RFID tag to the antenna of the leader/writer, as a radio signal. The operation in response to the command is carried out at least in a known demodulation circuit, logic circuit for controlling operations, and modulation circuit.

The radio communication apparatus according to the present invention includes at least the above described ferroelectric memory element, transistors and an antenna. The transistors are components included in a rectifier circuit and a logic circuit. The logic circuit includes at least a demodulation circuit, a logic circuit for controlling operations, and a modulation circuit. More specifically, the radio communication apparatus may have, for example, a configuration in which the terminal to which the AC signal received by the antenna is input is electrically connected to one of output terminals, and the other one of the output terminals is electrically connected to the demodulation circuit, the logic circuit for controlling operations, the modulation circuit, and the ferroelectric memory element.

The input terminal, the output terminals, the antenna, and the transistors included in the respective circuits may be those commonly used, and the materials used therefor and the shapes thereof are not particularly limited. Further, any materials can be used for electrically connecting the respective components, as long as they are electrically conductive materials which can be commonly used. Likewise, any methods can be used for electrically connecting these components, as long as they allow for electrical conduction, and the widths and the thicknesses of the connecting portions can be selected arbitrarily.

The ferroelectric memory element according to the present invention is capable of being driven at a lower voltage as compared to a ferroelectric memory element using PVDF-TrFE, which is a representative organic ferroelectric polymer, and thus can be suitably used in an RFID tag which is required to be capable of being driven at a low voltage. The radio communication apparatus including the ferroelectric memory element according to the present invention can be mounted and used, for example, in paper money, coins, securities, certificates, tickets, games, packaging containers, books, recording media, daily goods, vehicles, foods, clothes, health goods, daily commodities, chemicals, pharmaceuticals, medical devices, and electronic devices.

Figure 17:
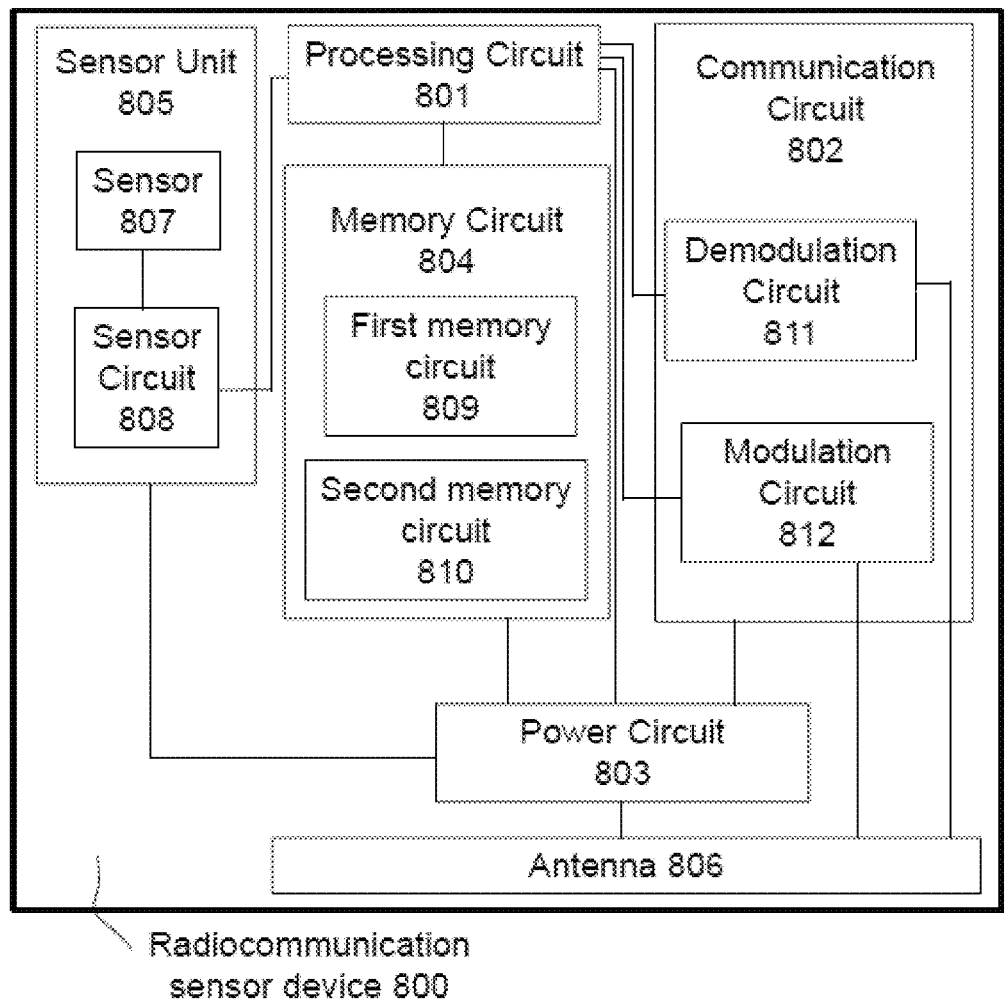
FIG. 17 is a diagram showing a configuration example of a radio communication sensor device using the ferroelectric memory element according to the present invention.

Specific examples of the radio communication apparatus including the ferroelectric memory element according to the present invention include a radio communication sensor device. FIG. 17 shows an example of a configuration of a radio communication sensor device 800 which includes: an arithmetic processing circuit 801, a communication circuit 802, a power supply circuit 803, a memory circuit 804, a sensor unit 805, and an antenna 806. The sensor unit 805 detects temperature, humidity, intensity of illumination, gases, gravity, pressure, sound, vibration, acceleration rate, and other properties, by physical or chemical means.

The sensor unit 805 includes: a sensor 807; and a sensor circuit 808 which controls the sensor 807. The sensor 807 includes a resistive element, a photoelectric conversion element, a thermoelectromotive element, a transistor, a thermistor, a diode, and the like. The sensor circuit 808 detects changes in impedance, reactance, inductance, voltage, or current; carries out an analogue/digital conversion (A/D conversion); and outputs a signal to the arithmetic processing circuit 801. The memory circuit 804 is capable of storing external information received through the sensor unit 805 and the antenna 806 at all times. The memory circuit 804 is also capable of dividing and storing the information into a first memory circuit 809 which stores the signal detected by the sensor unit 806, and a second memory circuit 810 which stores information or an ID number written by a reading/writing apparatus. The communication circuit 802 includes: a demodulation circuit 811; and a modulation circuit 812. The demodulation circuit 811 demodulates a signal received through the antenna 806, and outputs the demodulated signal to the arithmetic processing circuit 801. The signal includes a signal that controls the sensor unit 805, and information to be stored in the memory circuit 804. Further, the signal output from the sensor circuit 808 and the information read from the memory circuit 804 are output through the arithmetic processing circuit 801 to the modulation circuit 812. The modulation circuit 812 modulates this signal into a signal which can be transmitted through radio communication, and outputs the modulated signal through the antenna 806 to an external apparatus. Power required for operating the arithmetic processing circuit, the sensor unit 806, the memory circuit 804, and the communication circuit 802 may be supplied through the antenna 806, or by a built-in power supply (battery) optionally included in the radio communication sensor device.

The arithmetic processing circuit, the communication circuit, the power supply circuit, and the sensor unit of the radio communication sensor device each requires a circuit including a transistor. The semiconductor material to be used for the transistor is not particularly limited as long as it has semiconductor properties, and it is possible to use: an inorganic semiconductor such as a silicon semiconductor or an oxide semiconductor; an organic semiconductor such as pentacene or a polythiophene derivative; or a carbon semiconductor such as CNT or graphene. However, it is preferred that the arithmetic processing circuit, the communication circuit, the power supply circuit, and the sensor unit be also able to be formed by coating, since the ferroelectric memory element according to the present invention, which can be formed by coating, is used for the memory circuit. Accordingly, preferred is an organic semiconductor such as pentacene or a polythiophene derivative, or a carbon semiconductor such as CNT or graphene, which allows formation by coating. Particularly, from the viewpoint of semiconductor performance and formability by coating, CNT is preferred. The use of a coating method, as described above, enables to reduce the cost of the resulting radio communication sensor device, and to meet the demand for a small-scale production of multiple products, which realizes an order made production.

By using the radio communication sensor device, it becomes possible to store and control various types of information detected by the sensor, in the memory element, and to retrieve the information by radio communication. For example, providing radio communication sensor devices including a temperature sensor to food packages enables a food traceability management. By examining the stored temperature data, it is possible to confirm whether the distribution has been carried out within a predetermined temperature range. Further, if a radio communication sensor device including a sensor such as a temperature sensor or a pressure sensor is provided on the surface of, or inside a human body, it is possible to store biological information, such as pulse rate, heart rate, body temperature, blood pressure, electrocardiogram, and electromyogram, in the memory circuit provided in the radio communication sensor device, and to utilize the information for the management of the health status or exercise conditions of the human body, for the prevention and prediction of diseases, and for use in a monitoring system for home medical care, and the like.

EXAMPLES

The present invention will now be more specifically described, based on Examples. Note, however, that the present invention is in no way limited by the following Examples.

(1) Measurement of Average Particle Size of Ferroelectric Particles in Ferroelectric Layer Using a scanning electron microscope (SU-1510; manufactured by Hitachi Ltd.), the cutting cross-sectional surface of the ferroelectric layer in the ferroelectric memory element was observed. The particle sizes of 100 particles randomly selected from the particles included in the cross-sectional surface were measured, and the number average value of the measured values was calculated. In cases where the particles have a spherical shape, the diameter of each particle was taken as the particle size of the particle. In cases where the particles have a shape other than a spherical shape, the mean value of the maximum width and the minimum width of one particle observed by a scanning electron microscope was taken as the particle size of the particle.

(2) Measurement of Film Thickness of Ferroelectric Layer

Using a scanning electron microscope (SU-1510; manufactured by Hitachi Ltd.), the cutting cross-sectional surface of the ferroelectric memory element was observed, to measure the film thickness of the ferroelectric layer. The film thickness was measured at five points, and the mean value of the measured values was determined.

(3) Measurement of Volume Average Particle Size of Ferroelectric Particles in Ferroelectric Paste Using a laser diffraction/scattering particle size distribution measuring apparatus (LA-920; manufactured by HORIBA, Ltd.), the volume average particle size of the ferroelectric particles in the ferroelectric paste was measured. The measurement was carried out five times, and the mean value of the measured values was determined.

(4) Measurement of Ferroelectric Properties (Capacitor-Type)

Using a system for evaluating ferroelectric properties (Model FCE-3; manufactured by TOYO Corporation), a triangular wave (frequency: 100 Hz) with a peak voltage of ±5 V was applied to the ferroelectric memory element, to measure a hysteresis curve. Subsequently, the hysteresis curve measurement was repeated, while increasing the peak voltage by ±5 V at each measurement. The absolute value of the peak voltage of the triangular wave, when a hysteresis curve whose residual polarization (Pr) exceeded 2 µC/cm² for the first time was obtained, was defined as Vr, and the electric field (Er=Vr/film thickness of ferroelectric layer) was determined. In the measurement of hysteresis curves, the hysteresis curve obtained upon the application of the triangular wave at the fourth cycle, was taken as the result of the main measurement.

(5) Measurement of Ferroelectric Properties (Thin Film Transistor-Type)

Using a system for evaluating semiconductor properties (4200-SCS; manufactured by Keithley Instruments Inc.), the voltage ($V_{GS}$) between the gate electrode and the source electrode was swept within the range of +5V→−5V→+5V (referred to as a sweep voltage: ±5 V"), and the current ($I_{DS}$) that flows between the source electrode and the drain electrode was measured. Subsequently, the measurement of $I_{DS}$ was repeated, while increasing the sweep voltage by ±5 V at each measurement. The absolute value of the sweep voltage, when the ratio $I_{DS+0}$/$I_{DS-0}$ (hereinafter referred to as "f") exceeded 100 for the first time, was defined as Vr, and the electric field (Er=Vr/film thickness of ferroelectric layer) was determined. The above described ratio $I_{DS+0}$/$I_{DS-0}$ is a ratio of $I_{DS+0}$, which is a value obtained when swept from a negative voltage to a positive voltage, to $I_{DS-0}$, which is a value obtained when swept from a positive voltage to a negative voltage. In the measurement of $V_{GS}$–$I_{DS}$, the curve obtained in the first cycle of sweep was taken as the result of the main measurement.

(6) Repetitive Voltage Application Test of Ferroelectric Memory Element (Capacitor-Type)

Using a system for evaluating ferroelectric properties (Model FCE-3; manufactured by TOYO Corporation), hysteresis curves were obtained before and after applying a triangular wave with a peak electric field of ±50 MV/m to the ferroelectric memory element 10,000 times, by the method described in the section (4), to determine the change in Er (Er (after)/Er (before) (%)) before and after the repetitive voltage application test. Although the repetitive voltage application test causes an increase in Er, the change in Er is preferably 120% or less, and more preferably 110% or less.

(7) Repetitive Voltage Application Test of Ferroelectric Memory Element (Thin Film Transistor-Type)

Using a system for evaluating semiconductor properties (4200-SCS; manufactured by Keithley Instruments Inc.), the measurement of the ferroelectric properties was carried out before and after sweeping 10,000 times at an electric field of ±60 MV/m, by the method described in the section (5), to determine the change in Er (Er (after)/Er (before) (%)) before and after the repetitive voltage application test. Although the repetitive voltage application test causes an increase in Er, the change in Er is preferably 120% or less, and more preferably 110% or less.

(8) Yield Evaluation of Ferroelectric Memory Element

The evaluation of ferroelectric properties was carried out for 100 pieces of ferroelectric memory elements by the method described in the section (4) or (5). The ferroelectric memory elements were evaluated according to the following criteria, based on whether or not the occurrence of a short circuit fault was observed.

A (excellent): The number of elements in which the occurrence of a short circuit fault was observed, is one or less in 100 pieces of elements.

B (good): The number of elements in which the occurrence of a short circuit fault was observed, is two or more and less than five in 100 pieces of elements.

C (acceptable): The number of elements in which the occurrence of a short circuit fault was observed, is five or more and less than 10 in 100 pieces of elements.

D (unacceptable): The number of elements in which the occurrence of a short circuit fault was observed, is 10 or more in 100 pieces of elements.

(9) Measurement of Weight Fraction of Ferroelectric Particles in Ferroelectric Layer Using a thermogravimetric apparatus (TGA-50; manufactured by Shimadzu Corporation), the change in the weight of the ferroelectric film under a flow of atmospheric air was measured. The temperature was increased from room temperature to 800° C. at a rate of temperature rise of 10° C./min, and the weight fraction of the ferroelectric particles in the ferroelectric layer was obtained from the ratio of the weight of the ferroelectric particles after lowering to room temperature, to the weight thereof before the temperature increase.

(10) Measurement of Average Particle Size of Metal Particles in Conductive Films Using a scanning electron microscope (SU-1510; manufactured by Hitachi Ltd.), the cutting cross-sectional surface of each electrode of the ferroelectric memory element was observed, and an EDX measurement was carried out for the particles contained therein, to identify the metal species of the particles. Subsequently, the particle sizes of 100 metal particles randomly selected from these particles were measured by observation, and the number average value was calculated from the measured values. In cases where the particles have a spherical shape, the diameter of each particle was taken as the particle size of the particle. In cases where the particles have a shape other than a spherical shape, the mean value of the maximum width and the minimum width of one particle observed by a scanning electron microscope was calculated as the particle size of the particle.

(11) Measurement of Surface Roughness of Conductive Film

Using Surface profilometer (Surfcom 1400; manufactured by Tokyo Seimitsu Co., Ltd.), the measurement of the surface roughness (arithmetic average roughness (Ra)) of the conductive film surface was carried out, by measuring the surface roughness of the upper electrode in the case of a element having a capacitor structure, and by measuring that of the source electrode in the case of a element having a transistor structure. The measurement of Ra was carried out at five points, and the mean value of the measured values was determined.

(12) Bending Test of Ferroelectric Memory Element (Capacitor-Type)

Figure 18A:
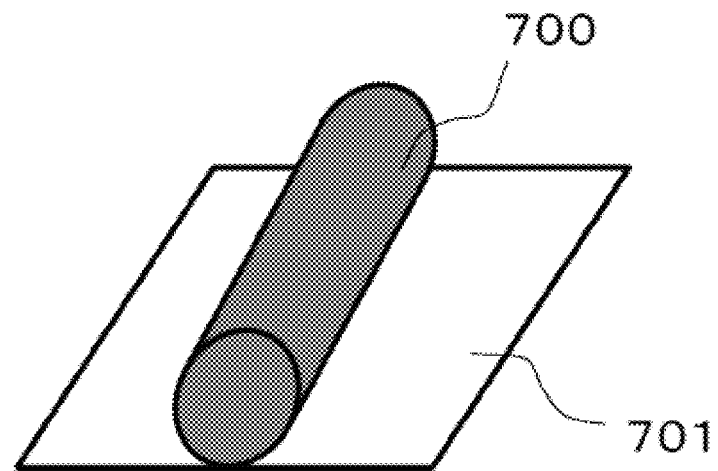
FIG. 18A is a schematic perspective view illustrating the process of evaluating the bending resistance of a ferroelectric memory element.
Figure 18B:
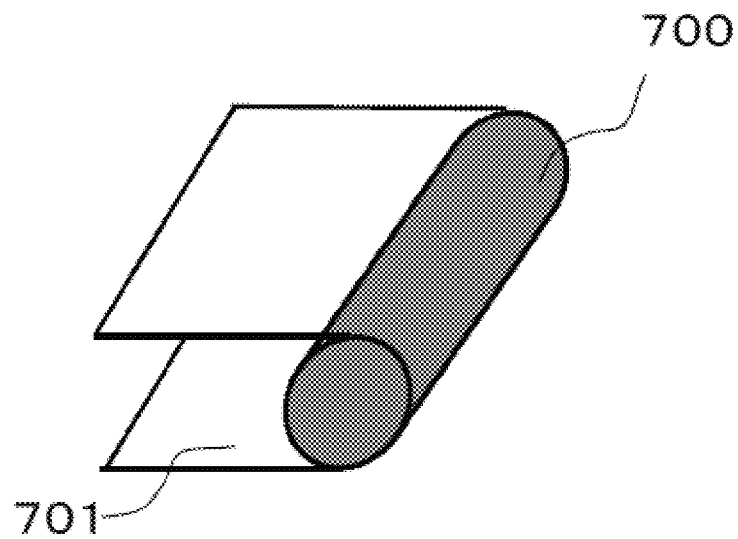
FIG. 18B is a schematic perspective view illustrating the process of evaluating the bending resistance of the ferroelectric memory element.

A description will be given with reference to FIG. 18. A substrate 101 on which the ferroelectric memory element had been formed was prepared as a sample, and at the central portion of the surface of the substrate formed with the ferroelectric memory element, a metal column 100 having a diameter of 30 mm was fixed. The sample was placed along the column such that the sample holds the column at a holding angle of 0° (namely, a state where the sample was flat) (see FIG. 18A), and then an operation to bend the sample was carried out 500 times, within the range between the flat state and the state where the column holding angle was 180° (namely, a state where the sample was folded back along the column) (see FIG. 18B). The measurement of ferroelectric properties was carried out the by the method described in the section (4), to determine the change in Er (Er (after)/Er (before) (%)) before and after the bending test. Although the bending test causes an increase in Er, the change in Er is preferably 150% or less, and more preferably 120% or less.

(13) Bending Test of Ferroelectric Memory Element (Thin Film Transistor-Type)

A description will be given with reference to FIG. 18. A substrate 101 on which the ferroelectric memory element had been formed was prepared as a sample, and at the central portion of the surface of the substrate formed with the ferroelectric memory element, a metal column 100 having a diameter of 30 mm was fixed. The sample was placed along the column such that the sample holds the column at a holding angle of 0° (namely, a state where the sample was flat) (see FIG. 18A), and then an operation to bend the sample was carried out 500 times, within the range between the flat state and the state where the column holding angle was 180° (namely, a state where the sample was folded back along the column) (see FIG. 18B). The measurement of ferroelectric properties was carried out by the method described in the section (5), to determine the change in Er (Er (after)/Er (before) (%)) before and after the bending test. Although the bending test causes an increase in Er, the change in Er is preferably 150% or less, and more preferably 120% or less.

(14) Measurement of Displacement Current of Memory Cell

Using a system for evaluating semiconductor properties (4200-SCS; manufactured by Keithley Instruments Inc.), and with the film transistor being turned "ON" by applying a voltage of −10 V between the gate electrode and the source electrode of the thin film transistor, a voltage twice the value of Vr determined by the method described in the section (4) was applied to the thin film transistor, to write "1" into the ferroelectric capacitor. Subsequently, a sweeping voltage of from 0 V to −2Vr was applied to the ferroelectric capacitor to measure the current derived from the polarization inversion of the ferroelectric layer, and the maximum value thereof was taken as a displacement current A. In the same manner, a voltage of −2Vr was applied to write "0" into the ferroelectric capacitor, and then a sweeping voltage of from 0 V to −2Vr was applied thereto to measure the current derived from the polarization inversion of the ferroelectric layer, and the minimum value thereof was taken as a displacement current B.

Synthesis Example 1; Compound P (Polymerizable Component: Polymer Containing Polymerizable Unsaturated Group)

Copolymerization ratio (based on weight): ethyl acrylate (hereinafter referred to as "EA")/2-ethylhexyl methacrylate (hereinafter referred to as "2-EHMA")/styrene (hereinafter referred to as "St")/glycidyl methacrylate (hereinafter referred to as "GMA")/acrylic acid (hereinafter referred to as "AA")=20/40/20/5/15.

Into a reaction vessel under a nitrogen atmosphere, 150 g of diethylene glycol monoethyl ether acetate (hereinafter referred to as "DMEA") was charged, and the vessel was heated to 80° C. using an oil bath. To the resultant, a mixture composed of 20 g of EA, 40 g of 2-EHMA, 20 g of St, 15 g of AA, 0.8 g of 2,2'-azobisisobutyronitrile and 10 g of DMEA was added dropwise over one hour. After the completion of the dropwise addition, the polymerization reaction was carried out for 6 more hours. Thereafter, 1 g of hydroquinone monomethyl ether was added to terminate the polymerization reaction. To the resultant, a mixture composed of 5 g of GMA, 1 g of triethylbenzylammonium chloride and 10 g of DMEA was added dropwise over 0.5 hours. After the completion of the dropwise addition, the addition reaction was carried out for two more hours. The resulting reaction solution was purified with methanol to remove unreacted impurities, followed by vacuum drying for 24 hours, to obtain a compound P1.

Synthesis Example 2; Compound P2 (Polymerizable Component: Polymer Containing Polymerizable Unsaturated Group)

Copolymerization ratio (based on weight): bifunctional epoxy acrylate monomer (epoxy ester 3002A; manufactured by Kyoeisha Chemical Co., Ltd.)/bifunctional epoxy acrylate monomer (epoxy ester 70PA; manufactured by Kyoeisha Chemical Co., Ltd.)/GMA/St/AA=20/40/5/20/15.

Into a reaction vessel under a nitrogen atmosphere, 150 g of DMEA was charged, and the vessel was heated to 80° C. using an oil bath. To the resultant, a mixture composed of 20 g of epoxy ester 3002A, 40 g of epoxy ester 70PA, 20 g of St, 15 g of AA, 0.8 g of 2,2'-azobisisobutyronitrile, and 10 g of DMEA was added dropwise over one hour. After the completion of the dropwise addition, the polymerization reaction was carried out for 6 more hours. Thereafter, 1 g of hydroquinone monomethyl ether was added to terminate the polymerization reaction. To the resultant, a mixture composed of 5 g of GMA, 1 g of triethylbenzylammonium chloride and 10 g of DMEA was added dropwise over 0.5 hours. After the completion of the dropwise addition, the addition reaction was carried out for two more hours. The resulting reaction solution was purified with methanol to remove unreacted impurities, followed by vacuum drying for 24 hours, to obtain a compound P2.

Synthesis Example 3; Compound P3 (Polymerizable Component: Polymer Containing Polymerizable Unsaturated Group)

A Urethane-Modified Compound of the Compound P2

Into a reaction vessel under a nitrogen atmosphere, 100 g of diethylene glycol monoethyl ether acetate (hereinafter referred to as "DMEA") was charged, and the vessel was heated to 80° C. using an oil bath. To the resultant, a mixture composed of 10 g of the photosensitive component P2, 3.5 g of n-hexylisocyanate and 10 g of DMEA was added dropwise over one hour. After the completion of the dropwise addition, the reaction was carried out for three more hours. The resulting reaction solution was purified with methanol to remove unreacted impurities, followed by vacuum drying for 24 hours, to obtain a compound P3 having an urethane bond.

Synthesis Example 4; Compound P4 (Resin Component of Ferroelectric Paste: Polymer Containing Carboxyl Group)

Copolymerization ratio (based on weight): St/MMA/MA=50/35/15.

Into a reaction vessel under a nitrogen atmosphere, 150 g of DMEA was charged, and the vessel was heated to 80° C. using an oil bath. To the resultant, a mixture composed of 50 g of St, 35 g of MMA, 15 g of MA, 0.8 g of 2,2'-azobisisobutyronitrile and 10 g of IPA was added dropwise over one hour. After the completion of the dropwise addition, the polymerization reaction was carried out for 6 more hours. Thereafter, 1 g of hydroquinone monomethyl ether was added to terminate the polymerization reaction. The resulting reaction solution was purified with methanol to remove unreacted impurities, followed by vacuum drying for 24 hours, to obtain a compound P5. The thus obtained compound P4 had an acid value of 84 mg KOH/g.

Synthesis Example 5; Compound P5 (Resin Component of Ferroelectric Paste: Polymer Containing Carboxyl Group, Hydroxyl Group, and Ethylenically Unsaturated Group)

Copolymerization ratio (based on weight): St/MMA/MA/a GMA adduct of MA (hereinafter referred to as "MA-GMA")=31/26/8/35.

Into a reaction vessel under a nitrogen atmosphere, 150 g of DMEA was charged, and the vessel was heated to 80° C. using an oil bath. To the resultant, a mixture composed of 40 g of St, 33 g of MMA, 27 g of MA, 0.8 g of 2,2'-azobisisobutyronitrile and 10 g of IPA was added dropwise over one hour. After the completion of the dropwise addition, the polymerization reaction was carried out for 6 more hours. Thereafter, 1 g of hydroquinone monomethyl ether was added to terminate the polymerization reaction. To the resultant, a mixture composed of 27 g of GMA, 5 g of triethylbenzylammonium chloride and 60 g of DMEA was added dropwise over 0.5 hours. After the completion of the dropwise addition, the addition reaction was carried out for two more hours. The resulting reaction solution was purified with methanol to remove unreacted impurities, followed by vacuum drying for 24 hours, to obtain a compound P5. The thus obtained compound P5 had an acid value of 54 mg KOH/g.

Synthesis Example 6; Compound P6 (Resin Component of Ferroelectric Paste: Polymer Containing Carboxyl Group, Hydroxyl Group, and Ethylenically Unsaturated Group)

Copolymerization ratio (based on weight): St/MMA/MA/MA-GMA=25/22/13/40.

Into a reaction vessel under a nitrogen atmosphere, 150 g of DMEA was charged, and the vessel was heated to 80° C. using an oil bath. To the resultant, a mixture composed of 33 g of St, 29 g of MMA, 38 g of MA, 0.8 g of 2,2'-azobisisobutyronitrile and 10 g of IPA was added dropwise over one hour. After the completion of the dropwise addition, the polymerization reaction was carried out for 6 more hours. Thereafter, 1 g of hydroquinone monomethyl ether was added to terminate the polymerization reaction. To the resultant, a mixture composed of 33 g of GMA, 5 g of triethylbenzylammonium chloride and 60 g of DMEA was added dropwise over 0.5 hours. After the completion of the dropwise addition, the addition reaction was carried out for two more hours. The resulting reaction solution was purified with methanol to remove unreacted impurities, followed by vacuum drying for 24 hours, to obtain a compound P6. The thus obtained compound P6 had an acid value of 88 mg KOH/g.

Synthesis Example 7; Compound P7 (Resin Component of Ferroelectric Paste: Polymer Containing Carboxyl Group, Hydroxyl Group, and Ethylenically Unsaturated Group)

Copolymerization ratio (based on weight): St/MMA/MA/MA-GMA=27/22/22/29.

Into a reaction vessel under a nitrogen atmosphere, 150 g of DMEA was charged, and the vessel was heated to 80° C. using an oil bath. To the resultant, a mixture composed of 33 g of St, 26 g of MMA, 41 g of MA, 0.8 g of 2,2'-azobisisobutyronitrile and 10 g of IPA was added dropwise over one hour. After the completion of the dropwise addition, the polymerization reaction was carried out for 6 more hours. Thereafter, 1 g of hydroquinone monomethyl ether was added to terminate the polymerization reaction. To the resultant, a mixture composed of 22 g of GMA, 5 g of triethylbenzylammonium chloride and 60 g of DMEA was added dropwise over 0.5 hours. After the completion of the dropwise addition, the addition reaction was carried out for two more hours. The resulting reaction solution was purified with methanol to remove unreacted impurities, followed by vacuum drying for 24 hours, to obtain a compound P7. The thus obtained compound P7 had an acid value of 144 mg KOH/g.

Synthesis Example 8; Compound P8 (Resin Component of Ferroelectric Paste: Polymer Containing Carboxyl Group, Hydroxyl Group, and Ethylenically Unsaturated Group)

Copolymerization ratio (based on weight): St/MMA/MA/MA-GMA=25/19/33/23.

Into a reaction vessel under a nitrogen atmosphere, 150 g of DMEA was charged, and the vessel was heated to 80° C. using an oil bath. To the resultant, a mixture composed of 29 g of St, 22 g of MMA, 49 g of MA, 0.8 g of 2,2'-azobisisobutyronitrile and 10 g of IPA was added dropwise over one hour. After the completion of the dropwise addition, the polymerization reaction was carried out for 6 more hours. Thereafter, 1 g of hydroquinone monomethyl ether was added to terminate the polymerization reaction. To the resultant, a mixture composed of 17 g of GMA, 5 g of triethylbenzylammonium chloride and 60 g of DMEA was added dropwise over 0.5 hours. After the completion of the dropwise addition, the addition reaction was carried out for two more hours. The resulting reaction solution was purified with methanol to remove unreacted impurities, followed by vacuum drying for 24 hours, to obtain a compound P8. The thus obtained compound P8 had an acid value of 215 mg KOH/g.

Preparation Example 1; Preparation of Ferroelectric Paste

To a 100 mL container, 5 g of barium titanate (average particle size: 50 nm; manufactured by KCM Corporation Co., Ltd.) and 0.1 g of a cationic polymeric dispersant (trade name: AJISPER PB-821, manufactured by Ajinomoto Fine Techno Co., Ltd.) were charged, along with 10 g of zirconia beads having a diameter of 1 mm. To the resultant, 28 g of isopropanol was added to adjust the solid concentration of barium titanate to 15% by weight, followed by a dispersion treatment for 96 hours using a desktop ball mill. Subsequently, 1.25 g of a polyvinylpyrrolidone resin was added, and the resultant was mixed for two hours by the desktop ball mill. Thereafter, the zirconia beads were removed by filtration to obtain a ferroelectric paste. The thus obtained ferroelectric paste was stored in the atmosphere at room temperature. As a result, the paste was stable and no precipitate was observed even after one month.

Preparation Examples 2 to 6; Preparation of Ferroelectric Pastes

Ferroelectric pastes were prepared in the same manner as in Preparation Example 1, except for using barium titanate particles having the average particle sizes shown in the following Table 1.

Preparation Example 7; Preparation of Ferroelectric Paste

A ferroelectric paste was prepared in the same manner as in Preparation Example 2, except that 0.25 g of the polyvinylpyrrolidone resin was added.

Preparation Example 8; Preparation of Ferroelectric Paste

A ferroelectric paste was prepared in the same manner as in Preparation Example 2, except that 4.09 g of the polyvinylpyrrolidone resin was added.

Preparation Example 9; Preparation of Ferroelectric Paste

To a 100 mL container, 5 g of barium titanate (average particle size: 12 nm; manufactured by Toda Kogyo Corp.) and 0.1 g of a cationic polymeric dispersant (trade name: AJISPER PB-821, manufactured by Ajinomoto Fine Techno Co., Ltd.) were charged, along with 10 g of zirconia beads having a diameter of 1 mm. To the resultant, 28 g of isopropanol was added to adjust the solid concentration of barium titanate to 15% by weight, followed by a dispersion treatment for 96 hours using a desktop ball mill. Subsequently, 1.25 g of a polyvinylpyrrolidone resin was added, and the resultant was mixed for two hours by the desktop ball mill. Thereafter, the zirconia beads were removed by filtration to obtain a ferroelectric paste. The thus obtained ferroelectric paste was stored in the atmosphere at room temperature. As a result, the paste was stable and no precipitate was observed even after one month.

Preparation Example 10; Preparation of Ferroelectric Paste

A ferroelectric paste was prepared in the same manner as in Preparation Example 2, except that 0.10 g of the polyvinylpyrrolidone resin was added.

Preparation Example 11; Preparation of Ferroelectric Paste

A ferroelectric paste was prepared in the same manner as in Preparation Example 4, except that 0.25 g of the polyvinylpyrrolidone resin was added.

Preparation Example 12; Preparation of Ferroelectric Paste

A ferroelectric paste was prepared in the same manner as in Preparation Example 4, except that 0.10 g of the polyvinylpyrrolidone resin was added.

Preparation Example 13; Preparation of Ferroelectric Paste

To a 100 mL container, 5 g of barium titanate (average particle size: 200 nm; manufactured by KCM Corporation Co., Ltd.) and 0.1 g of a cationic polymeric dispersant (trade name: AJISPER PB-821, manufactured by Ajinomoto Fine Techno Co., Ltd.) were charged, along with 10 g of zirconia beads having a diameter of 1 mm. To the resultant, 28 g of isopropanol was added to adjust the solid concentration of barium titanate to 15% by weight, followed by a dispersion treatment for 96 hours using a desktop ball mill. Subsequently, 0.16 g of a polyvinylpyrrolidone resin and 0.09 g of imidazole were added, and the resultant was mixed for two hours by the desktop ball mill. Thereafter, the zirconia beads were removed by filtration to obtain a ferroelectric paste. The thus obtained ferroelectric paste was stored in the atmosphere at room temperature. As a result, the paste was stable and no precipitate was observed even after one month.

Preparation Example 14; Preparation of Ferroelectric Paste

A ferroelectric paste was prepared in the same manner as in Preparation Example 13, except that 1,2,4-triazole was used instead of imidazole.

Preparation Example 15; Preparation of Ferroelectric Paste

A ferroelectric paste was prepared in the same manner as in Preparation Example 11, except that polyvinylimidazole was used instead of polyvinylpyrrolidone.

Preparation Example 16; Preparation of Ferroelectric Paste

To a 100 mL container, 5 g of barium titanate (average particle size: 50 nm; manufactured by KCM Corporation Co., Ltd.) and 0.1 g of a cationic polymeric dispersant (trade name: AJISPER PB-821, manufactured by Ajinomoto Fine Techno Co., Ltd.) were charged, along with 10 g of zirconia beads having a diameter of 1 mm. To the resultant, 18 g of isopropanol and 10 g of N,N-dimethylformamide were added to adjust the solid concentration of barium titanate to 15% by weight, followed by a dispersion treatment for 96 hours using a desktop ball mill. Subsequently, 1.25 g of a poly(vinylidene fluoride-trifluoroethylene) (PVDF-TrFE) (trade name: Solvene 250; manufactured by Solvey S.A.) resin was added, and the resultant was mixed for two hours by the desktop ball mill. Thereafter, the zirconia beads were removed by filtration to obtain a ferroelectric paste. The thus obtained ferroelectric paste was stored in the atmosphere at room temperature. As a result, the paste was stable and no precipitate was observed even after one month.

Preparation Example 17; Preparation of Ferroelectric Paste

To a 100 mL container, 5 g of barium titanate (average particle size: 50 nm; manufactured by KCM Corporation Co., Ltd.) and 0.1 g of a cationic polymeric dispersant (trade name: AJISPER PB-821, manufactured by Ajinomoto Fine Techno Co., Ltd.) were charged, along with 10 g of zirconia beads having a diameter of 1 mm. To the resultant, 18 g of isopropanol and 10 g of N,N-dimethylformamide were added to adjust the solid concentration of barium titanate to 15% by weight, followed by a dispersion treatment for 96 hours using a desktop ball mill. Subsequently, 0.25 g of the compound P4 was added, and the resultant was mixed for two hours by the desktop ball mill. Thereafter, the zirconia beads were removed by filtration to obtain a ferroelectric paste. The thus obtained ferroelectric paste was stored in the atmosphere at room temperature. As a result, the paste was stable and no precipitate was observed even after one month.

Preparation Examples 18 to 21; Preparation of Ferroelectric Pastes

Ferroelectric pastes were prepared in the same manner as in Preparation Example 17, except for using the resins shown in the following Table 1.

Preparation Example 22; Preparation of Ferroelectric Paste

To a 100 mL container, 5 g of barium titanate (average particle size: 200 nm; manufactured by KCM Corporation Co., Ltd.) and 0.1 g of a cationic polymeric dispersant (trade name: AJISPER PB-821, manufactured by Ajinomoto Fine Techno Co., Ltd.) were charged, along with 10 g of zirconia beads having a diameter of 1 mm. To the resultant, 18 g of isopropanol and 10 g of N,N-dimethylformamide were added to adjust the solid concentration of barium titanate to 15% by weight, followed by a dispersion treatment for 96 hours using a desktop ball mill. Subsequently, 0.25 g of the compound P6, 0.05 g of a photopolymerization initiator OXE-01 (manufactured by BASF Japan Ltd.), and 0.01 g of an acid generator SI-110 (manufactured by Sanshin Chemical Industry Co., Ltd.) were added, and the resultant was mixed for two hours by the desktop ball mill. Thereafter, the zirconia beads were removed by filtration to obtain a ferroelectric paste. The thus obtained ferroelectric paste was stored in the atmosphere at room temperature. As a result, the paste was stable and no precipitate was observed even after one month.

Preparation Example 23; Preparation of Ferroelectric Paste

To a 100 mL container, 15 g of N,N-dimethylformamide and 1.3 g of a poly(vinylidene fluoride-trifluoroethylene) (PVDF-TrFE) (trade name: Solvene 250; manufactured by Solvey S.A.) resin were added, and the resultant was mixed by a rotation-revolution vacuum mixer "Awatori Neritaro" (registered trademark) (ARE-310; manufactured by Thinky Corporation), to obtain a P(VDF-TrFE) solution.

Preparation Example 24; Preparation of Ferroelectric Paste

To a 100 mL container, 5 g of barium titanate (average particle size: 100 nm; manufactured by KCM Corporation Co., Ltd.) and 0.1 g of a cationic polymeric dispersant (trade name: AJISPER PB-821, manufactured by Ajinomoto Fine Techno Co., Ltd.) were charged, along with 10 g of zirconia beads having a diameter of 1 mm. To the resultant, 28 g of isopropanol was added to adjust the solid concentration of barium titanate to 15% by weight, followed by a dispersion treatment for 96 hours using a desktop ball mill. Thereafter, the zirconia beads were removed by filtration to obtain a ferroelectric paste. The thus obtained ferroelectric paste was stored in the atmosphere at room temperature. As a result, the paste was stable and no precipitate was observed even after one month.

Preparation Example 25; Preparation of Ferroelectric Paste

To a 100 mL container, 5 g of barium titanate (average particle size: 800 nm; manufactured by TPL Inc.) and 0.1 g of a cationic polymeric dispersant (trade name: AJISPER PB-821, manufactured by Ajinomoto Fine Techno Co., Ltd.) were charged, along with 10 g of zirconia beads having a diameter of 1 mm. To the resultant, 28 g of isopropanol was added to adjust the solid concentration of barium titanate to 15% by weight, followed by a dispersion treatment for 96 hours using a desktop ball mill. Subsequently, 1.25 g of a polyvinylpyrrolidone resin was added, and the resultant was mixed for two hours by the desktop ball mill. However, it was unable to disperse the particles of barium titanate.

Table 1 shows the resin component, the acid value of the resin component, the additive(s), the type and the volume average particle size of the ferroelectric particles, the weight fraction of the ferroelectric particles with respect to the resin component, and the solvent(s) used in each of the Preparation Examples, and the dispersion stability of each of the resulting ferroelectric pastes.

TABLE 1

| | Resin component | Acid value | Additive(s) | Ferroelectric particles (volume average particle size) |
|---|---|---|---|---|
| Preparation Example 1 | Polyvinylpyrrolidone | — | — | Barium titanate (50 nm) |
| Preparation Example 2 | Polyvinylpyrrolidone | — | — | Barium titanate (100 nm) |
| Preparation Example 3 | Polyvinylpyrrolidone | — | — | Barium titanate (150 nm) |

TABLE 1-continued

| | | | | |
|---|---|---|---|---|
| Preparation Example 4 | Polyvinylpyrrolidone | — | — | Barium titanate (200 nm) |
| Preparation Example 5 | Polyvinylpyrrolidone | — | — | Barium titanate (300 nm) |
| Preparation Example 6 | Polyvinylpyrrolidone | — | — | Barium titanate (400 nm) |
| Preparation Example 7 | Polyvinylpyrrolidone | — | — | Barium titanate (100 nm) |
| Preparation Example 8 | Polyvinylpyrrolidone | — | — | Barium titanate (100 nm) |
| Preparation Example 9 | Polyvinylpyrrolidone | — | — | Barium titanate (12 nm) |
| Preparation Example 10 | Polyvinylpyrrolidone | — | — | Barium titanate (100 nm) |
| Preparation Example 11 | Polyvinylpyrrolidone | — | — | Barium titanate (200 nm) |
| Preparation Example 12 | Polyvinylpyrrolidone | — | — | Barium titanate (200 nm) |
| Preparation Example 13 | Polyvinylpyrrolidone | — | Imidazole | Barium titanate (200 nm) |
| Preparation Example 14 | Polyvinylpyrrolidone | — | 1,2,4-Triazole | Barium titanate (200 nm) |
| Preparation Example 15 | Polyvinylimidazole | — | — | Barium titanate (200 nm) |
| Preparation Example 16 | PVDF-TrFE | — | — | Barium titanate (50 nm) |
| Preparation Example 17 | St/MMA/MA (Compound P4) | 84 | — | Barium titanate (200 nm) |
| Preparation Example 18 | St/MMA/MA/MA-GMA (Compound P5) | 54 | — | Barium titanate (200 nm) |
| Preparation Example 19 | St/MMA/MA/MA-GMA (Compound P6) | 88 | — | Barium titanate (200 nm) |
| Preparation Example 20 | St/MMA/MA/MA-GMA (Compound P7) | 144 | — | Barium titanate (200 nm) |
| Preparation Example 21 | St/MMA/MA/MA-GMA (Compound P8) | 215 | — | Barium titanate (200 nm) |
| Preparation Example 22 | St/MMA/MA/MA-GMA (Compound P6) | 88 | OXE-01/SI-110 | Barium titanate (200 nm) |
| Preparation Example 23 | PVDF-TrFE | — | — | None |
| Preparation Example 24 | None | — | — | Barium titanate (100 nm) |
| Preparation Example 25 | Polyvinylpyrrolidone | — | — | Barium titanate (800 nm) |

| | Weight fraction of ferroelectric particles in components other than solvent (wt %) | Solvent(s) | Dispersion stability (left under atmosphere at room temperature) |
|---|---|---|---|
| Preparation Example 1 | 80 | Isopropanol | Stable for one month or more |
| Preparation Example 2 | 80 | Isopropanol | Stable for one month or more |
| Preparation Example 3 | 80 | Isopropanol | Stable for one month or more |
| Preparation Example 4 | 80 | Isopropanol | Stable for one month or more |
| Preparation Example 5 | 80 | Isopropanol | Stable for one month or more |
| Preparation Example 6 | 80 | Isopropanol | Stable for two weeks |
| Preparation Example 7 | 95 | Isopropanol | Stable for one month or more |
| Preparation Example 8 | 55 | Isopropanol | Stable for one month or more |
| Preparation Example 9 | 80 | Isopropanol | Stable for one month or more |
| Preparation Example 10 | 98 | Isopropanol | Stable for one month or more |
| Preparation Example 11 | 95 | Isopropanol | Stable for one month or more |
| Preparation Example 12 | 98 | Isopropanol | Stable for one month or more |
| Preparation Example 13 | 95 | Isopropanol | Stable for one month or more |
| Preparation Example 14 | 95 | Isopropanol | Stable for one month or more |
| Preparation Example 15 | 95 | Isopropanol | Stable for one month or more |
| Preparation Example 16 | 80 | Isopropanol, N,N-dimethylformamide | Stable for one month or more |
| Preparation Example 17 | 95 | Isopropanol, N,N-dimethylformamide | Stable for one month or more |
| Preparation Example 18 | 95 | Isopropanol, N,N-dimethylformamide | Stable for two weeks |
| Preparation Example 19 | 95 | Isopropanol, N,N-dimethylformamide | Stable for one month or more |
| Preparation Example 20 | 95 | Isopropanol, N,N-dimethylformamide | Stable for one month or more |
| Preparation Example 21 | 95 | Isopropanol, N,N-dimethylformamide | Stable for two weeks |
| Preparation Example 22 | 95 | Isopropanol N,N-dimethylformamide | Stable for one month or more |
| Preparation Example 23 | 0 | N,N-dimethylformamide | Stable for one month or more |
| Preparation Example 24 | 100 | Isopropanol | Stable for one month or more |
| Preparation Example 25 | 100 | Isopropanol | Unable to disperse |

Preparation Example 26; Conductive Paste

To a 100 ml clean bottle, 1.6 g of the compound P1, 0.4 g of the compound P3, 0.4 g of a photopolymerization initiator OXE-01 (manufactured by BASF Japan Ltd.), 0.06 g of an acid generator SI-110 (manufactured by Sanshin Chemical Industry Co., Ltd.), and 38 g of diacetone alcohol (manufactured by Sankyo Chemical Co., Ltd.) were charged. The resultant was mixed by a rotation-revolution vacuum mixer "Awatori Neritaro" (registered trademark) (ARE-310; manufactured by Thinky Corporation), to obtain 40.86 g of a photosensitive resin solution (solid content: 4.0% by weight). A quantity of 20.0 g of the resulting photosensitive resin solution and 5.0 g of Ag particles having a volume average particle size of 0.05 μm were mixed, followed by kneading using a three rolls mill "EXAKT M-50" (trade name; manufactured by EXAKT Inc.) to obtain 25 g of a conductive paste.

Preparation Example 27; Conductive Paste

A conductive paste was obtained in the same manner as in Preparation Example 23, except for using Ag particles having a volume average particle size of 0.2 μm.

Preparation Example 28; Conductive Paste

A conductive paste was obtained in the same manner as in Preparation Example 23, except for using Ag particles having a volume average particle size of 1.5 μm.

Preparation Example 29; Conductive Paste

A conductive paste was obtained in the same manner as in Preparation Example 23, except for using Ag particles having a volume average particle size of 3.0 μm.

Preparation Example 30; Conductive Paste

To a 100 ml clean bottle, 2.0 g of the compound P1, 0.4 g of a photopolymerization initiator OXE-01 (manufactured by BASF Japan Ltd.), 0.06 g of an acid generator SI-110 (manufactured by Sanshin Chemical Industry Co., Ltd.), and 38 g of diacetone alcohol (manufactured by Sankyo Chemical Co., Ltd.) were charged. The resultant was mixed by a rotation-revolution vacuum mixer "Awatori Neritaro" (registered trademark) (ARE-310; manufactured by Thinky Corporation), to obtain 40.86 g of a photosensitive resin solution (solid content: 4.0% by weight). A quantity of 20.0 g of the resulting photosensitive resin solution and 5.0 g of Ag particles having a volume average particle size of 0.05 μm were mixed, followed by kneading using a three rolls mill "EXAKT M-50" (trade name; manufactured by EXAKT Inc.) to obtain 25 g of a conductive paste.

The compositions of the conductive pastes obtained in Preparation Examples 26 to 30 are shown in Table 2.

TABLE 2

| | Polymerizable component(s) | Photopolymerization initiator | Electrically conductive material (volume average particle size in conductive paste) | Acid generator | Solvent |
|---|---|---|---|---|---|
| Preparation Example 26 | P1, P3 | OXE-01 | Ag (0.05 μm) | SI-110 | Diacetone alcohol |
| Preparation Example 27 | P1, P3 | OXE-01 | Ag (0.2 μm) | SI-110 | Diacetone alcohol |
| Preparation Example 28 | P1, P3 | OXE-01 | Ag (1.5 μm) | SI-110 | Diacetone alcohol |
| Preparation Example 29 | P1, P3 | OXE-01 | Ag (3.0 μm) | SI-110 | Diacetone alcohol |
| Preparation Example 30 | P1 | OXE-01 | Ag (0.05 μm) | SI-110 | Diacetone alcohol |

Preparation Example 31; Semiconductor Solution

To 10 ml of a solution of 2.0 mg of poly(3-hexylthiophene) (P3HT) (manufactured by Sigma-Aldrich Co. LLC.) in chloroform, 1.0 mg of CNT (a monolayer CNT, purity: 95%; manufactured by CNI Inc.) was added. The resultant was subjected to ultrasonic stirring for 4 hours using an ultrasonic homogenizer (VCX-500; manufactured by Tokyo Rikakikai Co., Ltd.) at an output of 20%, while cooling with ice, thereby obtaining a CNT dispersion liquid A (CNT composite concentration with respect to the solvent: 0.96 g/l).

Next, a semiconductor solution for forming a semiconductor layer was prepared. The CNT dispersion liquid A obtained as described above was filtered using a membrane filter (Omnipore Membrane, pore diameter: 10 μm, diameter: 25 mm; manufactured by Millipore Corporation), to remove CNT composites having a length of 10 m or more. To the resulting filtrate, 5 ml of o-dichlorobenzene (manufactured by Wako Pure Chemical Industries, Ltd.) was added. Thereafter, chloroform, which is a solvent having a low boiling point, was removed by distillation using a rotatory evaporator, to replace the solvent with o-dichlorobenzene, thereby obtaining a CNT dispersion liquid B. To 1 ml of the resulting CNT dispersion liquid B, 3 mL of o-dichlorobenzene was added, to prepare the semiconductor solution (CNT composite concentration with respect to the solvent: 0.03 g/l).

Preparation Example 32; Dielectric Solution

A quantity of 61.29 g (0.45 mol) of methyltrimethoxysilane, 12.31 g (0.05 mol) of 2-(3,4-epoxycyclohexyl)ethyltrimethoxysilane, and 99.15 g (0.5 mol) of phenyltrimethoxysilane were dissolved in 203.36 g of propylene glycol monobutyl ether (boiling point: 170° C.). To the resultant, 54.90 g of water and 0.864 g of phosphoric acid were added, while stirring. The resulting solution was heated at a bath temperature of 105° C. for two hours, and the internal temperature of the solution was raised to 90° C. to distill out a component mainly composed of by-produced methanol. Subsequently, the resultant was heated at a bath temperature of 130° C. for 2.0 hours, and the internal temperature was raised to 118° C. to distill out a component mainly composed of water and propylene glycol monobutyl ether, followed by cooling to room temperature, to obtain a polysiloxane solution having a solid concentration of 26.0 wt %. The resulting polysiloxane had a weight average molecular weight of 6,000.

A quantity of 10 g of the thus obtained polysiloxane solution was weighed, and mixed with 0.13 g of aluminumbis(ethylacetoacetate)mono(2,4-pentanedionate) (trade name "Alumichelate D"; manufactured by Kawaken Fine Chemicals Co., Ltd., hereinafter, referred to as Alumichelate D) and 54.4 g of propylene glycol monoethyl ether acetate (hereinafter, referred to as PGMEA), followed by stirring for two hours at room temperature, to obtain a dielectric material solution. The content of the above described polymer in the resulting solution was 2,000 parts by weight with respect to 100 parts by weight of Alumichelate D. The resulting dielectric solution was stored in the atmosphere at room temperature. As a result, the paste was stable and no precipitate was observed even after one month.

Example 1

Figure 19:
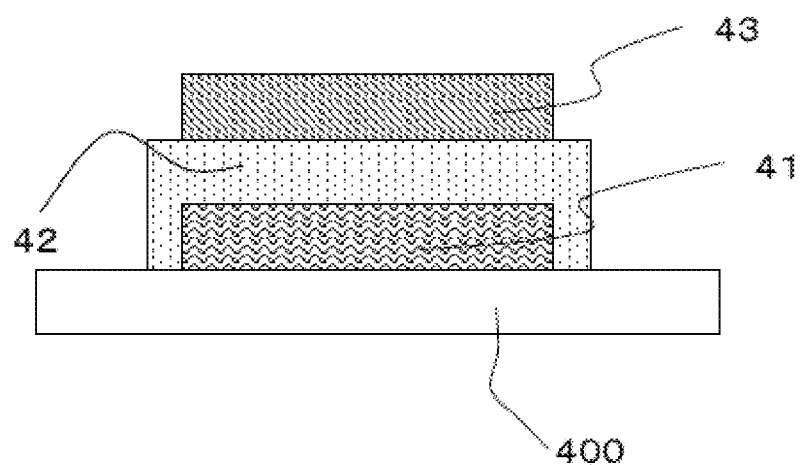
FIG. 19 is a schematic sectional view showing an example of an embodiment of the ferroelectric memory element according to the present invention.

A capacitor-type ferroelectric memory element as shown in FIG. 19 was prepared. On a PET film 400 having a film thickness of 50 μm, the conductive paste prepared in Preparation Example 26 was coated by spin coating, followed by prebaking in a drying oven at 100° C. for 10 minutes. Subsequently, the coated PET film was exposed using an exposure apparatus "PEM-8M" (trade name; manufactured by Union Optical Co., Ltd.), and then developed by immersion in a 0.5% KOH solution for 30 seconds. Thereafter, the developed film was rinsed with ultrapure water, followed by curing in a drying oven at 200° C. for 30 minutes, to form a conductive film 41 (lower electrode). The ferroelectric paste prepared in Preparation Example 1 was coated by spin coating on the PET film on which the conductive film 41 had been formed. The resultant was heat treated at 90° C. for 10 minutes, and then further heat treated in the atmosphere at 135° C. for 120 minutes, to form a ferroelectric layer 42 having a film thickness of 0.46 μm. Next, the conductive paste prepared in Preparation Example 26 was coated on the resultant by spin coating, followed by prebaking in a drying oven at 100° C. for 10 minutes. Subsequently, the coated PET film was exposed using the exposure apparatus "PEM-8M", and then developed by immersion in a 0.5% KOH solution for 30 seconds. Thereafter, the developed film was rinsed with ultrapure water, followed by curing in a drying oven at 200° C. for 30 minutes, to form a conductive film 43 (upper electrode). The thus obtained ferroelectric memory element was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (4), (6), (8), (9), (10), (11), and (12). The results are shown in Table 3.

Examples 2 to 10

Ferroelectric memory elements were prepared in the same manner as in Example 1, under the preparation conditions shown in Table 3. The thus obtained ferroelectric memory elements were each subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (4), (6), (8), (9), (10), (11), and (12). The results are shown in Table 3.

Example 11

On a PET film 400 having a film thickness of 50 μm, silver was vacuum vapor deposited through a mask to a thickness of 150 nm by a resistive heating method, to form a conductive film 41 (lower electrode). The ferroelectric paste prepared in Preparation Example 2 was coated by spin coating on the PET film on which the conductive film 41 had been formed. The resultant was heat treated at 90° C. for 10 minutes, and then further heat treated in the atmosphere at 135° C. for 120 minutes, to form a ferroelectric layer 42 having a film thickness of 0.5 Subsequently, silver was vacuum vapor deposited through a mask to a thickness of 150 nm by a resistive heating method, again, to form a conductive film 43 (upper electrode), thereby preparing a ferroelectric memory element. The thus obtained ferroelectric memory element was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the surface roughness of the conductive film; and the evaluation of ferroelectric properties before and after the bending test; in accordance with the methods described in the sections (1), (2), (4), (6), (8), (9), (11), and (12). The results are shown in Table 3.

Example 12

A ferroelectric memory element was prepared in the same manner as in Example 2, except that the conductive paste prepared in Preparation Example 30 was used for forming conductive films 41 and 43. The thus obtained ferroelectric memory element was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (4), (6), (8), (9), (10), (11), and (12). The results are shown in Table 3.

Example 13

A ferroelectric memory element was prepared in the same manner as in Example 2, except that the conductive paste prepared in Preparation Example 27 was used for forming conductive films 41 and 43. The thus obtained ferroelectric memory element was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (4), (6), (8), (9), (10), (11), and (12). The results are shown in Table 3.

Example 14

A ferroelectric memory element was prepared in the same manner as in Example 2, except that the conductive paste prepared in Preparation Example 28 was used for forming conductive films 41 and 43. The thus obtained ferroelectric memory element was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (4), (6), (8), (9), (10), (11), and (12). The results are shown in Table 3.

Example 15

A ferroelectric memory element was prepared in the same manner as in Example 2, except that the conductive paste prepared in Preparation Example 29 was used for forming conductive films 41 and 43. The thus obtained ferroelectric memory element was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (4), (6), (8), (9), (10), (11), and (12). The results are shown in Table 3.

Examples 16 to 22

Ferroelectric memory elements were prepared in the same manner as in Example 1, under the preparation conditions shown in Table 4. The thus obtained ferroelectric memory elements were each subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (4), (6), (8), (9), (10), (11), and (12). The results are shown in Table 3.

TABLE 3

| | Ferroelectric paste | Film thickness of ferroelectric layer [μm] | Lower electrode | Upper electrode | Average particle size of metal particles in Electrodes [μm] | | Surface roughness [nm] | Average particle size of ferroelectric particles in ferroelectric layer [nm] |
|---|---|---|---|---|---|---|---|---|
| | | | | | Lower electrode | Upper electrode | Upper electrode | |
| Example 1 | Preparation Example 1 | 0.46 | Ag + Organic component | Ag + Organic component | 0.08 | 0.06 | 9.6 | 53 |
| Example 2 | Preparation Example 2 | 0.48 | Ag + Organic component | Ag + Organic component | 0.07 | 0.08 | 10.2 | 114 |
| Example 3 | Preparation Example 3 | 0.48 | Ag + Organic component | Ag + Organic component | 0.07 | 0.06 | 9.9 | 164 |
| Example 4 | Preparation Example 4 | 0.49 | Ag + Organic component | Ag + Organic component | 0.08 | 0.07 | 9.8 | 208 |
| Example 5 | Preparation Example 5 | 0.44 | Ag + Organic component | Ag + Organic component | 0.08 | 0.08 | 9.8 | 325 |
| Example 6 | Preparation Example 6 | 0.48 | Ag + Organic component | Ag + Organic component | 0.07 | 0.08 | 9.1 | 413 |
| Example 7 | Preparation Example 7 | 0.46 | Ag + Organic component | Ag + Organic component | 0.08 | 0.08 | 9.6 | 123 |
| Example 8 | Preparation Example 2 | 0.28 | Ag + Organic component | Ag + Organic component | 0.05 | 0.06 | 9.5 | 113 |
| Example 9 | Preparation Example 2 | 0.76 | Ag + Organic component | Ag + Organic component | 0.09 | 0.06 | 9.8 | 110 |
| Example 10 | Preparation Example 8 | 0.48 | Ag + Organic component | Ag + Organic component | 0.08 | 0.07 | 9.5 | 118 |
| Example 11 | Preparation Example 2 | 0.46 | Ag | Ag | — | — | 4.1 | 115 |
| Example 12 | Preparation Example 2 | 0.45 | Ag + Organic component | Ag + Organic component | 0.08 | 0.06 | 9.6 | 116 |
| Example 13 | Preparation Example 2 | 0.48 | Ag + Organic component | Ag + Organic component | 0.28 | 0.27 | 24 | 114 |
| Example 14 | Preparation Example 2 | 0.95 | Ag + Organic component | Ag + Organic component | 1.87 | 1.89 | 180 | 112 |
| Example 15 | Preparation Example 2 | 0.98 | Ag + Organic component | Ag + Organic component | 3.54 | 3.41 | 354 | 114 |
| Example 16 | Preparation Example 10 | 0.47 | Ag + Organic component | Ag + Organic component | 0.08 | 0.08 | 9.8 | 115 |

TABLE 3-continued

| | | | | | | | | |
|---|---|---|---|---|---|---|---|---|
| Example 17 | Preparation Example 11 | 0.46 | Ag + Organic component | Ag + Organic component | 0.08 | 0.07 | 10.6 | 211 |
| Example 18 | Preparation Example 12 | 0.48 | Ag + Organic component | Ag + Organic component | 0.07 | 0.07 | 10.2 | 209 |
| Example 19 | Preparation Example 13 | 0 47 | Ag + Organic component | Ag + Organic component | 0.06 | 0.08 | 9.8 | 208 |
| Example 20 | Preparation Example 14 | 0.48 | Ag + Organic component | Ag + Organic component | 0.07 | 0.08 | 10 | 209 |
| Example 21 | Preparation Example 15 | 0.48 | Ag + Organic component | Ag + Organic component | 0.08 | 0.06 | 9.9 | 217 |
| Example 22 | Preparation Example 16 | 0.51 | Ag + Organic component | Ag + Organic component | 0.07 | 0.07 | 9.8 | 55 |

| | Weight fraction of ferroelectric particles in ferroelectric layer [wt %] | Insulating substrate | Yield evaluation | Vr [V] | Er [MV/m] | Changes in Er before and after repetitive voltage application test [%] | Changes in Er before and after bending test [%] |
|---|---|---|---|---|---|---|---|
| Example 1 | 79 | PET | A | 25 | 54 | 106 | 105 |
| Example 2 | 78 | PET | A | 20 | 42 | 104 | 108 |
| Example 3 | 79 | PET | A | 20 | 42 | 110 | 110 |
| Example 4 | 76 | PET | A | 20 | 41 | 109 | 116 |
| Example 5 | 76 | PET | B | 20 | 45 | 111 | 122 |
| Example 6 | 75 | PET | B | 20 | 42 | 115 | 128 |
| Example 7 | 92 | PET | A | 20 | 43 | 113 | 124 |
| Example 8 | 76 | PET | A | 15 | 54 | 110 | 108 |
| Example 9 | 79 | PET | A | 35 | 46 | 107 | 106 |
| Example 10 | 53 | PET | A | 50 | 104 | 108 | 108 |
| Example 11 | 79 | PET | A | 20 | 43 | 121 | 138 |
| Example 12 | 76 | PET | A | 20 | 44 | 113 | 114 |
| Example 13 | 79 | PET | B | 20 | 42 | 107 | 112 |
| Example 14 | 77 | PET | B | 40 | 42 | 114 | 119 |
| Example 15 | 79 | PET | C | 40 | 41 | 118 | 135 |
| Example 16 | 96 | PET | C | 20 | 43 | 114 | 134 |
| Example 17 | 91 | PET | C | 15 | 33 | 119 | 128 |
| Example 18 | 95 | PET | C | 15 | 31 | 127 | 140 |
| Example 19 | 92 | PET | B | 15 | 32 | 117 | 120 |
| Example 20 | 90 | PET | B | 15 | 31 | 118 | 122 |
| Example 21 | 93 | PET | B | 15 | 31 | 113 | 116 |
| Example 22 | 78 | PET | B | 20 | 39 | 106 | 110 |

Examples 23 to 27

Ferroelectric memory elements were prepared in the same manner as in Example 1, under the preparation conditions shown in Table 3. The thus obtained ferroelectric memory elements were each subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (4), (6), (8), (9), (10), (11), and (12). The results are shown in Table 4.

Example 28

On a PET film 400 having a film thickness of 50 μm, the conductive paste prepared in Preparation Example 26 was coated by spin coating, followed by prebaking in a drying oven at 100° C. for 10 minutes. Subsequently, the coated PET film was exposed using an exposure apparatus "PEM-8M" (trade name; manufactured by Union Optical Co., Ltd.), and then developed by immersion in a 0.5% KOH solution for 30 seconds. Thereafter, the developed film was rinsed with ultrapure water, followed by curing in a drying oven at 200° C. for 30 minutes, to form a conductive film 41 (lower electrode). The ferroelectric paste prepared in Preparation Example 22 was coated by spin coating on the PET film on which the conductive film 41 had been formed, followed by heat treatment in a drying oven at 90° C. for 10 minutes. Thereafter, the resulting film was exposed using the exposure apparatus "PEM-8M", and then developed by immersion in a 0.5% KOH solution for 15 seconds. The developed film was rinsed with ultrapure water, and then heat treated in the atmosphere at 135° C. for 120 minutes, to form a ferroelectric layer 42 having a film thickness of 0.49 μm. Next, the conductive paste prepared in Preparation Example 26 was coated on the resultant by spin coating, followed by prebaking in a drying oven at 100° C. for 10 minutes. Subsequently, the coated PET film was exposed using the exposure apparatus "PEM-8M", and then developed by immersion in a 0.5% KOH solution for 30 seconds. Thereafter, the developed film was rinsed with ultrapure water, followed by curing in a drying oven at 200° C. for 30 minutes, to form a conductive film 43 (upper electrode). The thus obtained ferroelectric memory element was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (4), (6), (8), (9), (10), (11), and (12). The results are shown in Table 4.

Comparative Example 1

A ferroelectric memory element was prepared in the same manner as in Example 1, under the preparation conditions shown in Table 4. The thus obtained ferroelectric memory element was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (4), (6), (8), (9), (10), (11), and (12). The results are shown in Table 4.

Comparative Example 2

A ferroelectric memory element was prepared in the same manner as in Example 11, under the preparation conditions shown in Table 4. The thus obtained ferroelectric memory element was subjected to: the measurement of the film thickness of the ferroelectric layer; the evaluation of ferroelectric properties; the evaluation of ferroelectric properties before and after the repetitive voltage application test; the yield evaluation; the measurement of the surface roughness of the conductive film; and the evaluation of ferroelectric properties before and after the bending test; in accordance with the methods described in the sections (2), (4), (6), (8), (9), (11), and (12). The results are shown in Table 4.

Comparative Example 3

A ferroelectric memory element was prepared in the same manner as in Example 1, under the preparation conditions shown in Table 4. The thus obtained ferroelectric memory element was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (4), (6), (8), (9), (10), (11), and (12). The results are shown in Table 4.

TABLE 4

| | Ferroelectric paste | Film thickness of ferroelectric layer [μm] | Lower electrode | Upper electrode | Average particle size of metal particles in Electrodes [μm] | | Surface roughness [nm] | Average particle size of ferroelectric particles in ferroelectric layer [nm] |
|---|---|---|---|---|---|---|---|---|
| | | | | | Lower electrode | Upper electrode | Upper electrode | |
| Example 23 | Preparation Example 17 | 0.47 | Ag + Organic component | Ag + Organic component | 0.08 | 0.08 | 9.8 | 207 |
| Example 24 | Preparation Example 18 | 0.48 | Ag + Organic component | Ag + Organic component | 0.09 | 0.06 | 10.1 | 211 |
| Example 25 | Preparation Example 19 | 0.47 | Ag + Organic component | Ag + Organic component | 0.06 | 0.08 | 10.2 | 213 |
| Example 26 | Preparation Example 20 | 0.52 | Ag + Organic component | Ag + Organic component | 0.07 | 0.08 | 9.9 | 206 |
| Example 27 | Preparation Example 21 | 0.51 | Ag + Organic component | Ag + Organic component | 0.07 | 0.09 | 9.9 | 216 |
| Example 28 | Preparation Example 22 | 0.49 | Ag + Organic component | Ag + Organic component | 0.06 | 0.07 | 9.8 | 209 |
| Comparative Example 1 | Preparation Example 9 | 0.45 | Ag + Organic component | Ag + Organic component | 0.07 | 0.08 | 105 | 18 |
| Comparative Example 2 | Preparation Example 23 | 0.43 | Ag | Ag | — | — | 4.3 | — |
| Comparative Example 3 | Preparation Example 24 | 0.47 | Ag + Organic component | Ag + Organic component | 0.08 | 0.08 | 9.6 | 105 |

TABLE 4-continued

| | Weight fraction of ferroelectric particles in ferroelectric layer [wt %] | Insulating substrate | Yield evaluation | Vr [V] | Er [MV/m] | Changes in Er before and after repetitive voltage application test [%] | Changes in Er before and after bending test [%] |
|---|---|---|---|---|---|---|---|
| Example 23 | 93 | PET | A | 15 | 32 | 109 | 122 |
| Example 24 | 92 | PET | B | 15 | 31 | 111 | 121 |
| Example 25 | 93 | PET | A | 15 | 32 | 110 | 115 |
| Example 26 | 93 | PET | A | 15 | 29 | 109 | 113 |
| Example 27 | 91 | PET | A | 15 | 29 | 110 | 114 |
| Example 28 | 94 | PET | A | 15 | 31 | 111 | 110 |
| Comparative Example 1 | 78 | PET | Unable to obtain ferroelectric properties | | | | |
| Comparative Example 2 | 0 | PET | B | 60 | 140 | 148 | Unable to measure |
| Comparative Example 3 | 100 | PET | D | Unable to measure | | | |

Example 29

Figure 20:
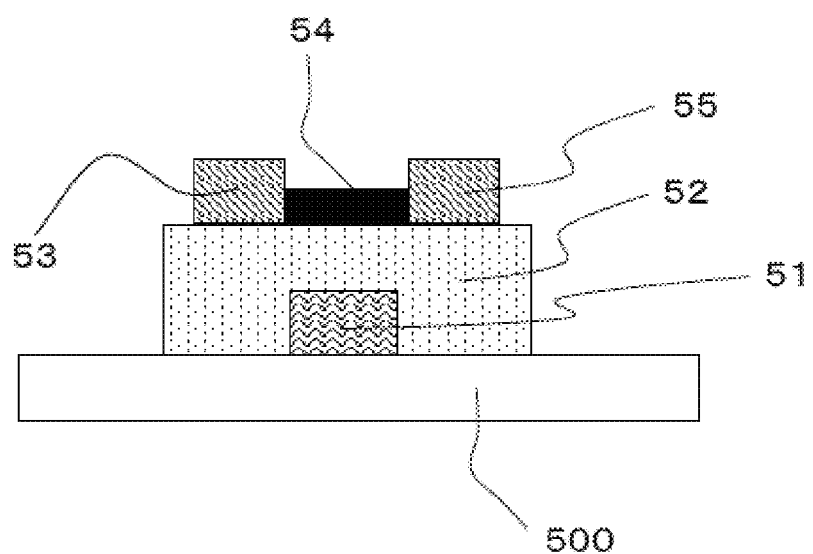
FIG. 20 is a schematic sectional view showing an example of an embodiment of the ferroelectric memory element according to the present invention.

A thin film transistor-type ferroelectric memory element as shown in FIG. 20 was prepared. On a PET film 500 having a film thickness of 50 μm, the conductive paste prepared in Preparation Example 26 was coated by spin coating, followed by prebaking in a drying oven at 100° C. for 10 minutes. Subsequently, the coated PET film was exposed using an exposure apparatus "PEM-8M" (trade name; manufactured by Union Optical Co., Ltd.), and then developed by immersion in a 0.5% KOH solution for 30 seconds. Thereafter, the developed film was rinsed with ultrapure water, followed by curing in a drying oven at 200° C. for 30 minutes, to form a gate electrode 51. The ferroelectric paste prepared in Preparation Example 2 was then coated by spin coating on the PET film on which the conductive film 51 had been formed. The resultant was heat treated at 90° C. for 10 minutes, and then further heat treated in the atmosphere at 135° C. for 120 minutes, to form a ferroelectric layer 52 having a film thickness of 0.48 μm. Subsequently, gold was vacuum vapor deposited through a mask by a resistive heating method, to form a source electrode 53 and a drain electrode 55. Finally, the semiconductor solution prepared in Preparation Example 31 was applied between the source electrode and the drain electrode by ink-jet coating, and the resultant was heat treated in the atmosphere at 150° C. for 30 minutes to form a semiconductor layer 54, thereby preparing the ferroelectric memory element. The thus obtained ferroelectric memory element was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (5), (7), (8), (9), (10), (11), and (13). The results are shown in Table 5.

Example 30

A ferroelectric memory element was prepared in the same manner as in Example 29, under the preparation conditions shown in Table 5. The thus obtained ferroelectric memory element was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (5), (7), (8), (9), (10), (11), and (13). The results are shown in Table 5.

Example 31

On a PET film 500 having a film thickness of 50 μm, the conductive paste prepared in Preparation Example 26 was coated by spin coating, followed by prebaking in a drying oven at 100° C. for 10 minutes. Subsequently, the coated PET film was exposed using an exposure apparatus "PEM-8M" (trade name; manufactured by Union Optical Co., Ltd.), and then developed by immersion in a 0.5% KOH solution for 30 seconds. Thereafter, the developed film was rinsed with ultrapure water, followed by curing in a drying oven at 200° C. for 30 minutes, to form a gate electrode 51. The ferroelectric paste prepared in Preparation Example 17 was then coated by spin coating on the PET film on which the conductive film 51 had been formed. The resultant was heat treated at 90° C. for 10 minutes, and then further heat treated in the atmosphere at 135° C. for 120 minutes, to form a ferroelectric layer 52 having a film thickness of 0.5 μm. Next, the conductive paste prepared in Preparation Example 26 was coated on the resultant by spin coating, followed by prebaking in a drying oven at 100° C. for 10 minutes. Subsequently, the coated film was exposed using the exposure apparatus "PEM-8M", and then developed by immersion in a 0.5% KOH solution for 30 seconds. Thereafter, the developed film was rinsed with ultrapure water, followed by curing in a drying oven at 200° C. for 30 minutes, to form a source electrode 53 and a drain electrode 55. Finally, the semiconductor solution prepared in Preparation Example 31 was applied between the source electrode and the drain electrode by ink-jet coating, and the resultant was heat treated in the atmosphere at 150° C. for 30 minutes to form a semiconductor layer 54, thereby preparing a ferroelectric memory element. The thus obtained ferroelectric memory element was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (1), (2), (5), (7), (8), (9), (10), (11), and (13). The results are shown in Table 5.

Comparative Example 4

On a PET film 500 having a film thickness of 50 μm, aluminum was vacuum vapor deposited through a mask to a thickness of 150 nm by a resistive heating method, to form a gate electrode 51. The ferroelectric paste prepared in Preparation Example 23 was then coated by spin coating on the PET film on which the conductive film 51 had been formed. The resultant was heat treated at 90° C. for 10 minutes, and then further heat treated in the atmosphere at 135° C. for 120 minutes, to form a ferroelectric layer 52 having a film thickness of 0.5 μm. Subsequently, gold was vacuum vapor deposited through a mask by a resistive heating method, to form a source electrode 53 and a drain electrode 55. Finally, the semiconductor solution prepared in Preparation Example 31 was applied between the source electrode and the drain electrode by ink-jet coating, and the resultant was heat treated in the atmosphere at 150° C. for 30 minutes to form a semiconductor layer 54, thereby preparing a ferroelectric memory element. The thus obtained ferroelectric memory element was subjected to: the measurement of the film thickness of the ferroelectric layer; the evaluation of ferroelectric properties; the evaluation of ferroelectric properties before and after the repetitive voltage application test; the yield evaluation; the weight fraction of the ferroelectric particles in the ferroelectric layer; the measurement of the average particle size of the metal particles in the conductive films; the measurement of the surface roughness of the conductive film; and the evaluation of ferroelectric properties before and after the bending test; in accordance with the methods described in the sections (2), (5), (7), (8), (9), (10), (11), and (13). The results are shown in Table 5.

TABLE 5

| | Ferroelectric paste | Film thickness of ferroelectric layer [μm] | Source electrode Gate electrode | Drain electrode | Average particle size of metal particles in Electrodes [μm] | | Surface roughness [nm] |
|---|---|---|---|---|---|---|---|
| | | | | | Gate electrode | Source electrode | Source electrode |
| Example 29 | Preparation Example 2 | 0.48 | Ag + Organic component | Au | 0.06 | — | 4.2 |
| Example 30 | Preparation Example 17 | 0.47 | Ag + Organic component | Au | 0.05 | — | 4.1 |
| Example 31 | Preparation Example 17 | 0.49 | Ag + Organic component | Ag + Organic component | 0.08 | 0.08 | 9.7 |
| Comparative Example 4 | Preparation Example 23 | 0.48 | Al | Au | 0.07 | — | 4.3 |

| | Average particle size of ferroelectric particles in ferroelectric layer [nm] | Weight fraction of ferroelectric particles in ferroelectric layer [wt %] | Yield evaluation | Vr [V] | Er [MV/m] | Changes in Er before and after repetitive voltage application test [%] | Changes in Er before and after bending test [%] |
|---|---|---|---|---|---|---|---|
| Example 29 | 114 | 78 | A | 15 | 31 | 105 | 124 |
| Example 30 | 209 | 93 | A | 10 | 21 | 116 | 129 |
| Example 31 | 210 | 93 | A | 10 | 20 | 108 | 119 |
| Comparative Example 4 | — | 0 | B | 55 | 115 | 143 | Unable to measure |

Example 32

Figure 21:
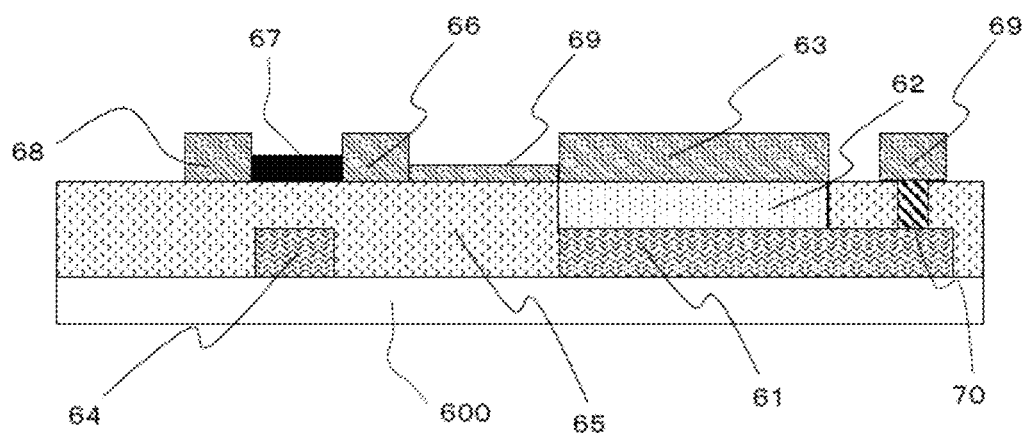
FIG. 21 is a schematic sectional view showing an example of an embodiment of the ferroelectric memory element according to the present invention.

A memory cell composed of a thin film transistor element and a capacitor-type ferroelectric memory element, as shown in FIG. 21, was prepared. On a PET film 600 having a film thickness of 50 μm, the conductive paste prepared in Preparation Example 26 was coated by spin coating, followed by prebaking in a drying oven at 100° C. for 10 minutes. Subsequently, the coated PET film was exposed using an exposure apparatus "PEM-8M" (trade name; manufactured by Union Optical Co., Ltd.), and then developed by immersion in a 0.5% KOH solution for 30 seconds. Thereafter, the developed film was rinsed with ultrapure water, followed by curing in a drying oven at 200° C. for 30 minutes, to form a lower electrode 61 (1 mm²) of the capacitor element and a gate electrode 64 of the thin film transistor element. Next, the dielectric solution prepared in Preparation Example 32 was coated by dispense coating on the PET film on which the lower electrode 61 and the gate electrode 64 had been formed. The resultant was heat treated in the atmosphere at 120° C. for 3 minutes, and then further heat treated under a nitrogen atmosphere at 150° C. for 120 minutes, to form a gate insulating layer 65 having a film thickness of 0.5 μm. Subsequently, the ferroelectric paste prepared in Preparation Example 2 was applied on the conductive film 61 by dispense coating. The resultant was heat treated at 90° C. for 10 minutes, and then further heat treated in the atmosphere at 135° C. for 120 minutes, to form a ferroelectric layer 62 having a film thickness of 0.49 μm. Thereafter, gold was vacuum vapor deposited through a mask by a resistive heating method to form a via 70, an upper electrode 63 (1 mm$^2$) of the capacitor element, a source electrode 66 and a drain electrode 68 of the thin film transistor element, and a wiring 69. Finally, the semiconductor solution prepared in Preparation Example 31 was applied between the source electrode and the drain electrode by ink-jet coating, and the resultant was heat treated in the atmosphere at 150° C. for 30 minutes to form a semiconductor layer 67, thereby preparing the memory cell. The thus obtained memory cell was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; the evaluation of ferroelectric properties before and after the bending test; and the measurement of the displacement current; in accordance with the methods described in the sections (1), (2), (4), (6), (8), (9), (10), (11), (12), and (14). The results are shown in Table 6. The resulting memory cell is capable of writing and reading operations as a memory cell, since a clear difference in the displacement current was observed between the elements into which "1" had been written and that into which "0" had been written.

Example 33

A memory cell was prepared in the same manner as in Example 32, under the preparation conditions shown in Table 6. The thus obtained memory cell was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; the evaluation of ferroelectric properties before and after the bending test; and the measurement of the displacement current; in accordance with the methods described in the sections (1), (2), (4), (6), (8), (9), (10), (11), (12), and (14). The results are shown in Table 6. The resulting memory cell is capable of writing and reading operations as a memory cell, since a clear difference in the displacement current was observed between the elements into which "1" had been written and that into which "0" had been written.

Example 34

On a PET film 600 having a film thickness of 50 μm, the conductive paste prepared in Preparation Example 26 was coated by spin coating, followed by prebaking in a drying oven at 100° C. for 10 minutes. Subsequently, the coated PET film was exposed using an exposure apparatus "PEM-8M" (trade name; manufactured by Union Optical Co., Ltd.), and then developed by immersion in a 0.5% KOH solution for 30 seconds. Thereafter, the developed film was rinsed with ultrapure water, followed by curing in a drying oven at 200° C. for 30 minutes, to form a lower electrode 61 (1 mm$^2$) of the capacitor element and a gate electrode 64 of the thin film transistor element. Next, the dielectric solution prepared in Preparation Example 31 was coated by dispense coating on the PET film on which the lower electrode 61 and the gate electrode 64 had been formed. The resultant was heat treated in the atmosphere at 120° C. for 3 minutes, and then further heat treated under a nitrogen atmosphere at 150° C. for 120 minutes, to form a gate insulating layer 65 having a film thickness of 0.5 μm. Subsequently, the ferroelectric paste prepared in Preparation Example 17 was applied on the conductive film 61 by dispense coating. The resultant was heat treated at 90° C. for 10 minutes, and then further heat treated in the atmosphere at 135° C. for 120 minutes, to form a ferroelectric layer 62 having a film thickness of 0.51 μm. Next, the conductive paste prepared in Preparation Example 26 was coated on the resultant by spin coating, followed by prebaking in a drying oven at 100° C. for 10 minutes. Thereafter, the resulting film was exposed using the exposure apparatus "PEM-8M", and then developed by immersion in a 0.5% KOH solution for 30 seconds. The developed film was then rinsed with ultrapure water, and cured in a drying oven at 200° C. for 30 minutes, to form a via 70, an upper electrode 63 (1 mm$^2$) of the capacitor element, a source electrode 66 and a drain electrode 68 of the thin film transistor element, and a wiring 69. Finally, the semiconductor solution prepared in Preparation Example 31 was applied between the source electrode and the drain electrode by ink-jet coating, and the resultant was heat treated in the atmosphere at 150° C. for 30 minutes to form a semiconductor layer 67, thereby preparing a memory cell. The thus obtained memory cell was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; the evaluation of ferroelectric properties before and after the bending test; and the measurement of the displacement current; in accordance with the methods described in the sections (1), (2), (4), (6), (8), (9), (10), (11), (12), and (14). The results are shown in Table 6. The resulting memory cell is capable of writing and reading operations as a memory cell, since a clear difference in the displacement current was observed between the elements into which "1" had been written and that into which "0" had been written.

Example 35

On a PET film 600 having a film thickness of 50 μm, the conductive paste prepared in Preparation Example 26 was coated by spin coating, followed by prebaking in a drying oven at 100° C. for 10 minutes. Subsequently, the coated PET film was exposed using an exposure apparatus "PEM-8M" (trade name; manufactured by Union Optical Co., Ltd.), and then developed by immersion in a 0.5% KOH solution for 30 seconds. Thereafter, the developed film was rinsed with ultrapure water, followed by curing in a drying oven at 200° C. for 30 minutes, to form a lower electrode 61 (1 mm²) of the capacitor element and a gate electrode 64 of the thin film transistor element. Next, the dielectric solution prepared in Preparation Example 31 was coated by dispense coating on the PET film on which the lower electrode 61 and the gate electrode 64 had been formed. The resultant was heat treated in the atmosphere at 120° C. for 3 minutes, and then further heat treated under a nitrogen atmosphere at 150° C. for 120 minutes, to form a gate insulating layer 65 having a film thickness of 0.5 μm. Subsequently, the ferroelectric paste prepared in Preparation Example 22 was coated on the resultant by spin coating, followed by heat treatment in a drying oven at 90° C. for 10 minutes. Thereafter, the resulting film was exposed using the exposure apparatus "PEM-8M", and then developed by immersion in a 0.5% KOH solution for 15 seconds. The developed film was then rinsed with ultrapure water, followed by heat treatment in the atmosphere at 135° C. for 120 minutes, to form a ferroelectric layer 62 having a film thickness of 0.46 μm. The conductive paste prepared in Preparation Example 26 was then coated on the resultant by spin coating, followed by prebaking in a drying oven at 100° C. for 10 minutes. Thereafter, the resulting film was exposed using the exposure apparatus "PEM-8M", and then developed by immersion in a 0.5% KOH solution for 30 seconds. The developed film was then rinsed with ultrapure water, and cured in a drying oven at 200° C. for 30 minutes, to form a via 70, an upper electrode 63 (1 mm²) of the capacitor element, a source electrode 66 and a drain electrode 68 of the thin film transistor element, and a wiring 69. Finally, the semiconductor solution prepared in Preparation Example 31 was applied between the source electrode and the drain electrode by ink-jet coating, and the resultant was heat treated in the atmosphere at 150° C. for 30 minutes to form a semiconductor layer 67, thereby preparing a memory cell. The thus obtained memory cell was subjected to: the measurement of the average particle size of the ferroelectric particles; the measurement of the film thickness of the ferroelectric layer; the evaluation of ferroelectric properties; the evaluation of ferroelectric properties before and after the repetitive voltage application test; the yield evaluation; the measurement of the weight fraction of the ferroelectric particles in the ferroelectric layer; the measurement of the average particle size of the metal particles in the conductive films; the measurement of the surface roughness of the conductive film; the evaluation of ferroelectric properties before and after the bending test; and the measurement of the displacement current; in accordance with the methods described in the sections (1), (2), (4), (6), (8), (9), (10), (11), (12), and (14). The results are shown in Table 6. The resulting memory cell is capable of writing and reading operations as a memory cell, since a clear difference in the displacement current was observed between the elements into which "1" had been written and that into which "0" had been written.

TABLE 6

| | Ferroelectric paste | Film thickness of ferroelectric layer [μm] | Lower electrode | Upper electrode | Average particle size of metal particles in Electrodes [μm] | | Surface roughness [nm] | Average particle size of ferroelectric particles in ferroelectric layer [nm] |
| --- | --- | --- | --- | --- | --- | --- | --- | --- |
| | | | | | Lower electrode | Upper electrode | Upper electrode | |
| Example 32 | Preparation Example 2 | 0.49 | Ag + Organic component | Au | 0.08 | — | 4.3 | 116 |
| Example 33 | Preparation Example 17 | 0.48 | Ag + Organic component | Au | 0.06 | — | 4.1 | 205 |
| Example 34 | Preparation Example 17 | 0.51 | Ag + Organic component | Ag + Organic component | 0.08 | 0.07 | 9.8 | 208 |
| Example 35 | Preparation Example 22 | 0.46 | Ag + Organic component | Ag + Organic component | 0.08 | 0.08 | 10.2 | 211 |

| | Weight fraction of ferroelectric particles in ferroelectric layer [wt %] | Yield evaluation | Vr [V] | Er [MV/m] | Changes in Er before and after repetitive voltage application test [%] | Changes in Er before and after bending test [%] | Displacement current [μA] | |
| --- | --- | --- | --- | --- | --- | --- | --- | --- |
| | | | | | | | A | B |
| Example 32 | 79 | A | 20 | 41 | 110 | 122 | 254 | 11 |
| Example 33 | 94 | A | 15 | 31 | 117 | 127 | 68 | 11 |
| Example 34 | 93 | A | 15 | 29 | 108 | 118 | 70 | 12 |
| Example 35 | 91 | A | 15 | 33 | 109 | 109 | 60 | 14 |

DESCRIPTION OF SYMBOLS 11 lower electrode
12 ferroelectric layer
13 upper electrode
100 insulating substrate
21 lower electrode
22 ferroelectric layer
23 upper electrode
24 gate electrode
25 gate insulating layer
26 source electrode
27 semiconductor layer
28 drain electrode
29 wiring
30 via
200 insulating substrate
201 capacitor-type ferroelectric element
202 thin film transistor
291 word line
292 bit line
293 plate line
31 gate electrode
32 ferroelectric layer
33 source electrode
34 semiconductor layer
35 drain electrode
300 insulating substrate
301 thin film transistor-type ferroelectric element
391 word line
392 bit line
393 plate line
41 lower electrode
42 ferroelectric layer
43 upper electrode
400 PET film
51 gate electrode
52 ferroelectric layer
53 source electrode
54 semiconductor layer
55 drain electrode
500 PET film
61 lower electrode
62 ferroelectric layer
63 upper electrode
64 gate electrode
65 gate insulating layer
66 source electrode
67 semiconductor layer
68 drain electrode
69 wiring
70 via
600 PET film
700 metal column
701 PET film provided with ferroelectric memory element
800 radio communication sensor device
801 arithmetic processing circuit
802 communication circuit
803 power supply circuit
804 memory circuit
805 sensor unit
806 antenna
807 sensor
808 sensor circuit
809 first memory circuit
810 second memory circuit
811 demodulation circuit
812 modulation circuit

The invention claimed is:

1. A ferroelectric memory element comprising at least:
a first conductive film;
a second conductive film; and
a ferroelectric layer provided between the first conductive film and the second conductive film;
wherein
the ferroelectric layer contains ferroelectric particles and an organic component,
the ferroelectric particles have an average particle size of from 30 to 500 nm, and
the organic component is a resin which contains at least one or more members selected from the group comprising carboxyl group, sulfo group, phosphate group, amide group, mercapto group, amino group and hydroxyl group.

2. The ferroelectric memory element according to claim 1, wherein the ferroelectric particles have an average particle size of from 100 to 300 nm.

3. The ferroelectric memory element according to claim 1, wherein the ferroelectric layer has a film thickness of from 0.2 to 2 μm.

4. The ferroelectric memory element according to claim 1, wherein the organic component is a resin which contains a carboxyl group and a hydroxyl group.

5. The ferroelectric memory element according to claim 1, wherein the organic component is a resin comprising at least: a unit structure represented by Formula (1); a unit structure represented by Formula (2); and a unit structure represented by Formula (3):

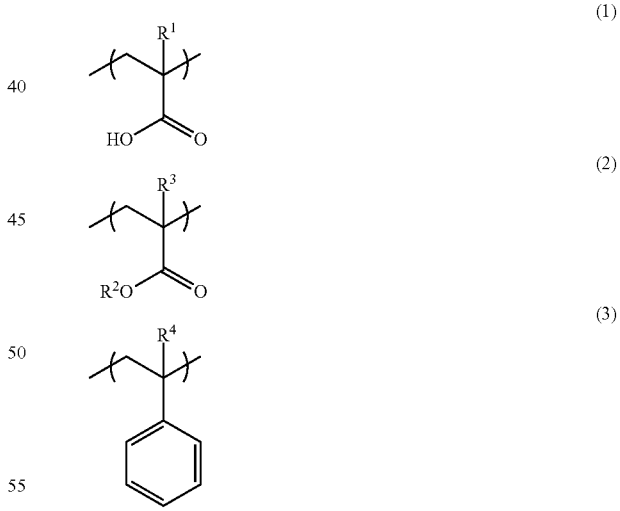

wherein
in Formulae (1), $R^1$ represents a hydrogen atom, or a monovalent organic group having from 1 to 20 carbon atoms;
in Formula (2), $R^2$ represents a monovalent organic group having from 1 to 20 carbon atoms and containing at least one hydroxyl group; and
in Formulae (2) and (3), $R^3$ and $R^4$ each represents a hydrogen atom, or a monovalent organic group having from 1 to 20 carbon atoms.

6. The ferroelectric memory element according to claim 1, wherein the organic component further comprises a compound having a 5-membered heterocyclic structure containing a carbon atom and a nitrogen atom.

7. The ferroelectric memory element according to claim 1, wherein at least one of the first conductive film and the second conductive film comprises metal particles.

8. The ferroelectric memory element according to claim 7, wherein the metal particles have an average particle size of from 0.01 μm to 5 μm.

9. The ferroelectric memory element according to claim 1, wherein at least one of the first conductive film and the second conductive film comprises an organic component.

10. The ferroelectric memory element according to claim 1, wherein the ferroelectric memory element is a capacitor-type memory element.

11. The ferroelectric memory element according to claim 1, further comprising:
   a third conductive film; and
   a semiconductor layer provided between the second conductive film and the third conductive film;
   wherein the ferroelectric layer insulates between the first conductive film and the other three components: the second conductive film, the third conductive film and the semiconductor layer; and
   wherein the ferroelectric memory element is a transistor-type memory element.

12. The ferroelectric memory element according to claim 11, wherein the semiconductor layer comprises a carbon nanotube.

13. A memory cell comprising:
   the ferroelectric memory element according to claim 10; and
   a thin film transistor controlling reading and writing of the ferroelectric memory element.

14. A radio communication apparatus comprising at least:
   the ferroelectric memory element according to claim 1; and
   an antenna.

15. A method of producing a ferroelectric memory element, the method comprising the following steps of:
   (1) forming a first conductive film of the ferroelectric memory element on an insulating substrate;
   (2) forming a ferroelectric layer by coating on the first conductive film a composition containing at least ferroelectric particles having an average particle size of from 30 to 500 nm, an organic component, and a solvent, followed by drying; and
   (3) forming a second conductive film of the ferroelectric memory element on the ferroelectric layer.

16. The method of producing a ferroelectric element according to claim 15, wherein the organic component comprises a photosensitive organic component, and wherein the step of forming a ferroelectric layer comprises the steps of:
   (i) forming a coating film by coating on the first conductive film the composition containing at least the ferroelectric particles, the photosensitive organic component, and the solvent, followed by drying;
   (ii) patterning the coating film by photolithography into a pattern corresponding to the ferroelectric layer of the ferroelectric memory element to form a patterned coating film; and
   (iii) curing the patterned coating film to form the ferroelectric layer of the ferroelectric memory element.

17. The method of producing a ferroelectric memory element according to claim 16, wherein the photosensitive organic component comprises a resin containing an ethylenically unsaturated group and a hydrophilic group.

18. The method of producing a ferroelectric memory element according to claim 17, wherein the resin containing an ethylenically unsaturated group and a hydrophilic group have an acid value of 30 mg KOH/g or more and 250 mg KOH/g or less.

19. A ferroelectric memory element comprising at least:
   a first conductive film;
   a second conductive film; and
   a ferroelectric layer provided between the first conductive film and the second conductive film;
   wherein the ferroelectric layer contains ferroelectric particles and an organic component,
   wherein the ferroelectric particles have an average particle size of from 30 to 500 nm, and wherein the organic component is a resin comprising a unit structure represented by Formula (4):

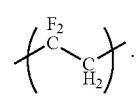

20. The ferroelectric memory element according to claim 19, wherein the ferroelectric particles have an average particle size of from 100 to 300 nm.

21. The ferroelectric memory element according to claim 19, wherein the ferroelectric layer has a film thickness of from 0.2 to 2 μm.

22. The ferroelectric memory element according to claim 19, wherein the organic component further comprises a compound having a 5-membered heterocyclic structure containing a carbon atom and a nitrogen atom.

23. The ferroelectric memory element according to claim 19, wherein at least one of the first conductive film and the second conductive film comprises metal particles.

24. The ferroelectric memory element according to claim 23, wherein the metal particles have an average particle size of from 0.01 μm to 5 μm.

25. The ferroelectric memory element according to claim 19, wherein at least one of the first conductive film and the second conductive film comprises an organic component.

26. The ferroelectric memory element according to claim 19, wherein the ferroelectric memory element is a capacitor-type memory element.

27. The ferroelectric memory element according to claim 19, further comprising:
   a third conductive film; and
   a semiconductor layer provided between the second conductive film and the third conductive film;
   wherein the ferroelectric layer insulates between the first conductive film and the other three components: the second conductive film, the third conductive film and the semiconductor layer; and
   wherein the ferroelectric memory element is a transistor-type memory element.

28. The ferroelectric memory element according to claim 27, wherein the semiconductor layer comprises a carbon nanotube.

29. A memory cell comprising:
   the ferroelectric memory element according to claim 26; and
   a thin film transistor controlling reading and writing of the ferroelectric memory element.

30. A radio communication apparatus comprising at least:
the ferroelectric memory element according to claim 19; and
an antenna.

* * * * *